United States Patent
Noguchi et al.

(10) Patent No.: US 8,653,861 B2
(45) Date of Patent: Feb. 18, 2014

(54) CONTROL VOLTAGE GENERATING CIRCUIT, CONSTANT CURRENT SOURCE CIRCUIT, AND DELAY CIRCUIT AND LOGIC CIRCUIT INCLUDING THE SAME

(75) Inventors: Koichiro Noguchi, Kanagawa (JP); Koichi Nose, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 115 days.

(21) Appl. No.: 13/137,744

(22) Filed: Sep. 9, 2011

(65) Prior Publication Data

US 2012/0062301 A1     Mar. 15, 2012

(30) Foreign Application Priority Data

Sep. 10, 2010    (JP) ................................ 2010-203562
Aug. 1, 2011     (JP) ................................ 2011-168254

(51) Int. Cl.
*H03B 1/00*         (2006.01)
*H03K 3/00*         (2006.01)

(52) U.S. Cl.
USPC ............ 327/108; 327/112; 327/285; 327/288

(58) Field of Classification Search
USPC .................................. 327/108, 112, 285, 288
See application file for complete search history.

(56) References Cited

U.S. PATENT DOCUMENTS

| | | | |
|---|---|---|---|
| 2003/0001632 A1* | 1/2003 | Anderson et al. ............. | 327/112 |
| 2005/0077943 A1 | 4/2005 | Kakuda et al. | |
| 2007/0040595 A1 | 2/2007 | Kakuda et al. | |
| 2007/0057703 A1* | 3/2007 | Kumar et al. ................. | 327/112 |
| 2009/0058488 A1* | 3/2009 | Jarupoonphol et al. ...... | 327/285 |

FOREIGN PATENT DOCUMENTS

| | | |
|---|---|---|
| JP | 5-268009 A | 10/1993 |
| JP | 9-270692 A | 10/1997 |
| JP | 11-168362 A | 6/1999 |
| JP | 2000-59184 A | 2/2000 |
| JP | 2001-285036 A | 10/2001 |
| JP | 2005-117442 A | 4/2005 |

\* cited by examiner

*Primary Examiner* — John Poos
(74) *Attorney, Agent, or Firm* — McGinn IP Law Group, PLLC

(57) ABSTRACT

A control voltage generating circuit according to an aspect of the present invention includes: a reference voltage unit that includes a plurality of first transistors of the same conductivity type connected in series between a first power supply and a second power supply, and generates a drain voltage of one of the plurality of first transistor as a reference voltage; and a voltage conversion unit that includes a plurality of second transistors connected in series between the first power supply and the second power supply and having the same conductivity type as that of the reference voltage, supplies the reference voltage to a gate of one of the plurality of second transistors, and outputs a drain voltage of one of the plurality of second transistors as a control voltage.

19 Claims, 42 Drawing Sheets

CONTROL VOLTAGE GENERATING CIRCUIT, CONSTANT CURRENT SOURCE CIRCUIT, AND DELAY CIRCUIT AND LOGIC CIRCUIT INCLUDING THE SAME

CROSS-REFERENCE TO RELATED APPLICATIONS

This application is based upon and claims the benefit of priority from Japanese patent application No. 2010-203562, filed on Sep. 10, 2010, and Japanese patent application No. 2011-168254, filed on Aug. 1, 2011, the disclosures of which are incorporated herein in its entirety by reference.

BACKGROUND

The present invention relates to a control voltage generating circuit, a constant current source circuit, and a delay circuit and a logic circuit including the same.

Along with an increase in delay variation due to a low voltage design and difficulty in timing design of clock signals in a large-scale design, an increasing number of LSIs (Large Scale Integrations) are requiring compensation for a hold time by adding a large amount of delay to each logic cell. In order to compensate for the hold time by adding a large amount of delay, it is necessary to use a delay circuit for adding a delay to a signal, the hold time of which is to be compensated for. There have been known the following two methods using such a delay circuit. One is (1) a method of providing a number of delay circuits corresponding to the amount of required delay, and the other is (2) a method using a delay circuit, a drive current for which is controlled by a constant current source.

Techniques using a delay circuit, a drive current for which is controlled by a constant current source, are disclosed as described below.

Japanese Unexamined Patent Application Publication No. 05-268009 discloses a delay circuit including a plurality of COMS inverters including a current control type CMOS inverter; and a current mirror circuit for supplying a constant current to the current control type CMOS inverter.

Japanese Unexamined Patent Application Publication No. 2005-117442 discloses a delay circuit including a constant current source, a delay stage, and a compensation circuit. The delay stage determines an operating delay time of an output with respect to an input, depending on a constant current from the constant current source. The compensation circuit reversely compensates for a fluctuation of delay characteristics due to process variations of the delay stage, for example.

Japanese Unexamined Patent Application Publication No. 11-168362 discloses a delay circuit including constant voltage generating means and delay means. The constant voltage generating means absorbs a fluctuation of power supply voltage and generates a constant internal power supply voltage lower than the power supply voltage. The delay means includes a plurality of inverters which are driven by the internal power supply voltage and connected in cascade. The constant voltage generating means includes P-channel MOS transistors and N-channel MOS transistors mixed therein. Japanese Unexamined Patent Application Publication No. 2000-59184 also discloses a delay circuit including a voltage generating unit for supplying a constant voltage to a plurality of inverters connected in cascade.

Japanese Unexamined Patent Application Publication No. 09-270692 discloses a temperature compensation circuit including a temperature detection circuit and an inverter. The temperature detection circuit includes an active element (a MOS transistor) having a temperature dependence and a passive element (a resistor) having no temperature dependence. A drive current for the inverter is controlled based on detection results of the temperature detection circuit. Japanese Unexamined Patent Application Publication No. 2001-285036 also discloses a delay circuit including a control voltage generating unit including a MOS transistor and a resistor, and an inverter, a drive current for which is controlled based on output results of the control voltage generating unit.

SUMMARY

The present inventors have found a problem that in the method (1), the number of delay circuits increases with an increase in hold compensation value, which results in an increase in circuit size and power consumption. Furthermore, the use of the delay circuits disclosed in the related arts increases a delay variation due to process variations or the like in proportion to the amount of required delay.

On the other hand, in the method (2), the delay amount of the delay circuit can be easily controlled by adjusting the current value of the constant current source. However, the constant current source is susceptible to the effect of process variations, which leads to an increase in delay variations. Further, provision of a correction circuit for suppressing the effect of delay variations increases the circuit size.

Specifically, the circuits disclosed in Japanese Unexamined Patent Application Publication Nos. 05-268009 and 2005-117442 include a constant current source. However, the constant current source typically includes a diode or the like, which causes an increase in the circuit size. The circuit configuration disclosed in Japanese Unexamined Patent Application Publication No. 05-268009 in which a bias signal is externally supplied requires a large wiring resource to supply the bias signal to all delay circuits arranged randomly.

The circuits disclosed in Japanese Unexamined Patent Application Publication Nos. 11-168362 and 2000-59184 include the constant voltage generating means in which P-channel MOS transistors and N-channel MOS transistors are mixed. However, the P-channel MOS transistors and the N-channel MOS transistors may have different process variations. This may lead to an increase in delay variations.

The circuits disclosed in Japanese Unexamined Patent Application Publication Nos. 09-270692 and 2001-285036 include a voltage generating unit (a temperature sensor, a control voltage generating unit) including a MOS transistor and a resistor. However, the resistor has a large area, resulting in an increase in the circuit size.

As described above, the delay circuits (semiconductor integrated circuits) disclosed in the related arts have difficulty in adding a delay with high accuracy to an external input signal while suppressing an increase in the circuit size.

An exemplary aspect of the present invention is a control voltage generating circuit including: a reference voltage generating unit that includes a plurality of first transistors of the same conductivity type connected in series between a first power supply and a second power supply, and generates a drain voltage of one of the plurality of first transistors as a reference voltage; and a voltage conversion unit that includes a plurality of second transistors connected in series between the first power supply and the second power supply and having the same conductivity type as that of the reference voltage generating unit, supplies the reference voltage to a gate of one of the plurality of second transistors, and outputs a drain voltage of one of the plurality of second transistors as a control voltage.

The circuit configuration described above enables generation of the control voltage with high accuracy based on a threshold voltage of each transistor without increasing the circuit size. For example, the supply of the control voltage to the delay circuit allows the delay circuit to add a delay with high accuracy to an external input signal.

According to an aspect of the present invention, it is possible to provide a control voltage generating circuit capable of generating a control voltage with high accuracy based on a threshold voltage of each transistor without increasing the circuit size, and a constant current source circuit capable of generating a more stable constant current by providing the control voltage generating circuit. Furthermore, it is possible to provide a logic circuit such as a delay circuit capable of adding a delay with high accuracy to an external input signal by providing the control voltage generating circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
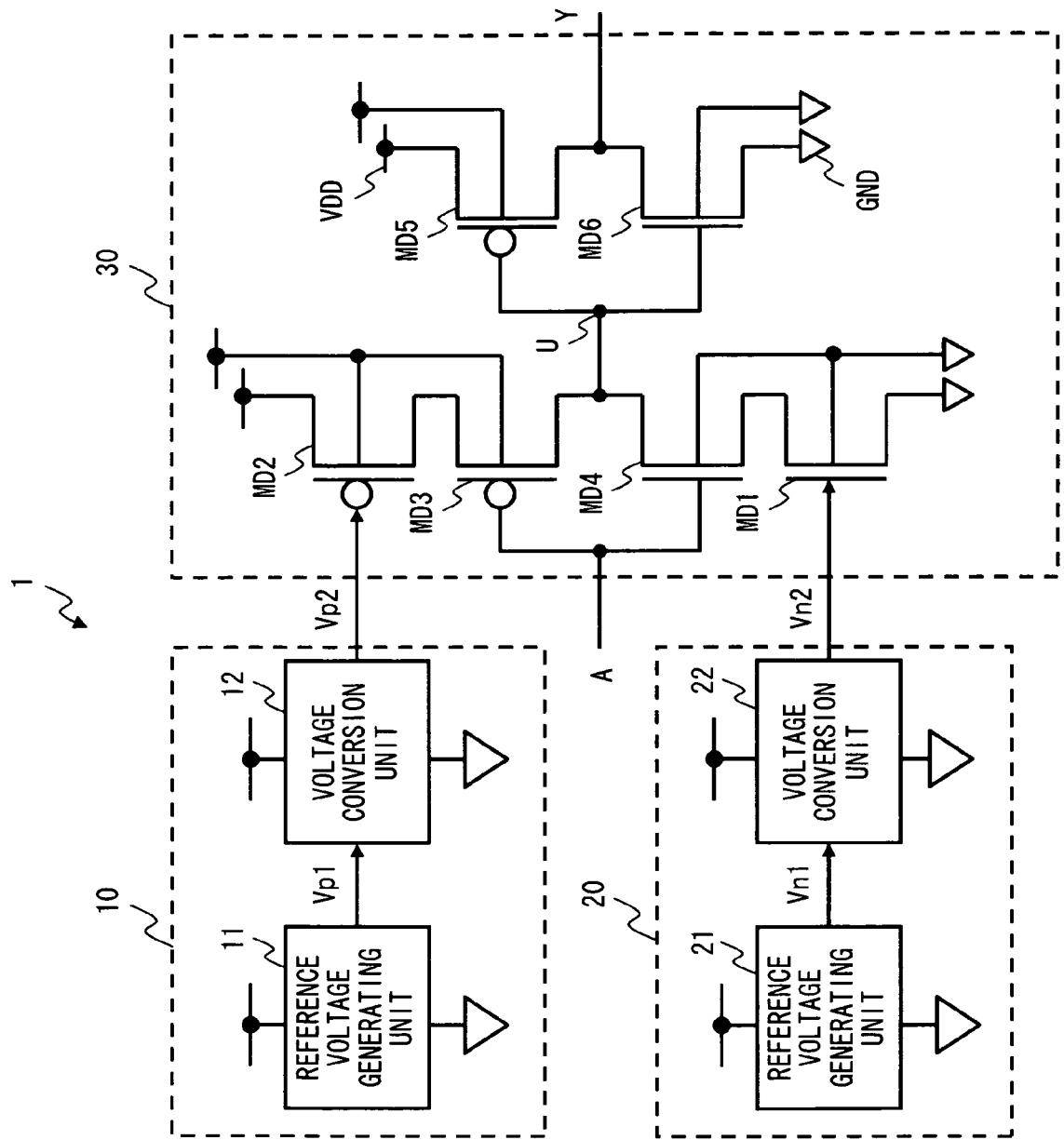
FIG. 1 is a block diagram showing a delay circuit according to a first embodiment of the present invention.

Hereinafter, embodiments of the present invention will be described with reference to the accompanying drawings. The drawings are simplified, so the technical scope of the present invention should not be construed narrowly based on description of the drawings. The same elements are denoted by the same reference numerals, and a duplicate description thereof is omitted.

First Embodiment

FIG. 1 shows a delay circuit (semiconductor integrated circuit) 1 according to a first embodiment of the present invention. The delay circuit 1 shown in FIG. 1 includes a bias generating unit 10, a bias generating unit 20, and a delay generating unit 30. In the delay circuit 1 shown in FIG. 1, the bias generating units 10 and 20 include a plurality of MOS transistors of the same conductivity type, and add a delay with high accuracy to an external input signal. The circuit configuration will be described in more detail below.

(Delay Generating Unit 30)

The delay generating unit 30 adds a delay to an input signal A and outputs the resultant as an output signal Y. The delay generating unit 30 includes transistors MD1 to MD6. The first embodiment exemplifies a configuration in which the transistors MD1, MD4, and MD6 are N-channel MOS transistors and the transistors MD2, MD3, and MD5 are P-channel MOS transistors. Further, the first embodiment exemplifies a configuration in which the back gates of the P-channel MOS transistors are each connected to a high potential side power supply terminal (first power supply terminal) and the back gates of the N-channel MOS transistors are each connected to a low potential side power supply terminal (second power supply terminal).

The transistors MD1 and MD4 are connected in series between the high potential side power supply terminal supplied with a power supply voltage VDD and the low potential side power supply terminal supplied with a ground voltage GND. More specifically, the transistor MD1 has a gate supplied with a bias voltage Vn2 from the bias generating unit 20, a source connected to the low potential side power supply terminal, and a drain connected to the source of the transistor MD4. The transistor MD4 has a gate supplied with the input signal A (voltage at a node "A"), and a drain connected to a node U. The transistor MD2 has a gate supplied with a bias voltage Vp2 from the bias generating unit 10, a source connected to the high potential side power supply terminal, and a drain connected to the source of the transistor MD3. The transistor MD3 has a gate supplied with the input signal A, and a drain connected to the node U.

That is, in the transistors MD1 to MD4, the transistors MD3 and MD4 constitute an inverter. Further, the transistor MD2 serving as a constant current transistor controls a current supplied from the high potential side power supply terminal to the transistor MD3, and the transistor MD1 serving as a constant current transistor controls a current flowing from the transistor MD4 to the low potential side power supply terminal.

The transistor MD5 has a source connected to the high potential side power supply terminal, a gate connected to the node U, and a drain connected to a node Y. The transistor MD6 has a source connected to the low potential side power supply terminal, a gate connected to the node U, and a drain connected to the node Y. That is, the transistors MD5 and MD6 constitute an inverter. In other words, in the delay generating unit 30, an inverter whose current supply is controlled and a typical inverter are connected in series. Additionally, in the first embodiment, the back gates of the P-channel MOS transistors MD2, MD3, and MD5 are each connected to the high potential side power supply terminal, and the back gates of the N-channel MOS transistors MD1, MD4, and MD6 are each connected to the low potential side power supply terminal.

(Bias Generating Unit 10)

The bias generating unit 10 generates the bias voltage Vp2 and outputs the bias voltage Vp2 to the delay generating unit 30. Specifically, the bias generating unit 10 generates the bias voltage Vp2, and outputs the bias voltage Vp2 to the gate of the transistor MD2 which is provided in the delay generating unit 30. As a result, a current flowing between the source and the drain of the transistor MD2 is controlled.

Figure 2A:
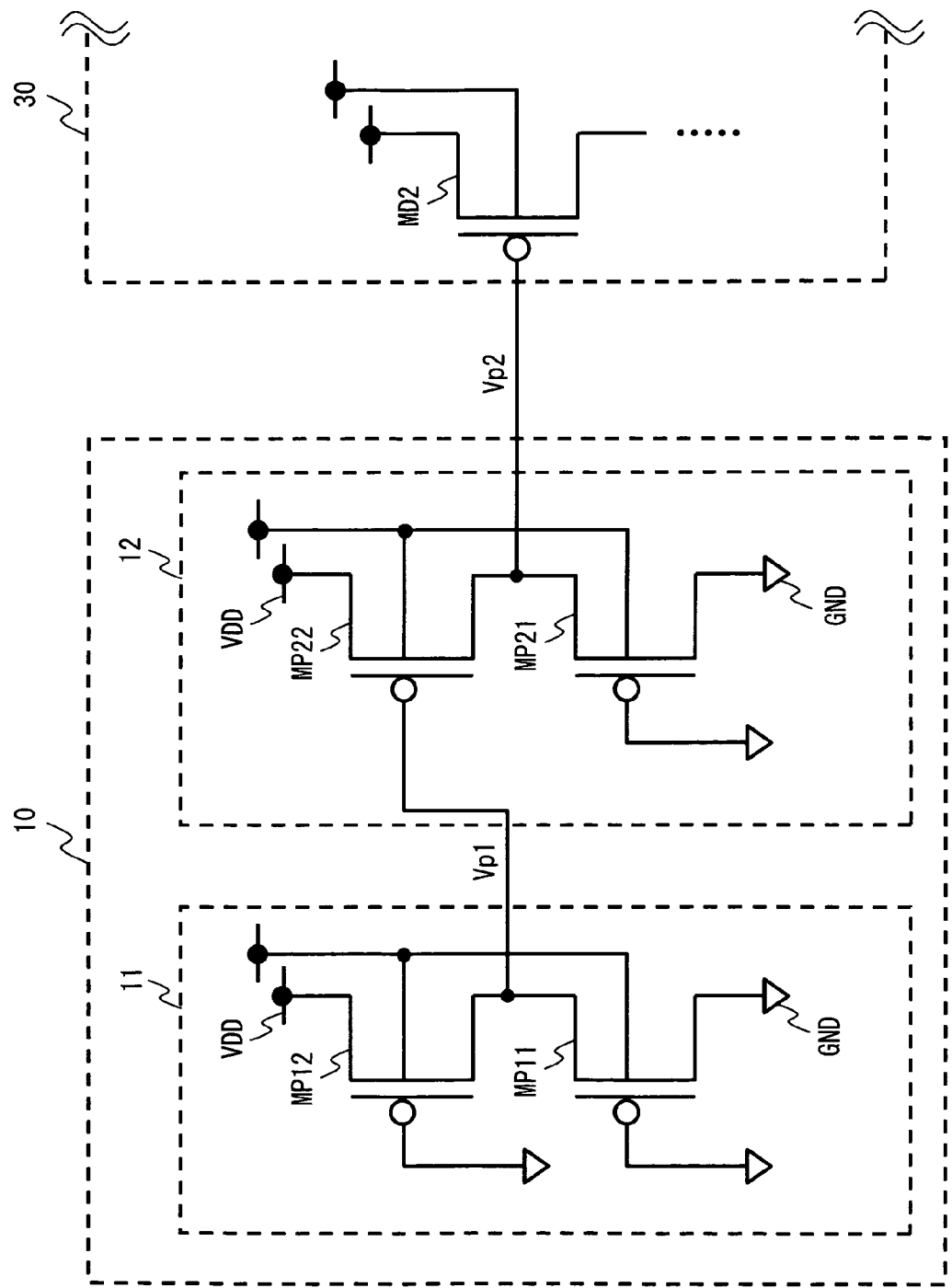
FIG. 2A is a circuit diagram showing a bias generating unit according to the first embodiment of the present invention.

FIG. 2A is a circuit diagram showing the bias generating unit 10. The bias generating unit 10 includes a reference voltage generating unit (first reference voltage unit) 11 and a voltage conversion unit (first voltage conversion unit) 12. The reference voltage generating unit 11 includes transistors (first reference transistors) MP11 and MP12. The voltage conversion unit 12 includes transistors (first conversion transistors) MP21 and MP22. This embodiment exemplifies a configuration in which the transistors MP11, MP12, MP21, and MP22 are P-channel MOS transistors. That is, the transistors MP11, MP12, MP21, and MP22 are MOS transistors of the same conductivity type.

In the reference voltage generating unit 11, the transistors MP11 and MP12 are connected in series between the high potential side power supply terminal and the low potential side power supply terminal. Specifically, the transistor MP11 has a gate supplied with the ground voltage GND, a drain connected to the low potential side power supply terminal, and a source connected to the drain of the transistor MP12. The transistor MP12 has a gate supplied with the ground voltage GND, and a source connected to the high potential side power supply terminal. The reference voltage generating unit 11 outputs a potential of a node on a signal line connecting the source of the transistor MP11 and the drain of the transistor MP12, as a reference voltage Vp1. Although the first embodiment exemplifies a configuration in which the gates of the transistors MP11 and MP12, which constitute the reference voltage generating unit 11, are each supplied with the ground voltage GND, the gates of the transistors MP11 and MP12 may be supplied with a constant voltage. The circuit configuration can be arbitrarily changed as long as the reference voltage generating unit 11 generates the reference voltage Vp1 having a reverse characteristic (described later) to a threshold variation of the device. If this condition is satisfied, a circuit configuration in which the transistors MP11 and MP12 are diode-connected may also be employed. Thus, the gates of the transistors MP11 and MP12 are supplied with one of the ground voltage GND and the potential of the internal node, and preferably, the gates of the transistors MP11 and MP12 are not supplied with an external signal.

In the voltage conversion unit 12, the transistors MP21 and MP22 are connected in series between the high potential side power supply terminal and the low potential side power supply terminal. Specifically, the transistor MP21 has a gate supplied with the ground voltage GND, a drain connected to the low potential side power supply terminal, and a source connected to the drain of the transistor MP22. The transistor MP22 has a gate supplied with the reference voltage Vp1 from the reference voltage generating unit 11, and a source connected to the high potential side power supply terminal. The voltage conversion unit 12 outputs a potential of a node on a signal line connecting the source of the transistor MP21 and the drain of the transistor MP22, as the bias voltage Vp2. Although the first embodiment exemplifies a configuration in which the gates of the transistors MP21 and MP22, which constitute the voltage conversion unit 12, are each supplied with the ground voltage GND or the reference voltage Vp1, but the gates of the transistors MP21 and MP22 may be supplied with a constant voltage. The circuit configuration can be arbitrarily change as long as the voltage conversion unit 12 generates the bias voltage Vp2 having a forward characteristic (described later) with respect to a threshold variation of the device. If this condition is satisfied, a circuit configuration in which the transistors MP21 and MP22 are diode-connected, for example, may also be employed. Thus, the gates of the transistors MP21 and MP22 are supplied with any one of the ground voltage GND, the reference voltage Vp1, and the potential of the internal node, and preferably, the gates of the transistors MP21 and MP22 are not supplied with an external signal.

(Bias Generating Unit 20)

The bias generating unit 20 generates the bias voltage Vn2 and outputs the bias voltage Vn2 to the delay generating unit 30. Specifically, the bias generating unit 20 generates the bias voltage Vn2 and outputs the bias voltage Vn2 to the gate of the transistor MD1 which is provided in the delay generating unit 30. This configuration allows a current flowing between the source and the drain of the transistor MD1 to be controlled.

Figure 2B:
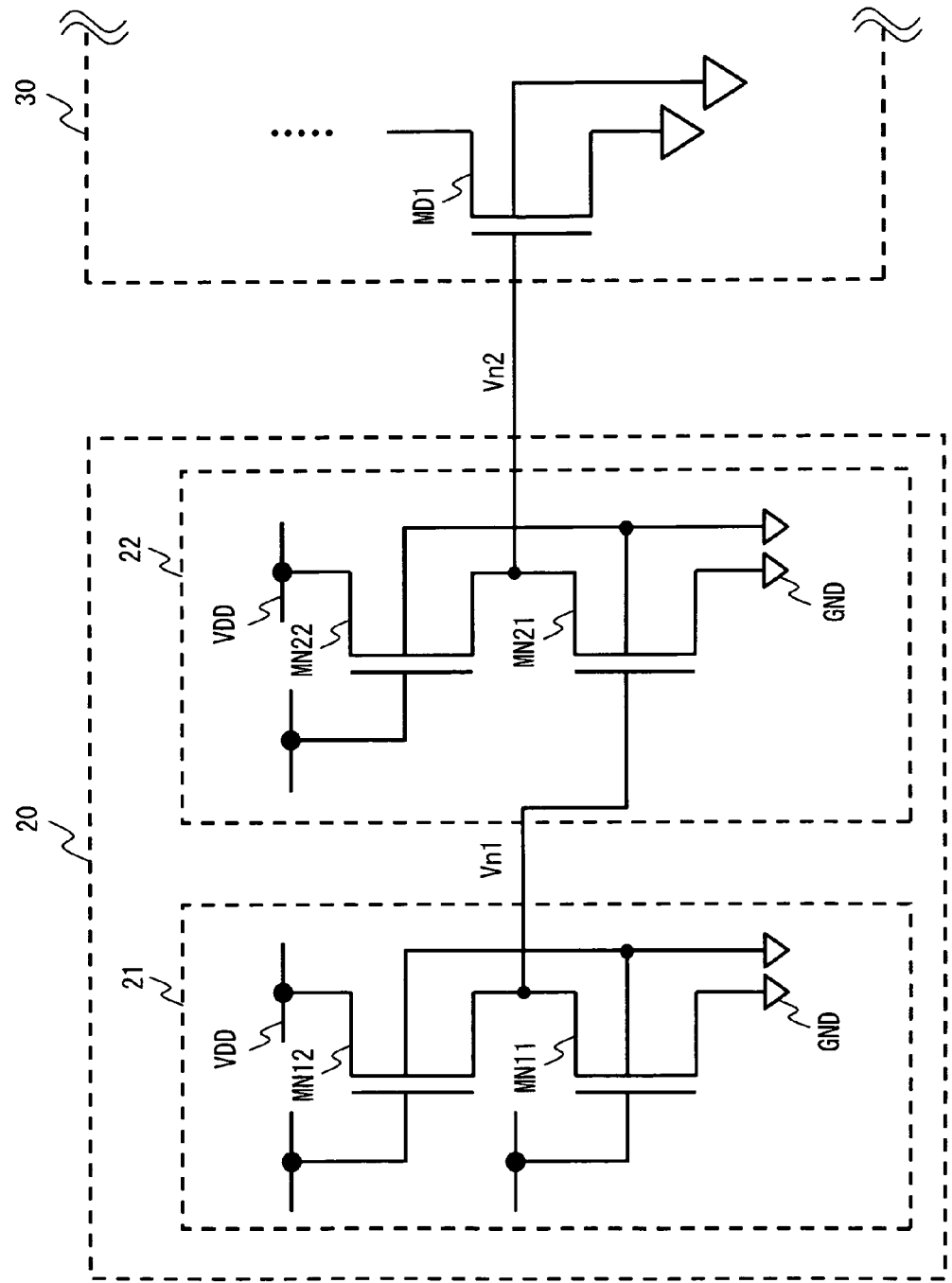
FIG. 2B is a circuit diagram showing the bias generating unit according to the first embodiment of the present invention.

FIG. 2B is a circuit diagram showing the bias generating unit 20. The bias generating unit 20 includes a reference voltage generating unit (second reference voltage generating unit) 21 and a voltage conversion unit (second voltage conversion unit) 22. The reference voltage generating unit 21 includes transistors (second reference transistors) MN11 and MN12. The voltage conversion unit 22 includes transistors (second conversion transistors) MN21 and MN22. The first embodiment exemplifies a configuration in which the transistors MN11, MN12, MN21, and MN22 area N-channel MOS transistors. That is, the transistors MN11, MN12, MN21, and MN22 are MOS transistors of the same conductivity type.

In the reference voltage generating unit 21, the transistors MN11 and MN12 are connected in series between the high potential side power supply terminal and the low potential side power supply terminal. Specifically, the transistor MN11 has a gate supplied with the power supply voltage VDD, a source connected to the low potential side power supply terminal, and a drain connected to the source of the transistor MN12. The transistor MN12 has a gate supplied with the power supply voltage VDD, and a drain connected to the high potential side power supply terminal. The reference voltage generating unit 21 outputs a potential of a node on a signal line connecting the drain of the transistor MN11 and the source of the transistor MN12, as a reference voltage Vn1. Although the first embodiment exemplifies a configuration in which the gates of the transistors MN11 and MN12, which constitute the reference voltage generating unit 21, are each supplied with the power supply voltage VDD, the gates of the transistors MN11 and MN12 may be supplied with a constant voltage. The circuit configuration can be arbitrarily changed as long as the reference voltage generating unit 21 generates the reference voltage Vn1 having a reverse characteristic (described later) to a threshold variation of the device. If this condition is satisfied, a circuit configuration in which the transistors MN11 and MN12 are diode-connected, for example, may also be employed. Thus, the gates of the transistors MN11 and MN12 are connected to any one of the power supply voltage VDD and the internal node, and preferably, the gates of the transistors MN11 and MN12 are not supplied with an external signal.

In the voltage conversion unit 22, the transistors MN21 and MN22 are connected in series between the high potential side power supply terminal and the low potential side power supply terminal. Specifically, the transistor MN21 has a gate supplied with the reference voltage Vn1 from the reference voltage generating unit 21, a source connected to the low potential side power supply terminal, and a drain connected to the source of the transistor MN22. The transistor MN22 has a gate supplied with the power supply voltage VDD, and a drain connected to the high potential side power supply terminal. The voltage conversion unit 22 outputs a potential of a node on a signal line connecting the drain of the transistor MN21 and the source of the transistor MN22, as the bias voltage Vn2. Although this embodiment exemplifies a configuration in which the gates of the transistors MN21 and MN22, which constitute the voltage conversion unit 22, are each supplied with the power supply voltage VDD or the reference voltage Vn1, the gates of the transistors MN21 and MN22 may be supplied with a constant voltage. The circuit configuration can be arbitrarily changed as long as the voltage conversion unit 22 generates the bias voltage Vn2 having a forward characteristic (described later) with respect to a threshold variation of the device. If this condition is satisfied, a circuit configuration in which the transistors MN21 and MN22 are diode-connected, for example, may also be employed. Thus, the gates of the transistors MN21 and MN22 are each supplied with any one of the power supply voltage VDD, the reference voltage Vn1, and the potential of the internal node, and preferably, the gates of the transistors MN21 and MN22 are not supplied with an external signal.

Figure 3:
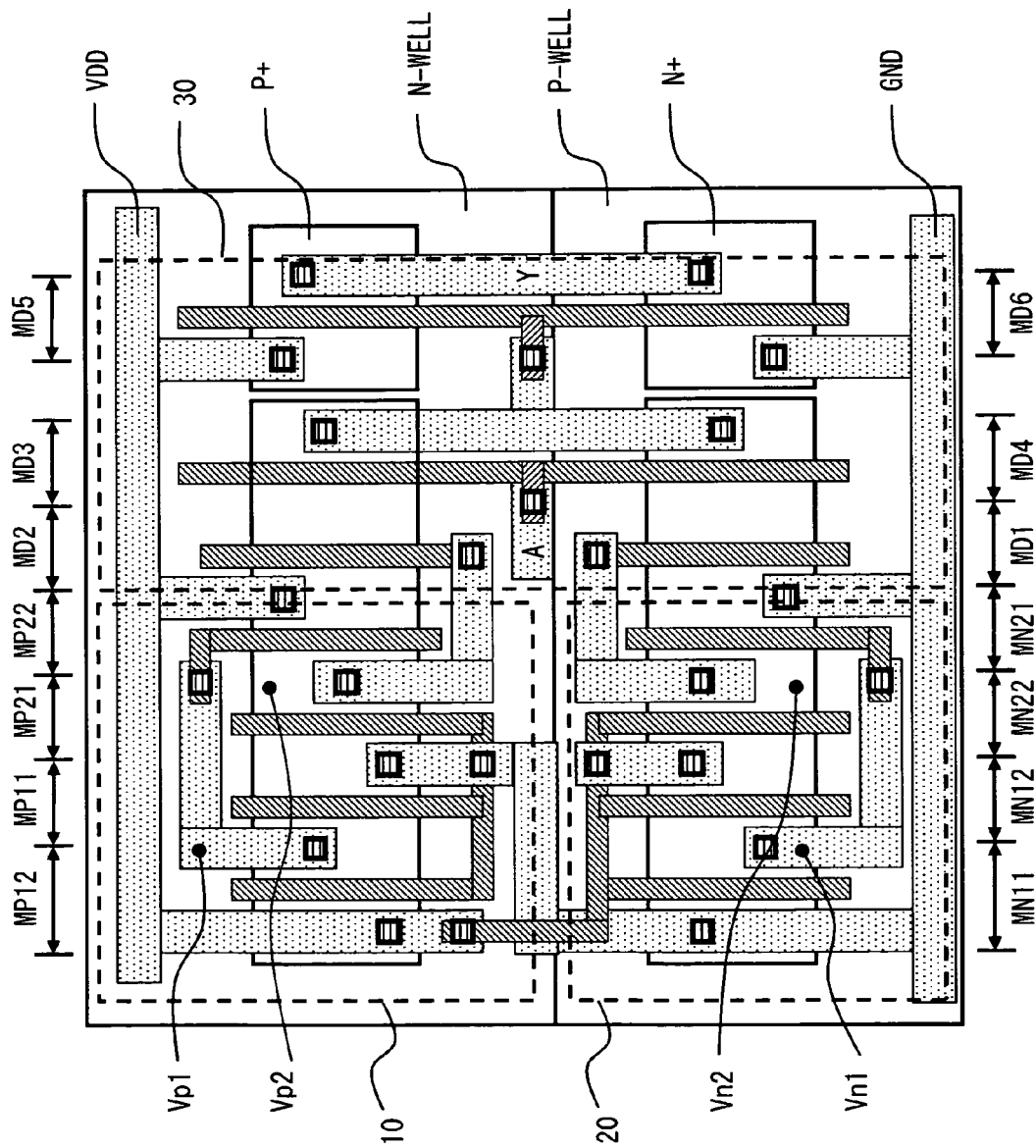
FIG. 3 shows a layout pattern of a delay circuit according to the first embodiment of the present invention.

FIG. 3 shows an exemplary layout pattern of the delay circuit 1. The bias generating unit 10 is formed above an N-well including a P$^+$ region in an upper left portion of FIG. 3. The bias generating unit 20 is formed on a P-well including an N$^+$ region in a lower left portion of FIG. 3. The delay generating unit 30 is formed on the N-well including the P$^+$ region and on the P-well including the N$^+$ region at the right side of FIG. 3.

In the bias generating unit 10, the transistors MP12, MP11, MP21, and MP22, which are P-channel MOS transistors, are formed in this order from left to right in the upper left portion of FIG. 3. In the bias generating unit 20, the transistors MN11, MN12, MN22, and MN21, which are N-channel MOS transistors, are formed in this order from left to right in the lower left portion of FIG. 3. In the delay generating unit 30, the transistors MD2, MD3, and MD5, which are P-channel MOS transistors, are formed in this order from left to right in the upper right portion of FIG. 3, and the transistors MD1, MD4, and MD6, which are N-channel MOS transistors, are formed in this order from left to right in the lower right portion of FIG. 3. Thus, in the delay circuit 1, the bias generating unit 10 includes a plurality of MOS transistors of the same conductivity type (P-channel type), and the bias generating unit 20 includes a plurality of MOS transistors of the same conductivity type (N-channel type). Note that an externally connected signal line other than the power supply lines is not provided between the bias generating unit 10 and the bias generating unit 20. Accordingly, a wiring region other than regions for input/output signal lines and power supply lines is not required, which facilitates layout design.

Figure 4A:
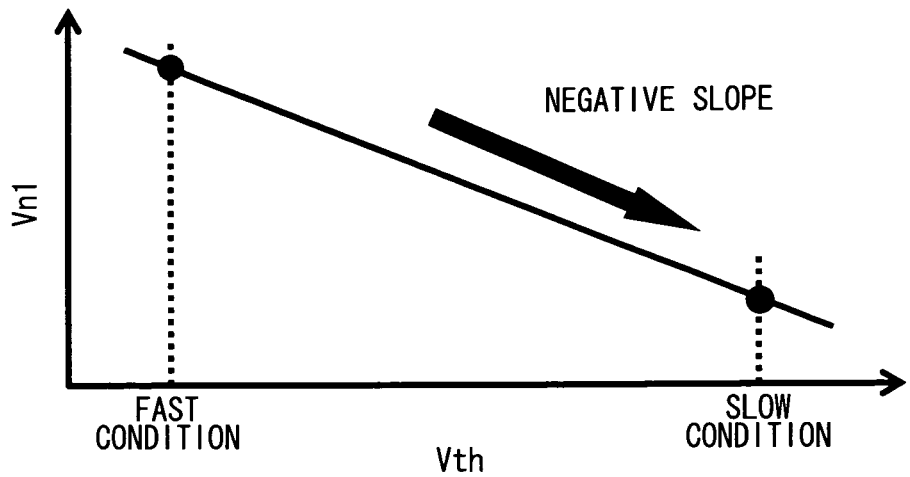
FIG. 4A shows an operating waveform of the delay circuit according to the first embodiment of the present invention.
Figure 4B:
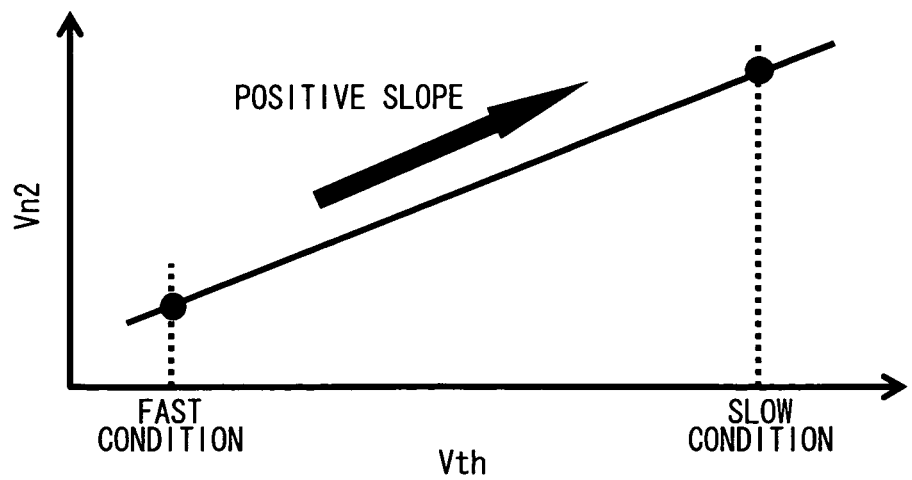
FIG. 4B shows an operating waveform of the delay circuit according to the first embodiment of the present invention.
Figure 4C:
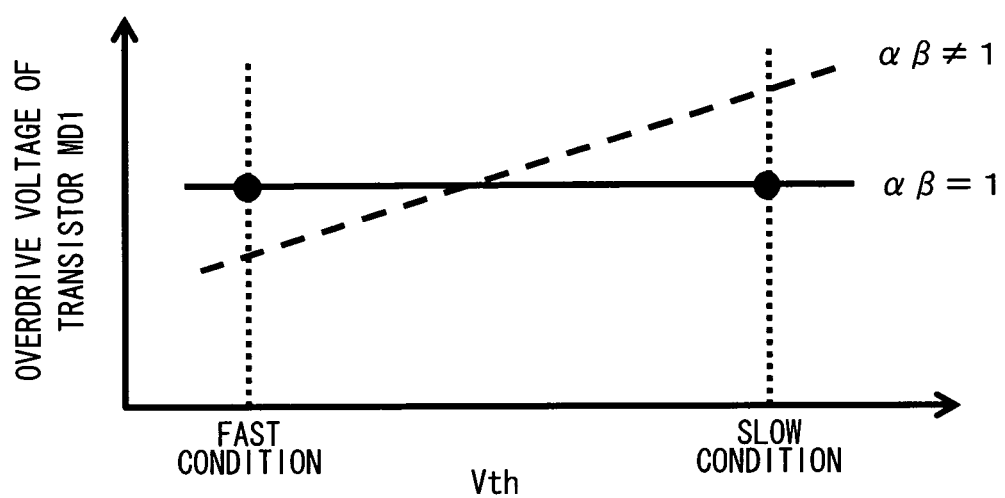
FIG. 4C shows an operating waveform of the delay circuit according to the first embodiment of the present invention.

Next, the operation of the delay circuit 1 shown in FIG. 1 will be described with reference to FIGS. 4A to 4C. FIG. 4A shows an operating waveform of the reference voltage generating unit 21. FIG. 4B shows an operating waveform of the voltage conversion unit 22. FIG. 4C shows an operating waveform of the delay generating unit 30. Only the operations of the bias generating unit 20 and the delay generating unit 30 related to the bias generating unit 20 are herein described, but the operations of the bias generating unit 10 and the delay generating unit 30 related to the bias generating unit 10 are also the same.

The reference voltage generating unit 21 compares a case where a threshold voltage of each transistor rises due to an effect of process variations or the like (a Slow condition) with a case where the threshold voltage has a value close to a center value of variations; and outputs the reference voltage Vn1 at a low voltage level (Slow in FIG. 4A). On the other hand, the reference voltage generating unit 21 compares a case where the threshold voltage of each transistor has a low threshold voltage (a Fast condition) with a case where the threshold voltage has a value close to a center value of variations, and outputs the reference voltage Vn1 at a high voltage level (Fast in FIG. 4A). That is, the reference voltage generating unit 21 outputs the reference voltage Vn1 having a reverse characteristic (described later) according to a fluctuation of the threshold voltage of each N-channel MOS transistor.

On the other hand, in the Slow condition, the voltage conversion unit 22 outputs the bias voltage Vn2 at a voltage level higher than that when the threshold voltage has a value close to the center value of variations (Slow in FIG. 4B). In the Fast condition, the voltage conversion unit 22 outputs the bias voltage Vn2 at a voltage level lower than that when the threshold voltage has a value close to the center value of variations (Fast in FIG. 4B). That is, the voltage conversion unit 22 outputs the bias voltage Vn2 having a forward characteristic (described later) according to a fluctuation of the threshold voltage of each N-channel MOS transistor.

Hereinafter, the first embodiment will be described using formulas. Assume that the threshold voltage of each transistor is represented by Vth; a current flowing through each of the transistors MN11 and MN12 is represented by 12; and a current flowing through the transistor MD1 is represented by Id. In this case, a source-drain voltage Vds of the transistor MN11 has a voltage level lower than that of a power supply voltage VDD-Vth, and a gate-source voltage Vgs of the transistor MN11 is has a voltage level equal to that of the power supply voltage VDD. That is, Vds<Vgs–Vth holds. Accordingly, the transistor MN11 operates in a linear region. The other transistors operate in a saturation region, because the source-drain voltage is larger than the value obtained by subtracting the threshold voltage from the gate-source voltage.

Here, in the transistor MN11 operating in the linear region, the following formula holds.

$$I1 = \frac{1}{2}\mu_N \cdot Cox \cdot \frac{W_{MN11}}{L_{MN11}} \cdot (VDD - Vth) \cdot Vn1 \quad (1)$$

where $\mu_N$ represents mobility of an electric charge; Cox represents a capacitance per unit gate, and $W_{MN11}$ and $L_{MN11}$ represent the gate width and the gate length of the transistor MN11, respectively.

In the transistor MN12 operating in the saturation region, the following two formulas hold.

$$I1 = \frac{1}{2}\mu_N \cdot Cox \cdot \frac{W_{MN12}}{L_{MN12}} \cdot (VDD - Vth - Vn1)^2 \quad (2)$$

where $W_{MN12}$ and $L_{MN12}$ represent the gate width and the gate length of the transistor MN12, respectively.

When the reference voltage Vn1 is calculated using Formula (1) and Formula (2), the following approximation holds.

$$Vn1 \approx \alpha(VDD - Vth) \quad (3)$$

where α represents a function of $W_{MN11}$ and $W_{MN12}$, and assume that $L_{MN11} = L_{MN12}$.

A fluctuation of the reference voltage Vn1 when the process varies (a fluctuation of the threshold voltage due to process variations or the like) can be expressed by Formula (3) as follows.

$$\partial Vn1/\partial Vth = -\alpha \quad (4)$$

As is obvious from Formula (4), when the threshold voltage of the transistor is high (in the slow condition), the reference voltage generating unit 21 outputs the reference voltage Vn1 of lower level than that when the threshold voltage has a value close to the center value of variations. When the threshold voltage of the transistor is low (in the Fast condition), the reference voltage generating unit 21 outputs the reference voltage Vn1 of higher level than that when the threshold voltage has a value close to the center value of variations. That is, the reference voltage generating unit 21 outputs the reference voltage Vn1 having a reverse characteristic (described later) depending on the fluctuation of the threshold voltage of the transistors MN11 and MN12.

Next, in the transistor MN21 operating in the saturation region, the following formula holds.

$$I2 = \frac{1}{2}\mu_N \cdot Cox \cdot \frac{W_{MN21}}{L_{MN21}} \cdot (Vn1 - Vth)^2 \quad (5)$$

where $W_{MN21}$ and $L_{MN21}$ represent the gate width and the gate length of the transistor MN21, respectively.

In the transistor MN22 operating in the saturation region, the following formula holds.

$$I2 = \frac{1}{2}\mu_N \cdot Cox \cdot \frac{W_{MN22}}{L_{MN22}} \cdot (VDD - Vth - Vn2)^2 \quad (6)$$

where $W_{MN21}$ and $L_{MN22}$ represent the gate width and the gate length of the transistor MN22, respectively.

When the bias voltage Vn2 is calculated using Formula (5), Formula (6), and Formula (3), the following approximation holds.

$$Vn2 \approx (\alpha - \beta)VDD + \alpha\beta Vth \quad (7)$$

where β represents a function of $W_{MN21}$ and $W_{MN22}$, and assume that $L_{MN21} = L_{MN22}$.

A fluctuation of the bias voltage Vn2 when the threshold voltage of the transistor fluctuates due to process variations or the like can be expressed by Formula (7) as follows.

$$\partial Vn2/\partial Vth = \alpha\beta \quad (8)$$

As is obvious from Formula (8), when the threshold voltage of the transistor is high (in the Slow condition), the voltage conversion unit 22 outputs the bias voltage Vn2 of higher level than that when the threshold voltage has a value close to the center value of variations. When the threshold voltage of the transistor is low (in the Fast condition), the voltage conversion unit 22 outputs the bias voltage Vn2 of lower level than that when the threshold voltage has a value close to the center value of variations. That is, the voltage conversion unit 22 outputs the bias voltage Vn2 having a forward characteristic (described later) depending on the fluctuation of the threshold voltage of the transistors MN21 and MN22.

At this time, the current Id flowing between the source and the drain of the transistor MD1 provided in the delay generating unit 30 is proportional to an overdrive voltage Vod of the transistor MD1. The current Id can be expressed by the following formula.

$$Id = \frac{1}{2}\mu_N \cdot Cox \cdot \frac{W_{MD1}}{L_{MD1}} \cdot (Vn2 - Vth)^2 \propto Vod \quad (9)$$

The overdrive voltage Vod of the transistor MD1 has a value obtained by subtracting the threshold voltage from the gate-source voltage of the transistor MD1. Accordingly, the overdrive voltage Vod can be expressed as Vod=Vn2−Vth. $W_{MD1}$ and $L_{MD1}$ represent the gate width and the gate length of the transistor MD1, respectively.

A fluctuation of the overdrive voltage Vod when the threshold voltage of the transistor fluctuates due to process variations or the like can be expressed by Formula (10) and Formula (7) as follows.

$$\partial Vod/\partial Vth \approx (1-\alpha\beta) \quad (10)$$

It is obvious from Formula (10) that $W_{MN11}$, $W_{MN12}$, $W_{MN21}$, and $W_{MN22}$ may be adjusted to satisfy $\alpha\beta=1$ in order to reduce the fluctuation of the overdrive voltage Vod (fluctuation of Id) when the threshold voltage of the transistor fluctuates. In other words, when the transistor is designed to satisfy $\alpha\beta=1$, the bias voltage Vn2 fluctuates in association with the fluctuation of the threshold voltage of the transistor MD1. Accordingly, even when the threshold voltage of the transistor MD1 fluctuates, the overdrive voltage of the transistor MD1 is kept constant (FIG. 4C). As a result, the drain current of the transistor MD1 is kept constant even when the threshold voltage of the transistor MD1 fluctuates.

Although the first embodiment has exemplified the case where the transistor MN11 operates in the linear region, the present invention is not limited thereto. Also when the transistor MN11 operates in the saturation region, the desired bias voltage Vn2 can be output by adjusting $W_{MN11}$, $W_{MN12}$, $W_{MN21}$, and $W_{MN22}$.

Also in the bias generating unit 10, when the gate width of each of the transistors MP11, MP12, MP21, and MP22 is adjusted, the bias voltage Vp2 fluctuates in association with the fluctuation of the threshold voltage of the transistor MD2. Thus, the overdrive voltage of the transistor MD2 is kept constant even when the threshold voltage of the transistor MD2 fluctuates. For this reason, the drain current of the transistor MD2 is kept constant even when the threshold voltage of the transistor MD2 fluctuates. As a result, a stable drive current is constantly supplied to each of the transistors MD3 and MD4 having inverter functions. Also when the transistors MP11, MP12, MP21, and MP22, which constitute the bias generating unit 10, operate in the saturation region, the desired bias voltage Vp2 can be output by adjusting the gate widths of these transistors.

Thus, the delay circuit 1 shown in FIG. 1 is capable of supplying a stable drive current to the delay generating unit 30 even in the case where the threshold voltage of the transistor fluctuates due to process variations or the like. This is because the bias generating units 10 and 20 generate the reference voltages Vp1 and Vn1 in the direction in which the fluctuation is enhanced (reverse characteristic) by using the reference voltage generating units 11 and 21, and then convert the reference voltages Vp1 and Vn1 using the voltage conversion units 12 and 22 to generate the bias voltages Vp2 and Vn2. This enables the delay circuit 1 shown in FIG. 1 to add a delay with high accuracy to the external input signal A.

Figure 13:
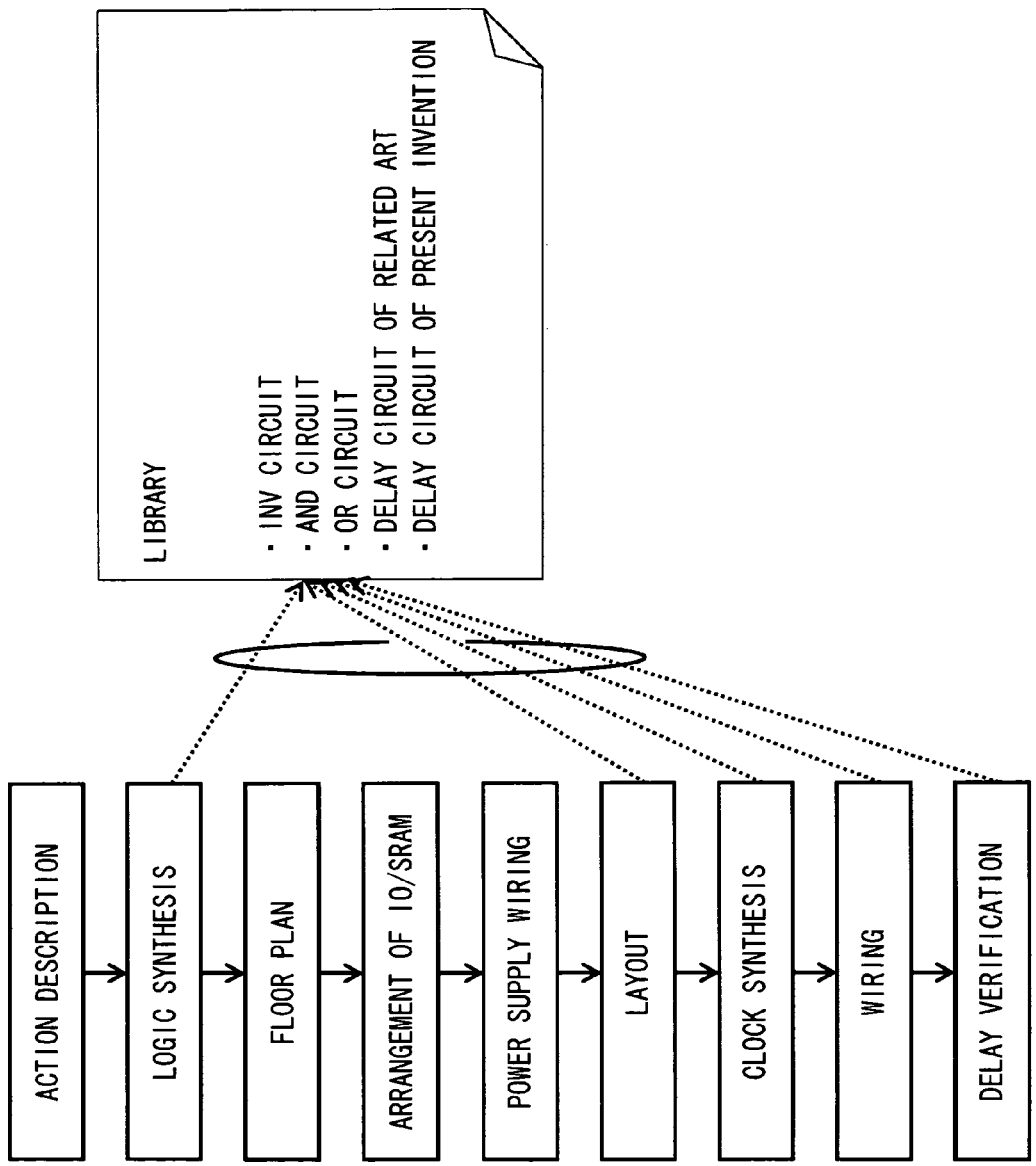
FIG. 13 shows a chip design process to which the present invention is applied.

FIG. 13 shows a chip producing process using the delay circuit 1 shown in FIG. 1. As shown in FIG. 13, in the production of a chip, action description, logic synthesis, floor plan, arrangement of 10 cells and SRAM cells, power supply wiring, layout, clock synthesis, wiring, and delay verification are typically carried out in this order. In this case, unlike the chip producing process of the related art, only the delay circuit 1 is further added to the cell lineup of a library for use in each step of the chip producing process using the delay circuit 1. Therefore, the chip producing process using the delay circuit 1 can be achieved with little change in the chip producing process of the related art.

Figure 14:
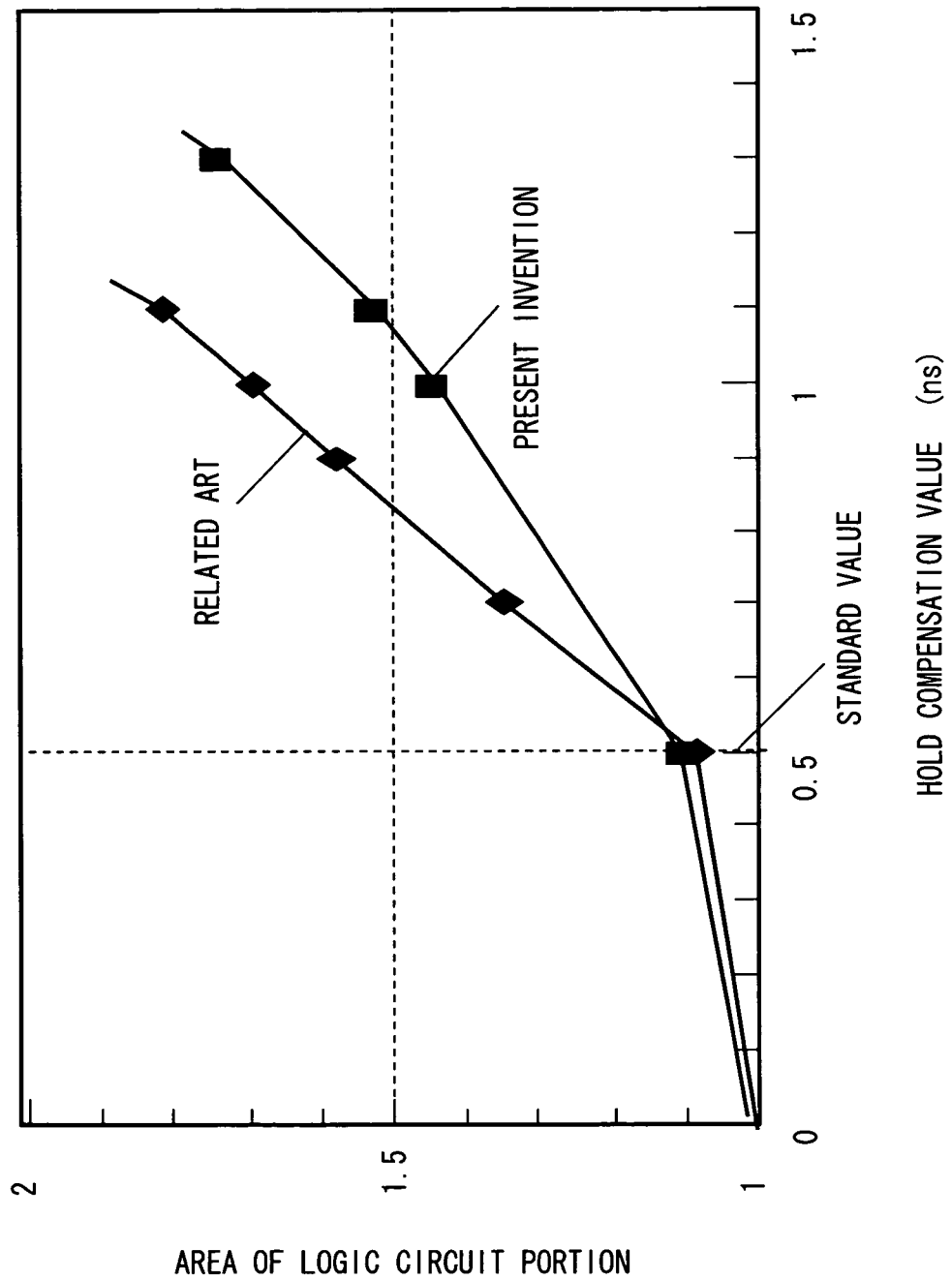
FIG. 14 shows a relationship between a hold compensation value and an area of a logic circuit portion.

FIG. 14 shows a relationship between a hold compensation value and an area of a logic circuit portion in both cases where a chip is designed using the delay circuit 1 and a chip is designed without using the delay circuit 1. In other words, FIG. 14 shows an increase in the area of the logic circuit portion when the hold compensation value is increased. In the delay circuit 1, the drive current supplied to the delay generating unit 30 is adjusted by changing the size of each of the transistors MD1 and MD2. For example, when the gate width of each of the transistors MD1 and MD2 is reduced by half, the drive current supplied to the delay generating unit 30 is also reduced by half, so that the amount of delay to be added to the input signal is doubled. Thus, a plurality of delay circuits 1 having different amounts of delay are added to the cell lineup of the library. Accordingly, the chip design using the delay circuits 1 allows suppression of an increase in the circuit size even when the hold compensation value is large. For example, when the hold compensation value is twice as large as a standard value, the area of the logic circuit portion can be reduced by about 30% in the chip design using the delay circuits 1; as compared with the chip design without using the delay circuits 1.

In the bias generating unit 10, the number of P-channel MOS transistors constituting each of the reference voltage generating unit 11 and the voltage conversion unit 12 is not limited to two. A circuit configuration may be employed in which two of more P-channel MOS transistors are connected in series. Furthermore, the drain voltage of at least one of the transistors constituting the reference voltage generating unit 11 may be used as the reference voltage Vp1. The reference voltage Vp1 may be supplied to the gate of at least one of the transistors constituting the voltage conversion unit 12. The drain voltage of at least one of the transistors constituting the voltage conversion unit 12 may be used as bias voltage Vp2. Hereinafter, a modified example of the bias generating unit 10 will be described with reference to FIG. 5A.

Figure 5A:
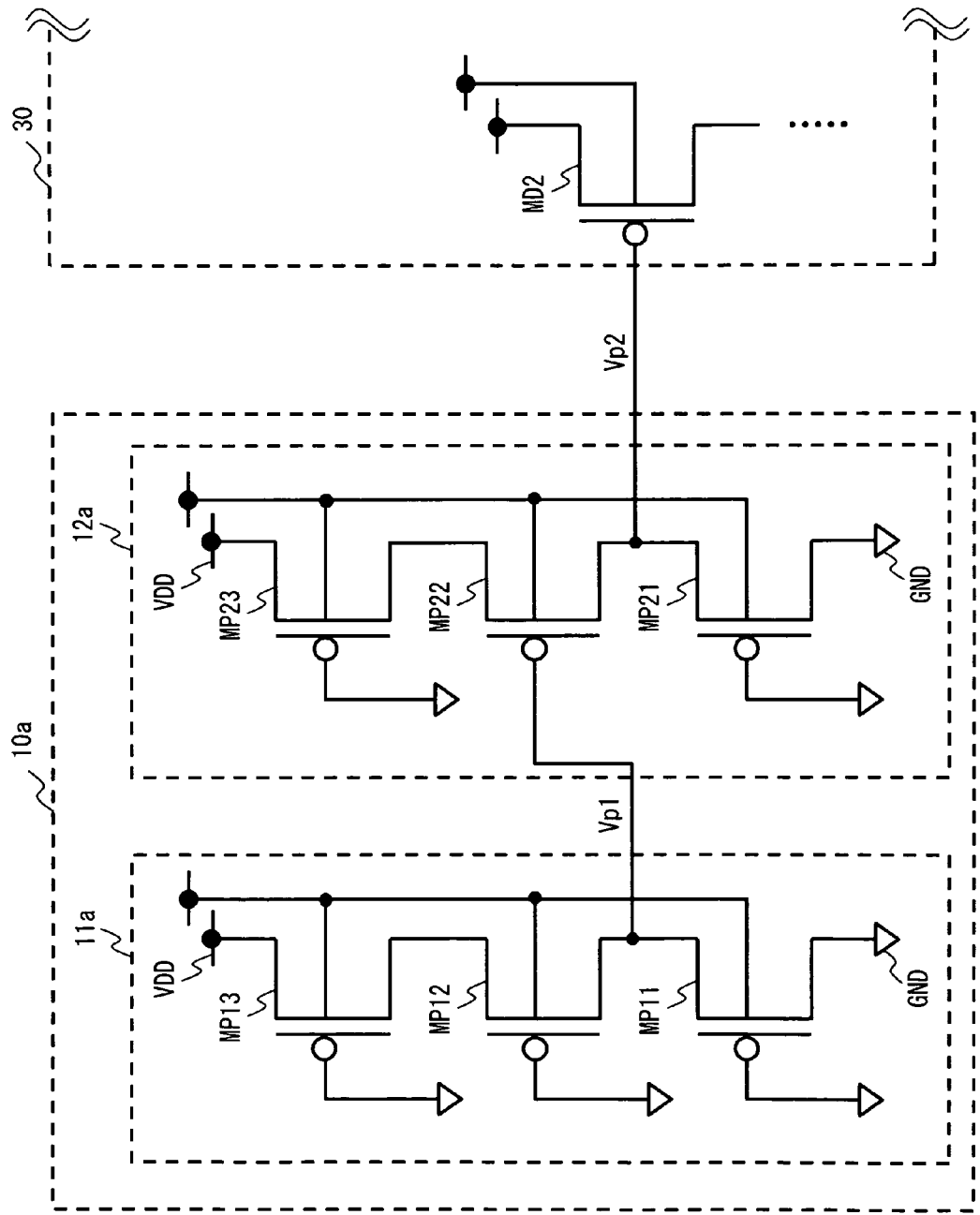
FIG. 5A is a circuit diagram showing a bias generating circuit according to the first embodiment of the present invention.

FIG. 5A shows a bias generating unit 10a as a modified example of the bias generating unit 10. The bias generating unit 10a includes a reference voltage generating unit 11a and a voltage conversion unit 12a. The reference voltage generating unit 11a corresponds to the reference voltage generating unit 11, and the voltage conversion unit 12a corresponds to the voltage conversion unit 12. As shown in FIG. 5A, the reference voltage generating unit 11a includes three P-channel MOS transistors MP11 to MP13 which are connected in series. The gates of the transistors MP11 to MP13 are each supplied with the ground voltage GND. The reference voltage generating unit 11a outputs the drain voltage of the transistor MP12 as the reference voltage Vp1. The voltage conversion unit 12a includes three P-channel MOS transistors MP21 to MP23 which are connected in series. The gates of the transistors MP21 and MP23 are each supplied with the ground voltage GND, and the gate of the transistor MP22 is supplied with the reference voltage Vp1 from the reference voltage generating unit 11a. The voltage conversion unit 12a outputs the drain voltage of the transistor MP22 as the bias voltage Vp2. Thus, the reference voltage generating unit 11 and the voltage conversion unit 12 may have a circuit configuration in which two or more P-channel MOS transistors are connected in series.

Similarly, in the bias generating unit 20, the number of N-channel MOS transistors constituting each of the reference voltage generating unit 21 and the voltage conversion unit 22 is not limited to two. A circuit configuration may be employed in which two or more N-channel MOS transistors are connected in series. The drain voltage of at least one of the transistors constituting the reference voltage generating unit 21 may be used as the drain voltage. The reference voltage Vn1 may be supplied to the gate of at least one of the transistors constituting the voltage conversion unit 22. The drain voltage of at least one of the transistors constituting the voltage conversion unit 22 may be used as the bias voltage Vn2. Hereinafter, a modified example of the bias generating unit 20 will be described with reference to FIG. 5B.

Figure 5B:
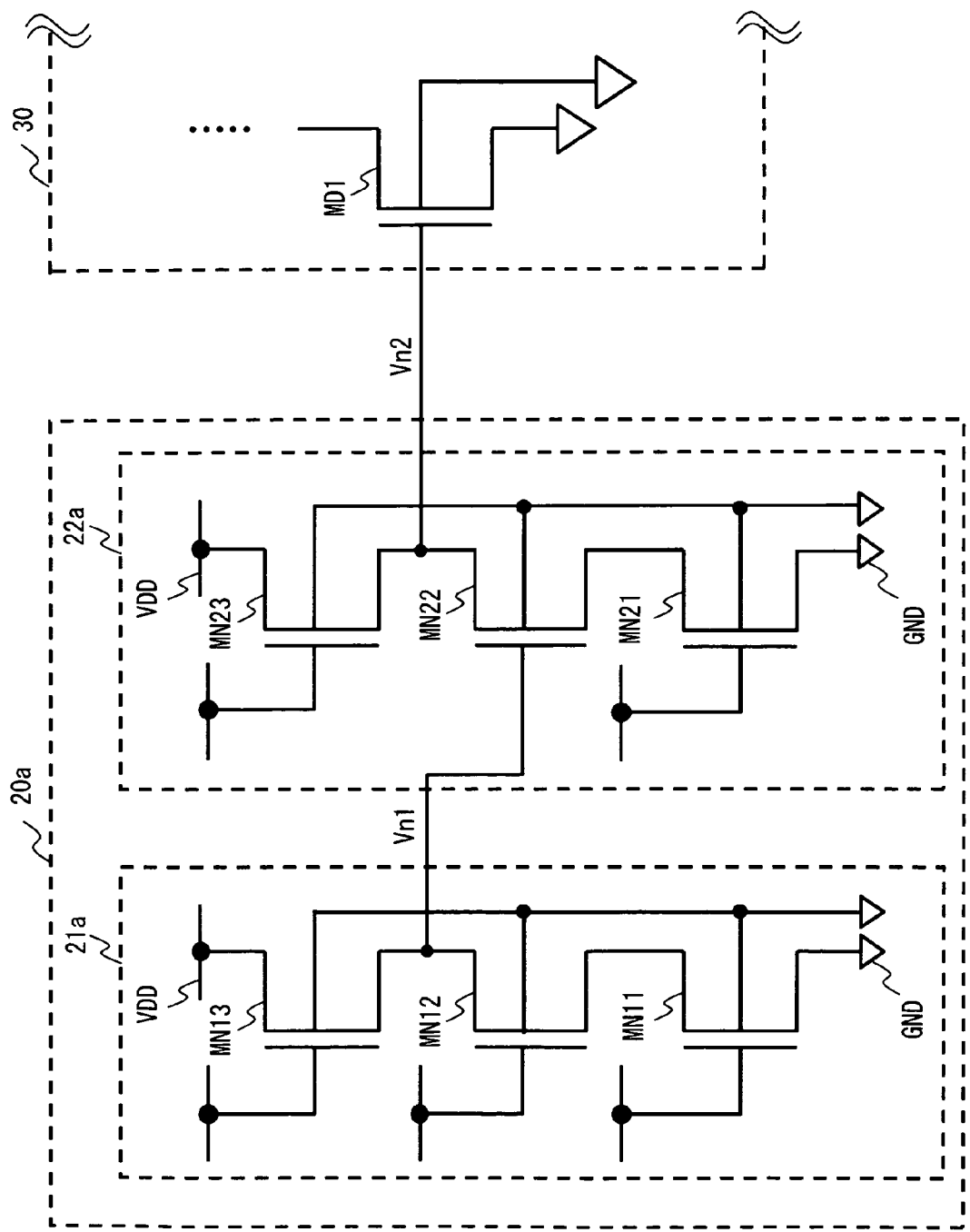
FIG. 5B is a circuit diagram showing the bias generating unit according to the first embodiment of the present invention.

FIG. 5B shows a bias generating unit 20a as a modified example of the bias generating unit 20. The bias generating unit 20a includes a reference voltage generating unit 21a and a voltage conversion unit 22a. The reference voltage generating unit 21a corresponds to the reference voltage generating unit 21, and the voltage conversion unit 22a corresponds to the voltage conversion unit 22. As shown in FIG. 5B, the reference voltage generating unit 21a includes three N-channel MOS transistors MN11 to MN13 which are connected in series. The gates of the transistors MN11 to MN13 are each supplied with the power supply voltage VDD. The reference voltage generating unit 21a outputs the drain voltage of the transistor MN12 as the reference voltage Vn1. The voltage conversion unit 22a includes three N-channel MOS transistors MN21 to MN23 which are connected in series. The gates of the transistors MN21 and MN23 are each supplied with the power supply voltage VDD, and the gate of the transistor MN22 is supplied with the reference voltage Vn1 from the reference voltage generating unit 21a. The voltage conversion unit 22a outputs the drain voltage of the transistor MN22 as the bias voltage Vn2. Thus, the reference voltage generating unit 21 and the voltage conversion unit 22 may have a circuit configuration in which two or more N-channel MOS transistors are connected in series.

Further, in the delay circuit 1 shown in FIG. 1, the back gates of the plurality of P-channel MOS transistors, which constitute each of the bias generating unit 10, the bias generating unit 20, and the delay generating unit 30, are connected to the high potential side power supply terminal, and the back gates of the plurality of N-channel MOS transistors are connected to the low potential side power supply terminal. However, the present invention is not limited to this configuration. A circuit configuration may be employed in which the back gate of each transistor is connected to its own source. Hereinafter, a modified example of the delay circuit 1 will be described with reference to FIGS. 6A and 6B.

Figure 6A:
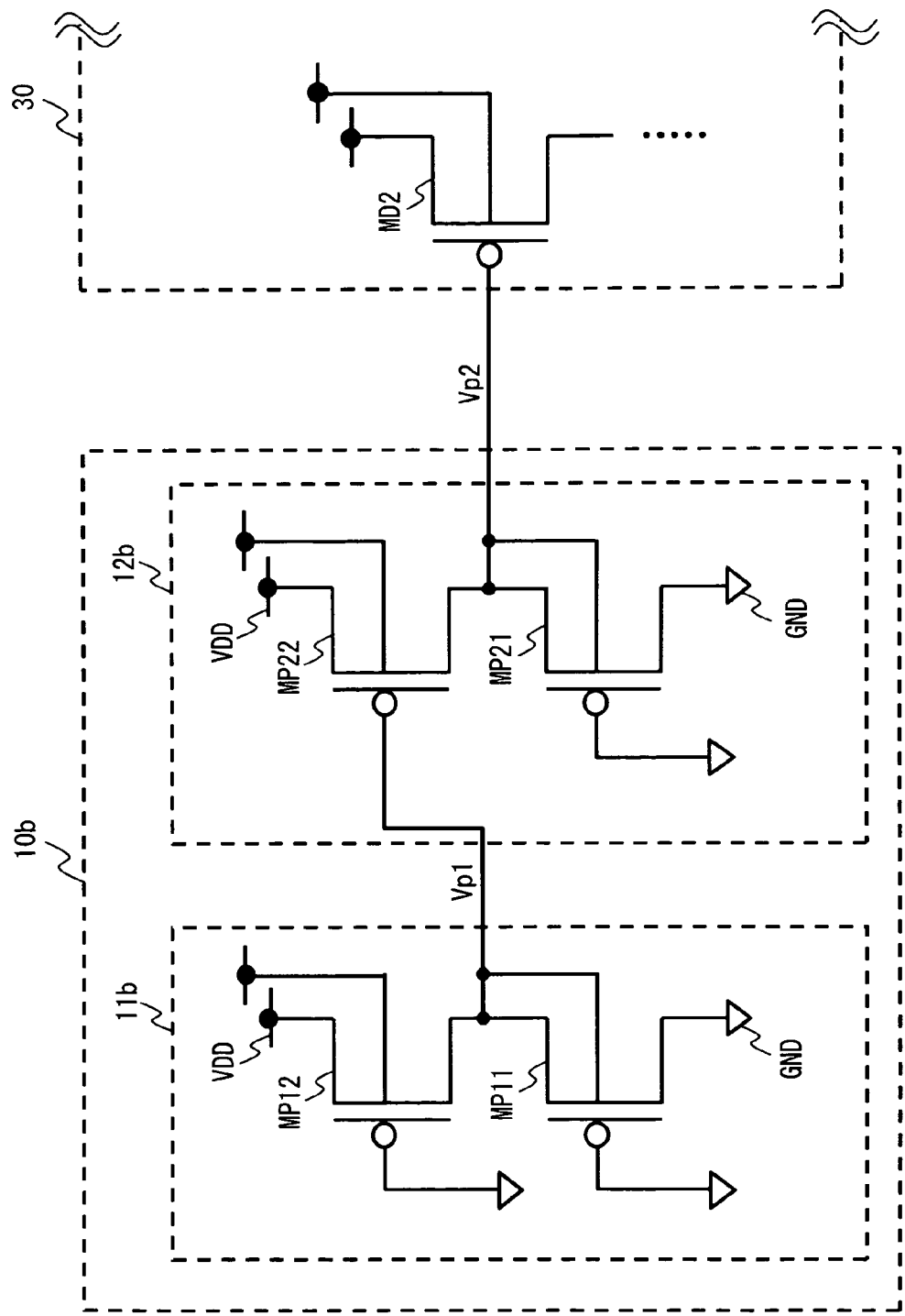
FIG. 6A is a circuit diagram showing the bias generating unit according to the first embodiment of the present invention.

FIG. 6A shows a bias generating unit 10b as a modified example of the bias generating unit 10. The bias generating unit 10b includes a reference voltage generating unit 11b and a voltage conversion unit 12b. The reference voltage generating unit 11a corresponds to the reference voltage generating unit 11, and the voltage conversion unit 12a corresponds to the voltage conversion unit 12. The bias generating unit 10b differs from the bias generating unit 10 in that the back gates of the transistors MP11, MP12, MP21, and MP22 are connected to their own sources. The other configuration of the bias generating unit 10b is similar to that of the bias generating unit 10, so the description thereof is omitted.

Figure 6B:
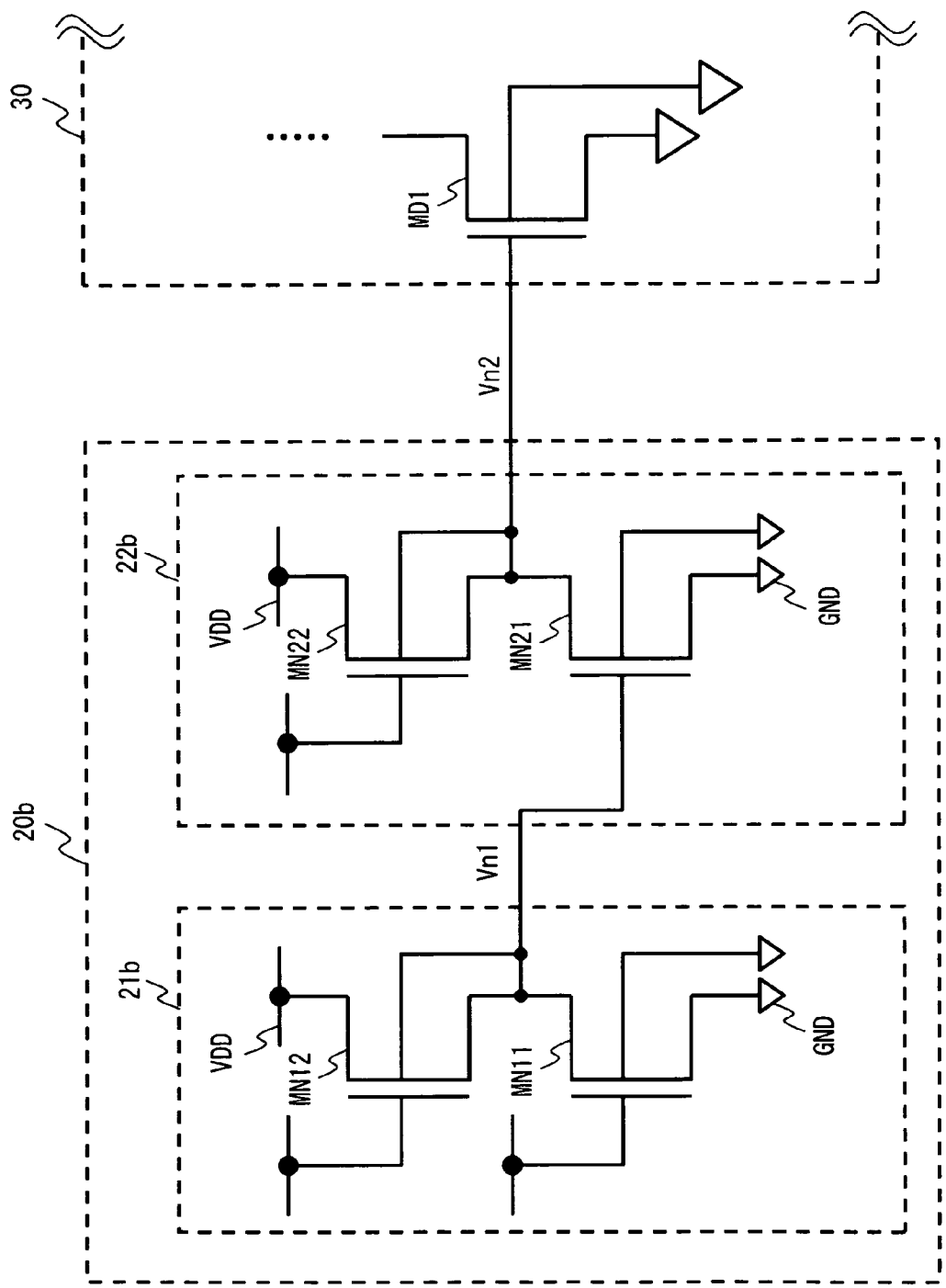
FIG. 6B is a circuit diagram showing the bias generating unit according to the first embodiment of the present invention.

FIG. 6B shows a bias generating unit 20b as a modified example of the bias generating unit 20. The bias generating unit 20b includes a reference voltage generating unit 21b and a voltage conversion unit 22b. The reference voltage generating unit 21a corresponds to the reference voltage generating unit 21, and the voltage conversion unit 22a corresponds to the voltage conversion unit 22. The bias generating unit 20b differs from the bias generating unit 20 in that the back gates of the transistors MN11, MN12, MN21, and MN22 are connected to their own sources. The other circuit configuration of the bias generating unit 20b is similar to that of the bias generating unit 20, so the description thereof is omitted. Similarly, the back gates of the transistors MD1 to MD6, which constitute the delay generating unit 30, are connected to their own sources (not shown).

With this circuit configuration, the adverse effect of the substrate potential effect can be reduced, resulting in a reduction in the gate width of each transistor. Consequently, an increase in the circuit area can be suppressed.

Moreover, a circuit configuration may be employed in which the back gates of the transistors constituting the bias generating unit 10, the bias generating unit 20, and the delay generating unit 30 are connected to a power supply terminal for back gate which is different from the high potential side power supply terminal and the low potential side power supply terminal. A modified example of the delay circuit 1 will be described with reference to FIGS. 7A and 7B.

Figure 7A:
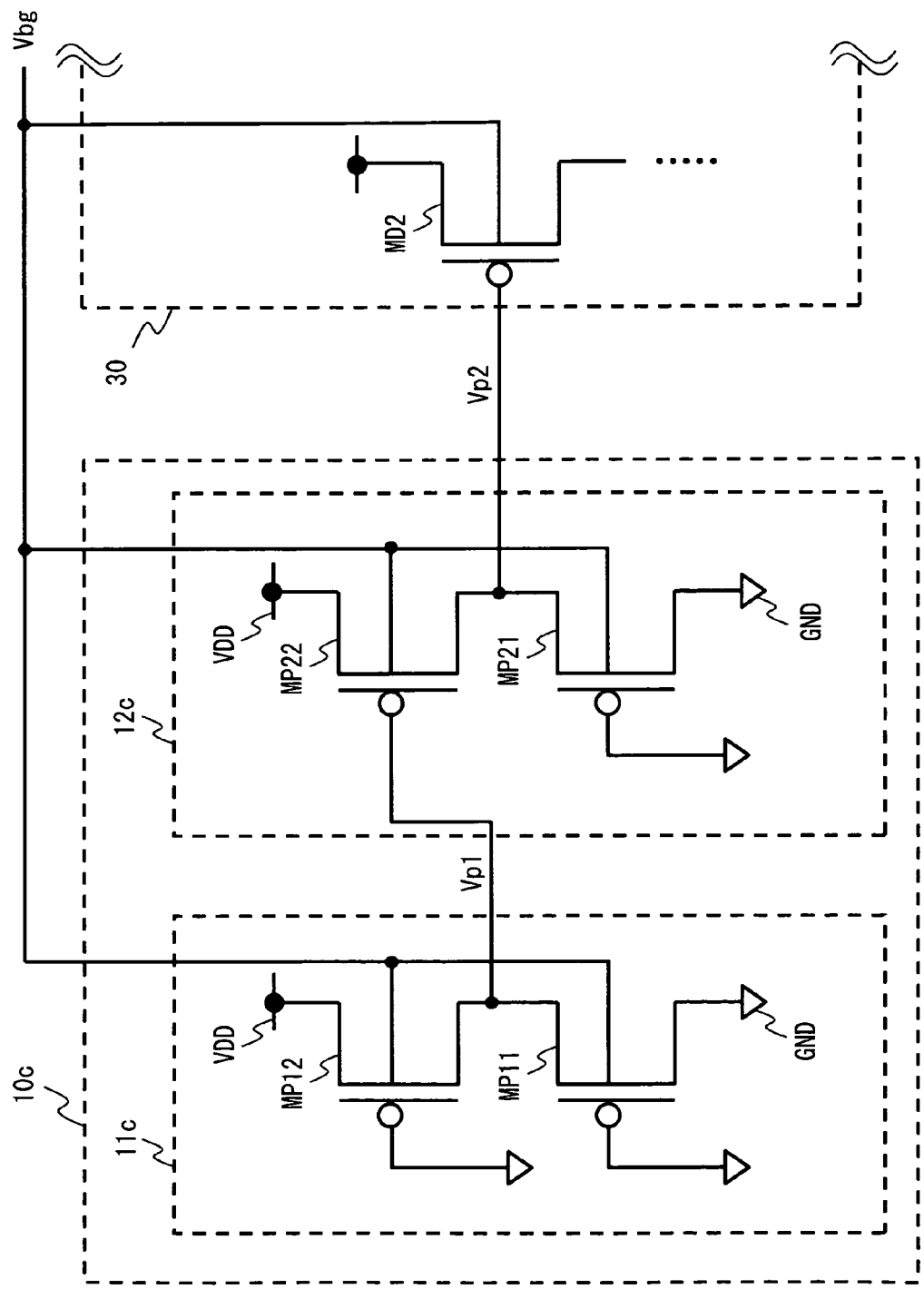
FIG. 7A is a circuit diagram showing the bias generating unit according to the first embodiment of the present invention.

FIG. 7A shows a bias generating unit 10c as a modified example of the bias generating unit 10. The bias generating unit 10c includes a reference voltage generating unit 11c and a voltage conversion unit 12c. The reference voltage generating unit 11c corresponds to the reference voltage generating unit 11, and the voltage conversion unit 12c corresponds to the voltage conversion unit 12. The bias generating unit 10c differs from the bias generating unit 10 in that the back gates of the transistors MP11, MP12, MP21, and MP22 are connected to a power supply terminal Vbg for back gate which is different from the high potential side power supply terminal and the low potential side power supply terminal. The other configuration of the bias generating unit 10c is similar to that of the bias generating unit 10, so the description thereof is omitted.

Figure 7B:
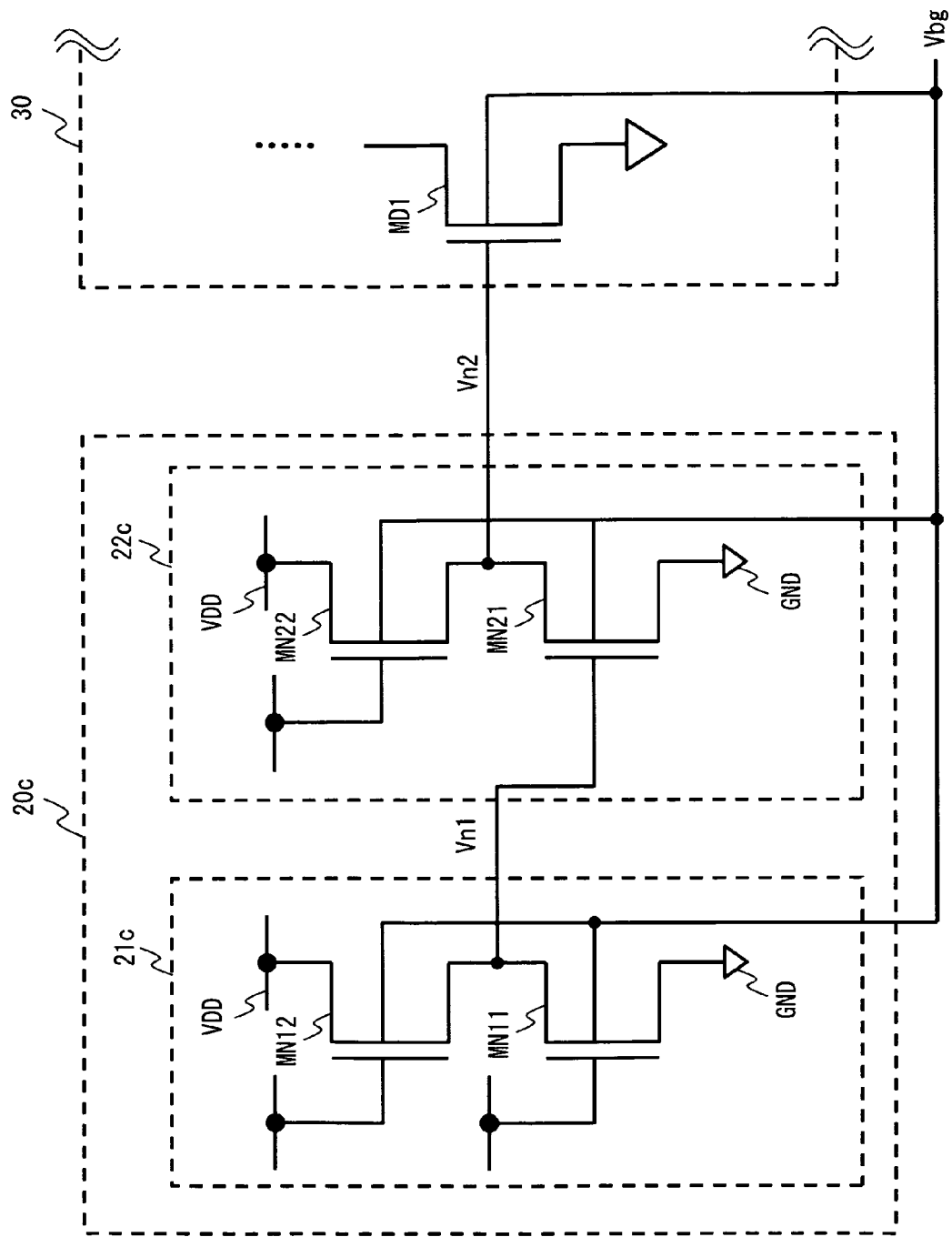
FIG. 7B is a circuit diagram showing the bias generating unit according to the first embodiment of the present invention.

FIG. 7B shows a bias generating unit 20c as a modified example of the bias generating unit 20. The bias generating unit 20c includes a reference voltage generating unit 21c and a voltage conversion unit 22c. The reference voltage generating unit 21c corresponds to the reference voltage generating unit 21, and the voltage conversion unit 22c corresponds to the voltage conversion unit 22. The bias generating unit 20c differs from the bias generating unit 20 in that the back gates of the transistors MN11, MN12, MN21, and MN22 are connected to the power supply terminal Vbg for back gate which is different from the high potential side power supply terminal and the low potential side power supply terminal. The other circuit configuration of the bias generating unit 20c is similar to that of the bias generating unit 20, so the description thereof is omitted. Similarly, the back gates of the transistors MD1 to MD6, which constitute the delay generating unit 30, are connected to the power supply terminal Vbg (not shown) for back gate which is different from the high potential side power supply terminal and the low potential side power supply terminal.

This circuit configuration enables control of the fluctuation of the threshold voltage of each transistor according to the voltage of the power supply terminal Vbg. The fluctuation of the threshold voltage of each transistor is corrected to thereby improve the accuracy of delay control by the bias generating units 10 and 20. This leads to a reduction in the gate width of each transistor, and suppression of an increase in the circuit area.

As described above, the delay circuit according to the first embodiment is capable of supplying a stable drive current to the delay generating unit even when the threshold voltage of each transistor fluctuates due to process variations or the like. This allows the delay circuit according to this embodiment to add a delay with high accuracy to the external input signal A.

Furthermore, the delay circuit according to this embodiment includes no high-resistance element or diode, unlike the related art, thereby suppressing an increase in the circuit size. Moreover, MOS transistors having different conductivity types are not mixed in each bias generating unit, unlike the related art. Consequently, the delay accuracy is prevented from degrading due to a difference attributable to process variations between the conductivity types.

Second Embodiment

In the delay circuit according to the first embodiment, a constant current flows through a plurality of transistors constituting each bias generating unit. On the other hand, in a delay circuit according to a second embodiment, each bias generating unit is allowed to operate only during a predetermined period after a change of an external input signal. Accordingly, the delay circuit according to the second embodiment can add a delay with high accuracy to the external input signal, and can suppress an increase in power consumption. The circuit configuration will be described in more detail below.

Figure 8:
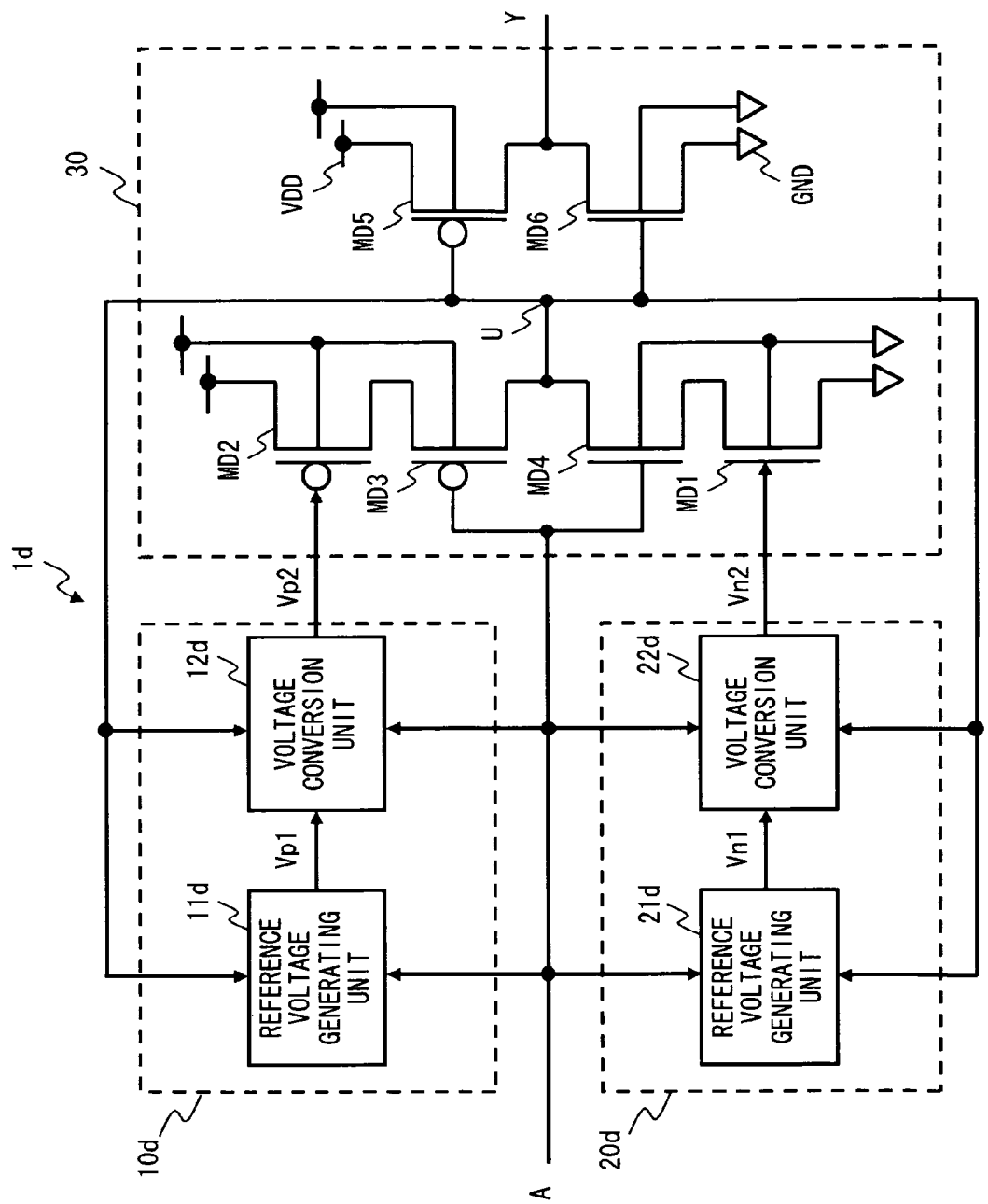
FIG. 8 is a block diagram showing a delay circuit according to a second embodiment of the present invention.

FIG. 8 shows a delay circuit 1*d* according to the second embodiment of the present invention. The delay circuit 1*d* shown in FIG. 8 differs from the delay circuit 1 shown in FIG. 1 in that a bias generating unit 10*d* is provided in place of the bias generating unit 10 and a bias generating unit 20*d* is provided in place of the bias generating unit 20.

(Bias Generating Unit 10*d*)

Figure 9A:
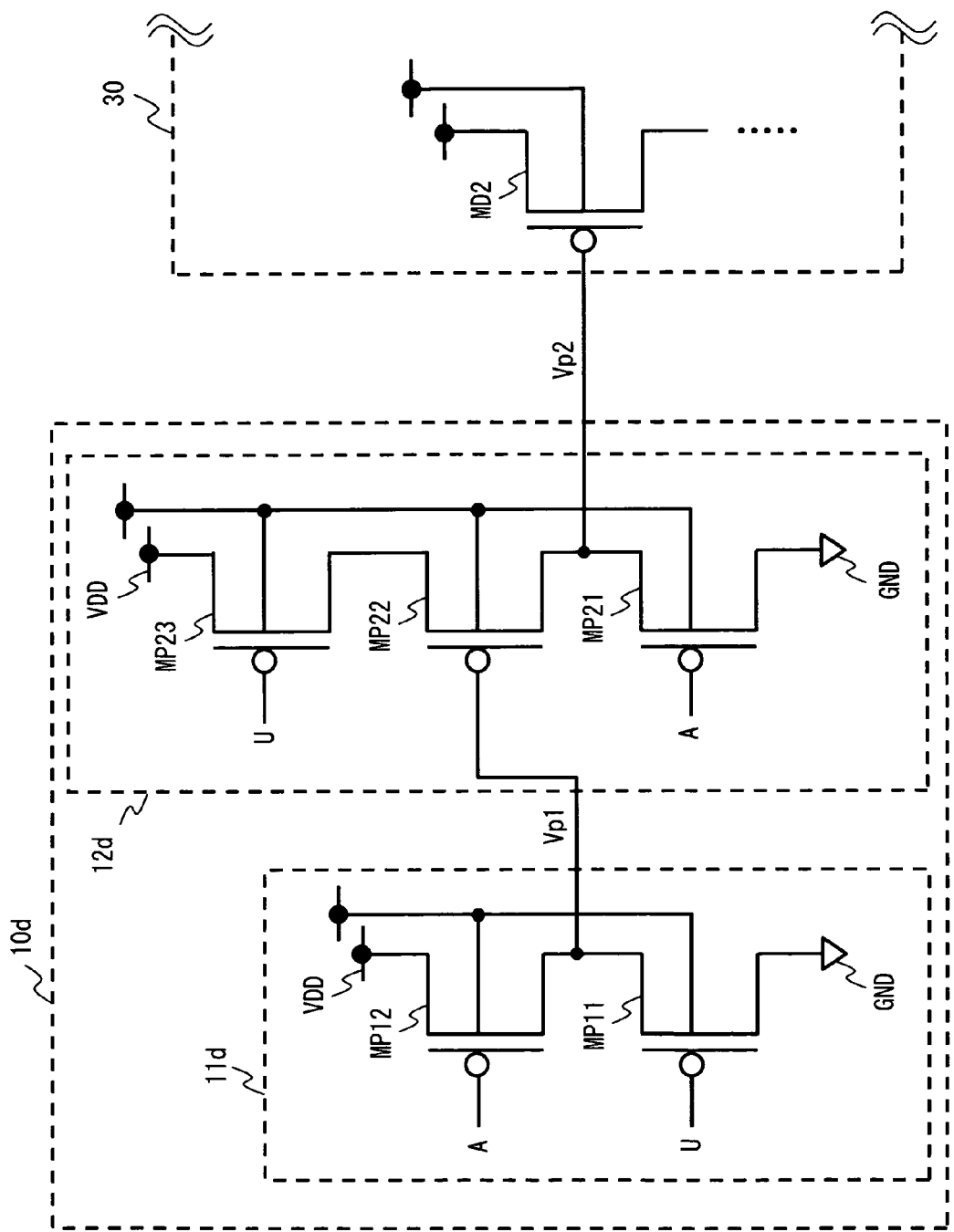
FIG. 9A is a circuit diagram showing a bias generating unit according to the second embodiment of the present invention.

Like the bias generating unit 10, the bias generating unit 10*d* generates the bias voltage Vp2 and outputs the generated bias voltage Vp2 to the delay generating unit 30. FIG. 9A is a circuit diagram showing the bias generating unit 10*d*. The bias generating unit 10*d* includes a reference voltage generating unit 11*d* and a voltage conversion unit 12*d*. The reference voltage generating unit 11*d* includes the transistors MP11 and MP12. The voltage conversion unit 12*d* includes the transistors MP21 to MP23. These transistors are MOS transistors of the same conductivity type (P-channel type).

In the reference voltage generating unit 11*d*, the gate of the transistor MP11 is supplied with the potential of the node U. The gate of the transistor MP12 is supplied with the input signal A. The other circuit configuration of the reference voltage generating unit 11*d* is similar to that of the reference voltage generating unit 11, so the description thereof is omitted.

In the voltage conversion unit 12*d*, the transistors MP21 to MP23 are connected in series between the high potential side power supply terminal and the low potential side power supply terminal. Specifically, the transistor MP21 has a gate supplied with the input signal A, a drain connected to the low potential side power supply terminal, and a source connected to the drain of the transistor MP22. The transistor MP22 has a gate supplied with the reference voltage Vp1 from the reference voltage generating unit 11*d*, and a source connected to the drain of the transistor MP23. The transistor MP23 has a gate supplied with the potential of the node U, and a source connected to the high potential side power supply terminal. The voltage conversion unit 12*d* outputs a potential of a node on a signal line connecting the source of the transistor MP21 and the drain of the transistor MP22, as the bias voltage Vp2. The other circuit configuration of the voltage conversion unit 12*d* is similar to that of the voltage conversion unit 12, so the description thereof is omitted.

(Bias Generating Unit 20*d*)

Figure 9B:
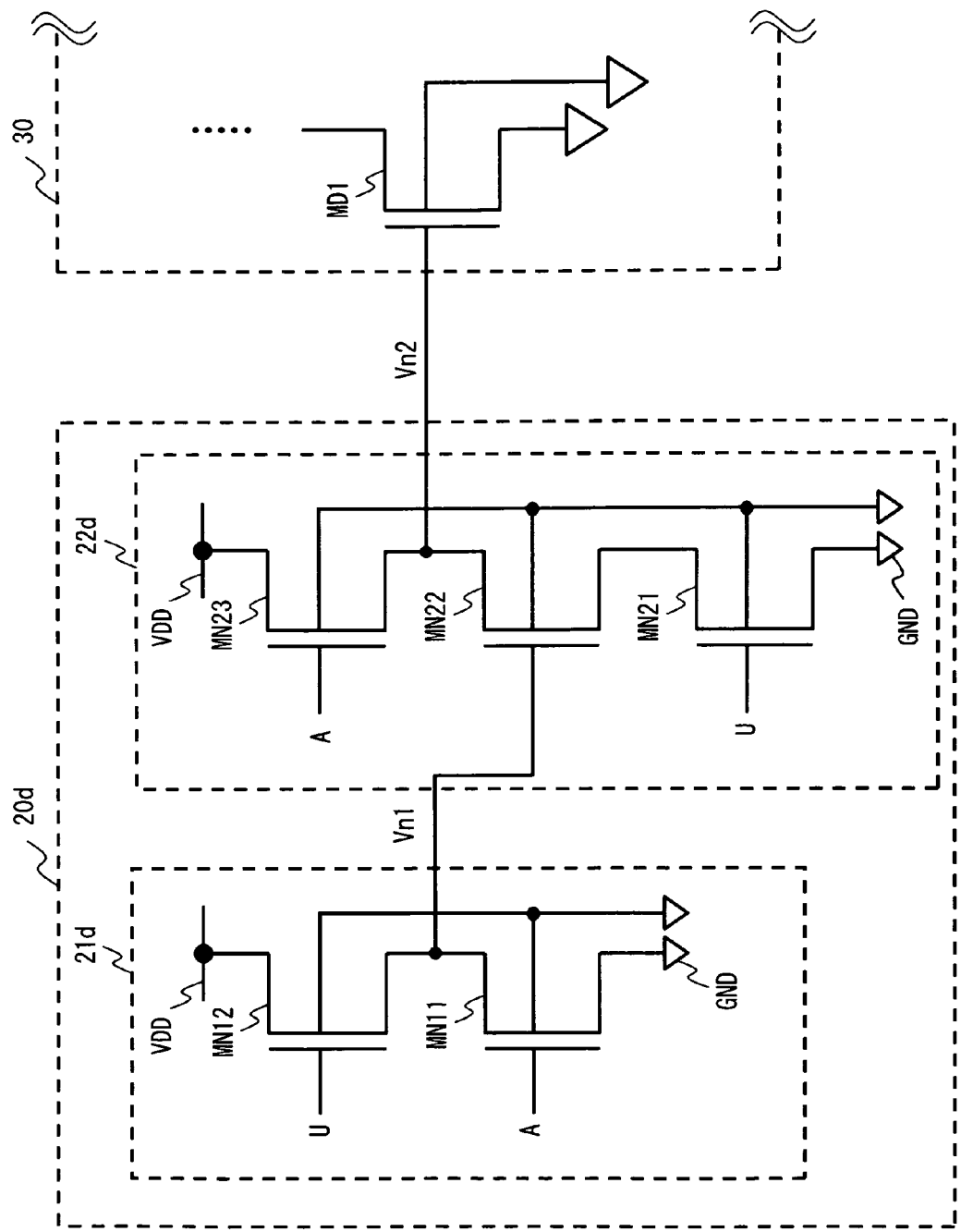
FIG. 9B is a circuit diagram showing the bias generating unit according to the second embodiment of the present invention.

Like the bias generating unit 20, the bias generating unit 20*d* generates the bias voltage Vn2 and outputs the generated bias voltage Vn2 to the delay generating unit 30. FIG. 9B is a circuit diagram showing the bias generating unit 20*d*. The bias generating unit 20*d* includes a reference voltage generating unit 21*d* and a voltage conversion unit 22*d*. The reference voltage generating unit 21*d* includes the transistors MN11 and MN12. The voltage conversion unit 22*d* includes the transistors MN21 to MN23. These transistors are MOS transistors of the same conductivity type (N-channel type).

In the reference voltage generating unit 21*d*, the gate of the transistor MN11 is supplied with the input signal A. The gate of the transistor MP12 is supplied with the potential of the node U. The other circuit configuration of the reference voltage generating unit 21*d* is similar to that of the reference voltage generating unit 21, so the description thereof is omitted.

In the voltage conversion unit 22*d*, the transistors MN21 to MN23 are connected in series between the high potential side power supply terminal and the low potential side power supply terminal. Specifically, the transistor MN21 has a gate supplied with the potential of the node U, a source connected to the low potential side power supply terminal, and a drain connected to the source of the transistor MN22. The transistor MN22 has a gate supplied with the reference voltage Vn1 from the reference voltage generating unit 21*d*, and a drain connected to the source of the transistor MN23. The transistor MN23 has a gate supplied with the input signal A, and a drain connected to the high potential side power supply terminal. The voltage conversion unit 22*d* outputs a potential of a node on a signal line connecting the drain of the transistor MN22 and the source of the transistor MN23, as the bias voltage Vn2. The other circuit configuration of the voltage conversion unit 22*d* is similar to that of the voltage conversion unit 22, so the description thereof is omitted.

Figure 10:
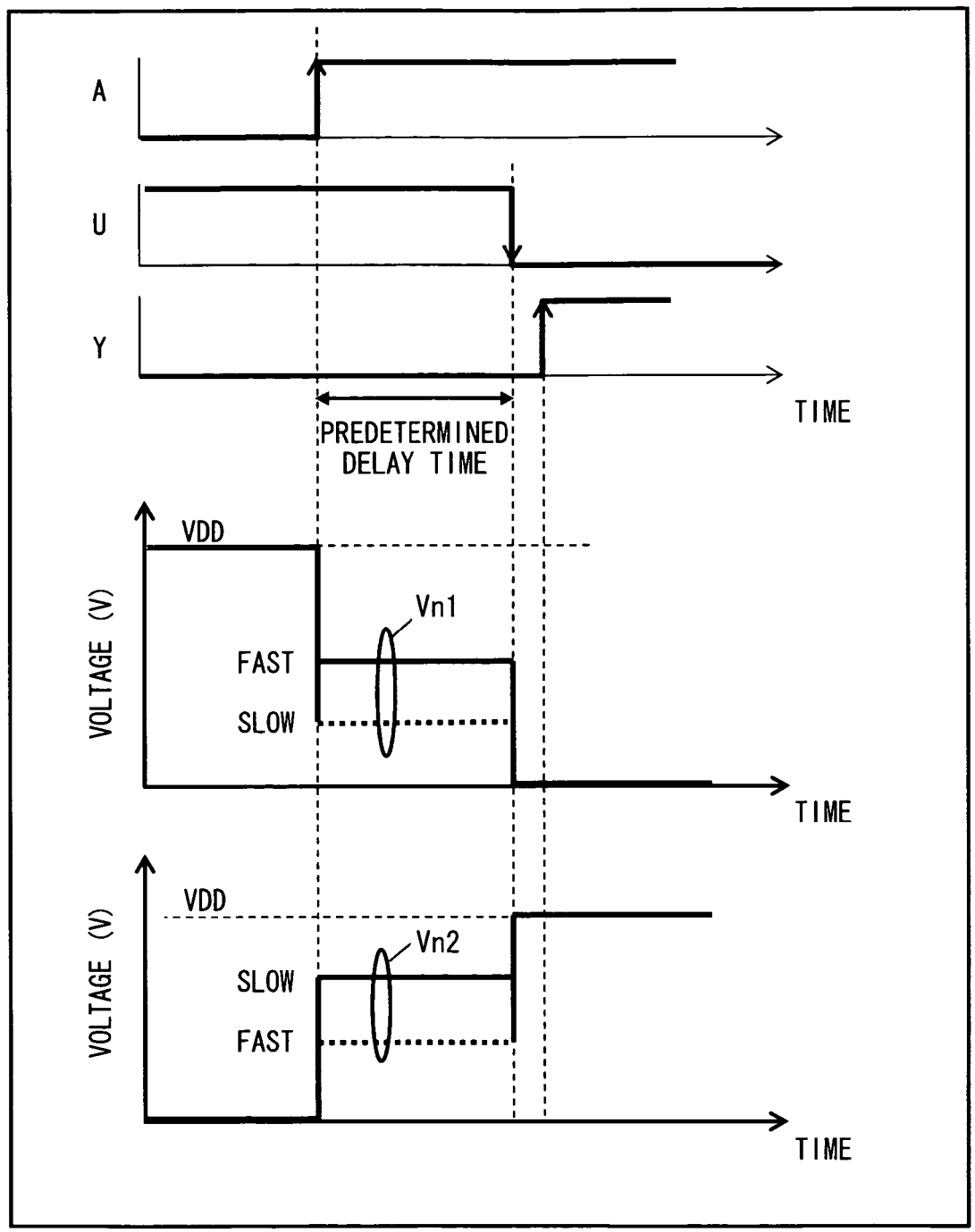
FIG. 10 shows an operating waveform of the delay circuit according to the second embodiment of the present invention.

In the delay circuit 1*d* shown in FIG. 8, the input signal A and an internal signal U (potential of the node U) basically have an opposite phase relationship. In practice, however, as shown in FIG. 10, the internal signal U changes after a predetermined delay time has passed since a change of the input signal A. For this reason, during the predetermined delay time, the input signal A and the internal signal U have the same logical value. For example, during a period in which both the input signal A and the internal signal U indicate the logical value 0, each transistor constituting the bias generating unit 10*d* is rendered conductive. Accordingly, the bias generating unit 10*d* outputs the bias voltage Vp2. During a period in which both the input signal A and the internal signal U indicate the logical value 1, each transistor constituting the bias generating unit 20*d* is rendered conductive. Accordingly, the bias generating unit 20*d* outputs the bias voltage Vn2. During a period in which the input signal A and the internal signal U indicate different logical values, one or more of the transistors connected in series are rendered non-conductive, so that no current flows through the bias generating units 10*d* and 20*d*. That is, the delay circuit 1*d* allows the bias generating units 10*d* and 20*d* to operate only during the predetermined period after a change of the input signal A. This leads to suppression of an increase in power consumption. The other operation of the delay circuit 1d is similar to that of the delay circuit 1, so the description thereof is omitted.

Figure 11A:
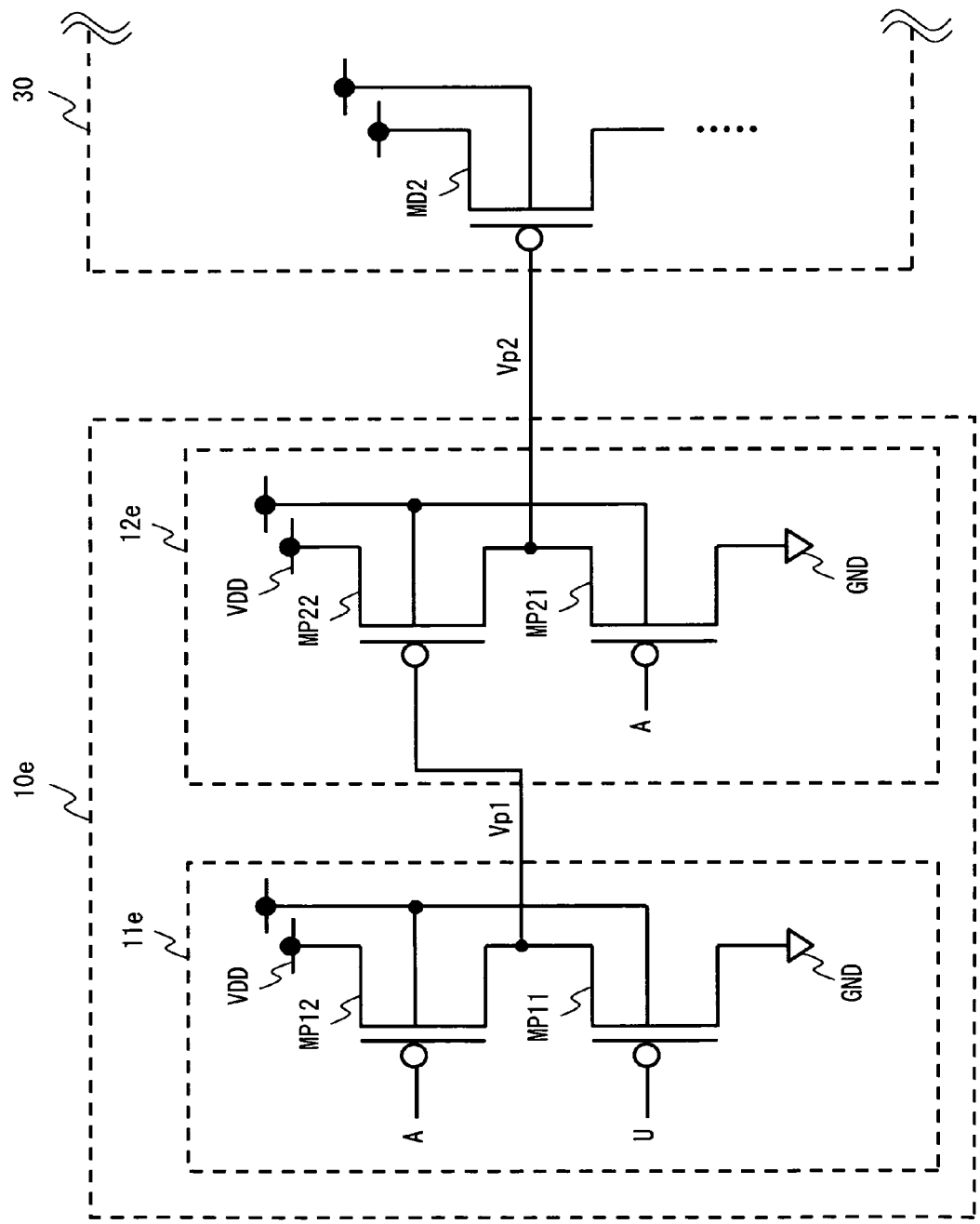
FIG. 11A is a circuit diagram showing the bias generating unit according to the second embodiment of the present invention.
Figure 11B:
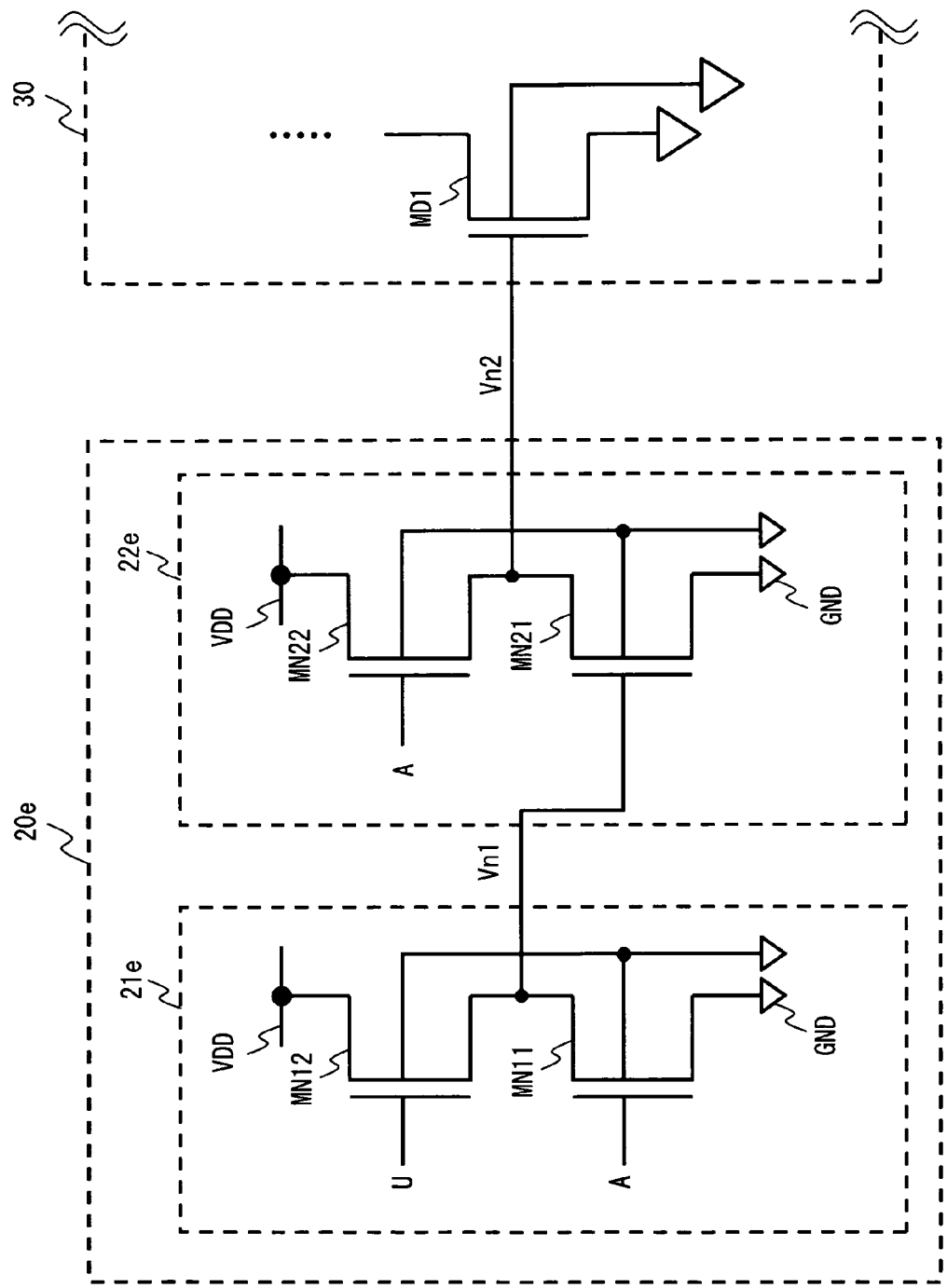
FIG. 11B is a circuit diagram showing the bias generating unit according to the second embodiment of the present invention.

Next, FIGS. 11A and 11B show bias generating units 10e and 20e as modified examples of the bias generating units 10d and 20d, respectively.

As shown in FIG. 11A, the reference voltage generating unit 11e includes two P-channel MOS transistors MP11 and MP12 which are connected in series. The gate of the transistor MP11 is supplied with the potential of the node U, and the gate of the transistor MP12 is supplied with the input signal A. The reference voltage generating unit 11e outputs the drain voltage of the transistor MP12 as the reference voltage Vp1. The voltage conversion unit 12e includes two P-channel MOS transistors MP21 and MP22 which are connected in series. The gate of the transistor MP21 is supplied with the input signal A, and the gate of the transistor MP22 is supplied with the reference voltage Vp1 from the reference voltage generating unit 11e. The voltage conversion unit 12e outputs the drain voltage of the transistor MP22 as the bias voltage Vp2.

As shown in FIG. 11B, the reference voltage generating unit 21e includes two N-channel MOS transistors MN11 and MN12 which are connected in series. The gate of the transistor MN 11 is supplied with the input signal A, and the gate of the transistor MN12 is supplied with the potential of the node U. The reference voltage generating unit 21e outputs the drain voltage of the transistor MN11 as the reference voltage Vn1. The voltage conversion unit 22e includes two N-channel MOS transistors MN21 and MN22 which are connected in series. The gate of the transistor MN21 is supplied with the reference voltage Vn1 from the reference voltage generating unit 21e, and the gate of the transistor MN22 is supplied with the input signal A. The voltage conversion unit 22e outputs the drain voltage of the transistor MN21 as the bias voltage Vn2. Also in this circuit configuration, the bias generating units 10e and 20e provide the same advantageous effects as those of the bias generating units 10d and 20d.

Third Embodiment

A delay circuit according to a third embodiment of the present invention has a circuit configuration similar to that of the first and second embodiments, except for a method for designing each bias generating unit. In the delay circuits according to the first and second embodiments, the transistors excluding some transistors of the reference voltage generating unit are typically designed to operate in the saturated state. On the other hand, in the delay circuit according to the third embodiment, some transistors of the voltage conversion unit are designed to easily operate in the linear region when the power supply voltage VDD decreases. Specifically, in the voltage conversion unit on the P-channel side, some transistors provided between a node outputting the bias voltage Vp2 and the high potential side power supply terminal are designed to easily operate in the linear region. In the voltage conversion unit on the N-channel side, some transistors provided between the node outputting the bias voltage Vn2 and the low potential side power supply terminal are designed to easily operate in the linear region.

Figure 12:
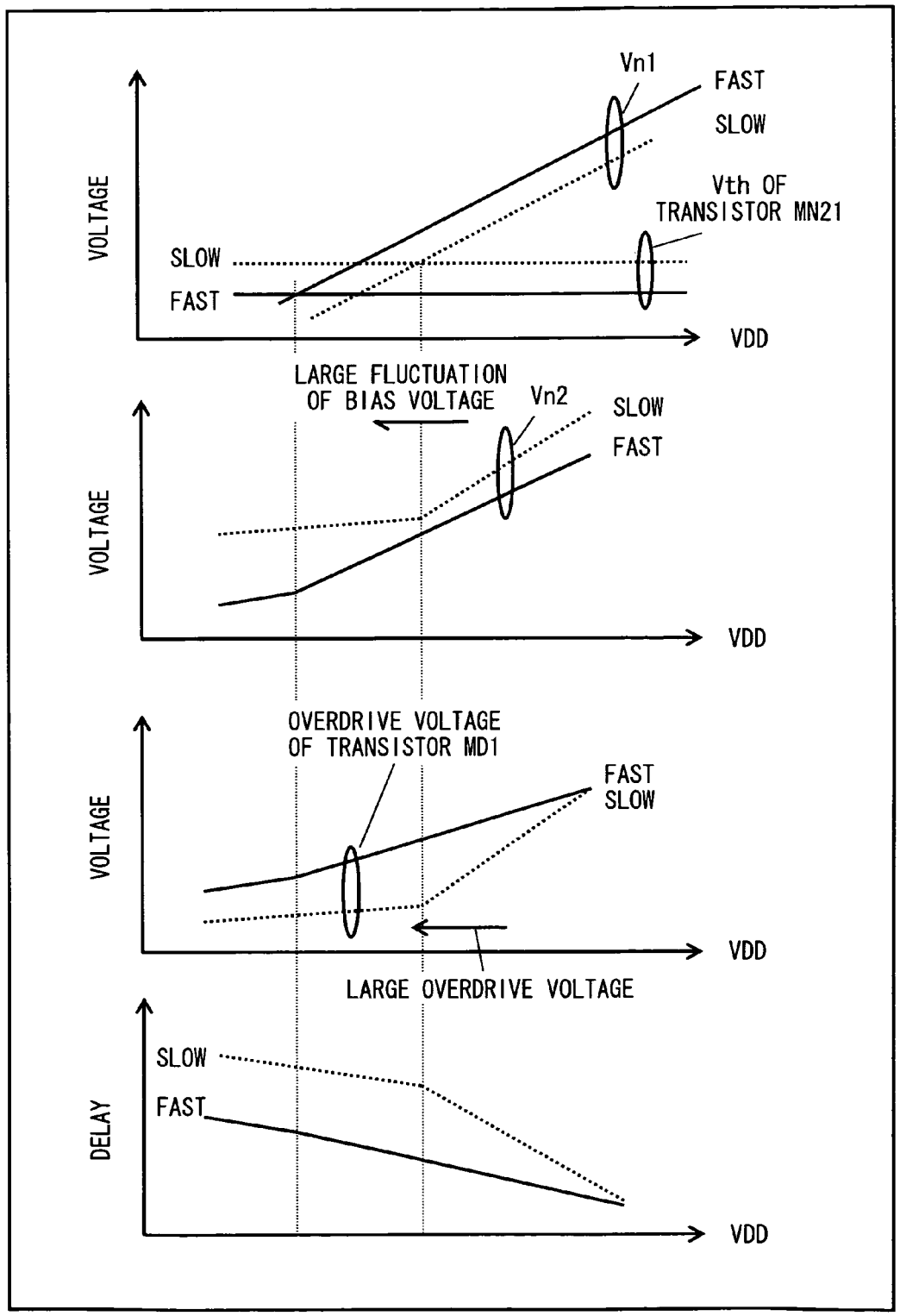
FIG. 12 shows an operating waveform of a delay circuit according to a third embodiment of the present invention.

The bias generating unit 20 shown in FIG. 2B will be described by way of example. Referring to FIG. 12, when the power supply voltage VDD decreases, the reference voltage Vn1, the bias voltage Vn2, and the overdrive voltage of the transistor MD1 decrease. Accordingly, the amount of delay to be added to the input signal tends to increase. At this time, the bias generating unit 20 cannot completely compensate for variation components. Specifically, when the power supply voltage VDD decreases, a fluctuation of the bias voltage Vn2 relatively increases. Accordingly, a fluctuation of the drain current of the transistor MD1 also relatively increases, with the result that a delay variation increases. To solve such a problem, the transistor MN21 is designed to easily operate in the linear region when the power supply voltage VDD decreases. As a result, when the power supply voltage VDD is low and in the Slow condition, the transistor MN21 easily operates in the linear region. When the transistor MN21 operates in the linear region, the bias voltage Vn2 rises and the overdrive voltage of the transistor MD1 increases. Accordingly, the amount of delay to be added to the input signal decreases. That is, the amount of delay which is excessively increased in the Slow condition can be reduced.

The present invention is not limited to the first to third embodiments described above, but can be modified as appropriate without departing from the scope of the present invention. For example, each of the first to third embodiments has exemplified the case where the delay circuit includes two bias generating units, but the present invention is not limited thereto. For example, a circuit configuration may be employed in which the delay circuit includes a single bias generating unit. In this case, the delay generating unit needs to have a circuit configuration in which a drive current with a small fluctuation is supplied by the bias voltage from the bias generating unit. Another circuit configuration may be employed in which the delay circuit includes a single bias generating unit and a single current mirror circuit. In this case, the bias generating unit generates one of the bias voltages (for example, Vp2), and the current mirror circuit generates the other bias voltage (for example, Vn2).

As described above, the bias generating unit (control voltage generating circuit) 20 which is applied to the delay circuits according to the first to third embodiments can generate the control voltage Vn2 having a voltage level depending on the fluctuation of the threshold voltage of each N-channel MOS transistor, with high accuracy. Thus, the constant current source circuit including the bias generating unit 20 and the transistor MD1 can generate a stable constant current even when the threshold voltage of each N-channel MOS transistor fluctuates. As a result, the delay circuit is driven by the stable constant current, which allows addition of a delay with high accuracy to the external input signal.

Similarly, the bias generating unit (control voltage generating circuit) 10 which is applied to the delay circuits according to the first to third embodiments can generate the control voltage Vp2 having a voltage level depending on the fluctuation of the threshold voltage of each P-channel MOS transistor, with high accuracy. Accordingly, the constant current source circuit including the control voltage generating circuit 10 and the transistor MD2 can generate a stable constant current even when the threshold voltage of each P-channel MOS transistor fluctuates. As a result, the delay circuit is driven by the stable constant current, which allows addition of a delay with high accuracy to the external input signal.

The first embodiment has exemplified the case where the gates of the transistors MP11 and MP12 constituting the reference voltage generating unit 11 are each supplied with the ground voltage GND, but the present invention is not limited thereto. The reference voltage generating unit 11 may have a circuit configuration for generating the reference voltage Vp1 so that the gate-source voltage of a P-channel MOS transistor at a subsequent stage decreases with an increase in the threshold voltage of the P-channel MOS transistor due to process variations. In the above description, the reference voltage Vp1 having such a characteristic is referred to as the reference voltage Vp1 having a reverse characteristic (negative characteristic) with respect to a fluctuation of the threshold voltage of the P-channel MOS transistor. If this condition is satisfied, a circuit configuration may be employed in which the transistors MP11 and MP12 are diode-connected, for example. Thus, the gates of the transistors MP11 and MP12 are supplied with one of the ground voltage GND and an internal node potential. This holds true for the other embodiments.

The first embodiment has exemplified the case where the gates of the transistors MP21 and MP22, which constitute the voltage conversion unit 12, are supplied with one of the ground voltage GND and the reference voltage Vp1, but the present invention is not limited thereto. The voltage conversion unit 12 may have a circuit configuration in which the control voltage Vp2 is generated based on the reference voltage Vp1 so that the gate-source voltage of the P-channel MOS transistor (MD2) at the subsequent stage increases with an increase in the threshold voltage of the P-channel MOS transistor. In the above description, the control voltage Vp2 having such a characteristic is referred to as the control voltage Vp2 having a forward characteristic (positive characteristic) with respect to a fluctuation of the threshold voltage of the P-channel MOS transistor. If this condition is satisfied, a circuit configuration may be employed in which one of the transistors MP21 and MP22 is diode-connected, for example. Thus, the gate of one of the transistors MP21 and MP22 is supplied with the reference voltage Vp1, and the gate of the other transistor is supplied with one of the ground voltage GND and the internal node potential. This holds true for the other embodiments.

The first embodiment has exemplified the case where the gates of the transistors MN11 and MN12, which constitute the reference voltage generating unit 21, are each supplied with the power supply voltage VDD, but the present invention is not limited thereto. The reference voltage generating unit 21 may have a circuit configuration in which the reference voltage Vn1 is generated so that the gate-source voltage of the N-channel MOS transistor at the subsequent state decreases with an increase in the threshold voltage of the N-channel MOS transistor due to process variations. In the above description, the reference voltage Vn1 having such a characteristic is referred to as the reference voltage Vn1 having a reverse characteristic (negative characteristic) with respect to a fluctuation of the threshold voltage of the N-channel MOS transistor. If this condition is satisfied, a circuit configuration may be employed in which the transistors MN11 and MN12 are diode-connected, for example. Thus, the gates of the transistors MN11 and MN12 are supplied with one of the power supply voltage VDD and the internal node potential. This holds true for the other embodiments.

Moreover, the first embodiment has exemplified the case where the gates of the transistors MN21 and MN22, which constitute the voltage conversion unit 22, are supplied with one of the power supply voltage VDD and the reference voltage Vn1, but the present invention is not limited thereto. The voltage conversion unit 22 may have a circuit configuration in which the control voltage Vn2 is generated based on the reference voltage Vn1 so that the gate-source voltage of the N-channel MOS transistor (MD1) at the subsequent stage increases with an increase in the threshold voltage of the N-channel MOS transistor. In the above description, the control voltage Vn2 having such a characteristic is referred to as the control voltage Vn2 having a forward characteristic (positive characteristic) with respect to a fluctuation of the threshold voltage of the M-channel MOS transistor. If this condition is satisfied, a circuit configuration may be employed in which one of the transistors MN21 and MN22 is diode-connected, for example. Thus, one of the gates of the transistors MN21 and MN22 is supplied with the reference voltage Vn1, and the gate of the other transistor is supplied with one of the power supply voltage VDD and the internal node potential. This holds true for the other embodiments.

The reference voltage generating unit is also referred to as a reference voltage generating circuit. The voltage conversion unit is also referred to as a voltage conversion circuit. The bias generating unit is also referred to as a control voltage generating circuit. A bias voltage (for example, bias voltage Vp2, Vn2) generated by the bias generating unit is also referred to as a control voltage (for example, control voltage Vp2, Vn2).

Each of the plurality of transistors (for example, transistors MP11, MP12, MP13, MN11, MN12, and MN13) provided in the reference voltage generating unit is also referred to as a first transistor. Each of the plurality of transistors (for example, transistors MP21, MP22, MP23, MN21, MN22, and MN23) provided in the voltage conversion unit is also referred to as a second transistor. When the gates of at least two of the plurality of first transistors provided in the reference voltage generating unit are connected to the power supply voltage VDD or the ground voltage GND in a fixed manner, at least one of the first transistors is allowed to linearly operate. The linear operation of each first transistor is carried out in the manner as described above.

Each of the transistors for constant current (for example, transistors MD1 and MD2) is also referred to as a third transistor. The number of the transistors for constant current, which constitute the constant current source circuit together with the control voltage generating circuit, is not limited to one, and a plurality of transistors for constant current may be provided.

The high potential side power supply terminal is supplied with a power supply voltage (for example, power supply voltage VDD) from a first power supply. The low potential side power supply terminal is supplied with a power supply voltage (for example, ground voltage GND) from a second power supply. The power supply terminal for back gate is supplied with a power supply voltage (for example, power supply voltage Vbg) from a third power supply.

The input signal A illustrated in FIG. 8 is also referred to as a first signal. The internal signal U illustrated in FIG. 8 is also referred to as a second signal.

Next, differences between the present invention and the related art will be described. It is considered that the constant current sources disclosed in Japanese Unexamined Patent Application Publication Nos. 05-268009 and 2005-117442 convert a control voltage generated by a diode or the like into a constant current. This diode has a large circuit size, which results in an increase in the entire circuit size of the constant current sources. On the other hand, the control voltage generating circuit according to the present invention includes no diode or the like and includes only a plurality of MOS transistors, thereby suppressing an increase in the circuit size.

Further, the constant current source disclosed in Japanese Unexamined Patent Application Publication No. 05-268009 supplies a control voltage to a plurality of current control type CMOS inverters. Accordingly, when the current control type CMOS inverters are randomly arranged, a large wiring resource is required. On the other hand, the control voltage generating circuit according to the present invention does not pose such a problem.

The circuits disclosed in Japanese Unexamined Patent Application Publication Nos. 11-168362 and 2000-59184 include a voltage generating unit (control voltage generating circuit) in which P-channel MOS transistors and N-channel MOS transistors are mixed. However, the P-channel MOS transistors and the N-channel MOS transistors may have different process variations. Accordingly, there is a possibility that the voltage generating units cannot generate an intended voltage (control voltage) with high accuracy. On the other hand, the control voltage generating circuit according to the present invention, which includes a plurality of MOS transistors of the same conductivity type, does not pose such a problem.

The circuits disclosed in Japanese Unexamined Patent Application Publication Nos. 09-270692 and 2001-285046 include a voltage generating unit (control voltage generating circuit) including a MOS transistor and a resistor. However, a large area is occupied by the resistor, which results in an increase in the circuit area. On the other hand, the control voltage generating circuit according to the present invention includes no resistor element and includes only a plurality of MOS transistors, thereby suppressing an increase in the circuit size.

In this manner, compared with the related arts, the control voltage generating circuit according to the present invention can generate the control voltage according to the threshold voltage of each transistor with high accuracy, while suppressing an increase in the circuit size.

Fourth Embodiment

The control voltage generating circuit according to the present invention and the constant current source circuit including the same are not limited to those of the delay circuit described above, but may be applied to other circuits such as an OR circuit, a NAND circuit, or a composite gate circuit.

Figure 15A:
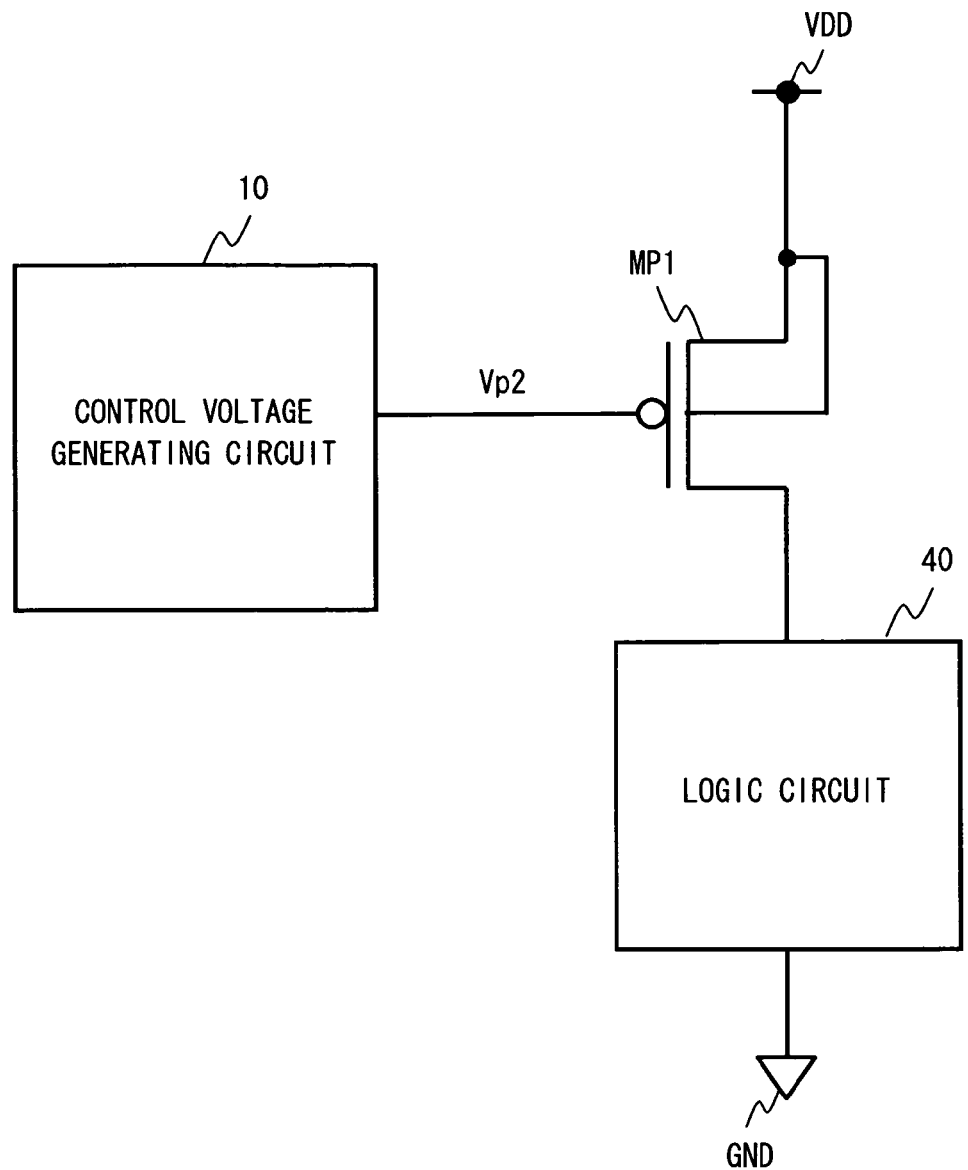
FIG. 15A is a block diagram of a typical logic circuit to which the constant current source circuit of the present invention is applied.

FIG. 15A is a block diagram showing a configuration in which a constant current source including the control voltage generating circuit 10 and a transistor MP1 is applied to a typical logic circuit 40. As described above, the control voltage generating circuit 10 includes a plurality of P-channel MOS transistors, and generates the control voltage Vp2 having a forward characteristic with respect to the threshold voltage of the P-channel MOS transistor. The P-channel transistor MP1 is provided between the high potential side power supply terminal VDD and the high potential side terminal of the logic circuit 40, and allows a stable constant current to flow from the high potential side power supply terminal VDD to the logic circuit 40 based on the control voltage Vp2. This allows the logic circuit 40 to make a transition of a rise of the internal signal constant, for example, even when the threshold voltage of the transistor fluctuates due to process variations. As a result, the logic circuit 40 can achieve a desired operation even when the threshold voltage of the transistor fluctuates due to process variations.

Figure 15B:
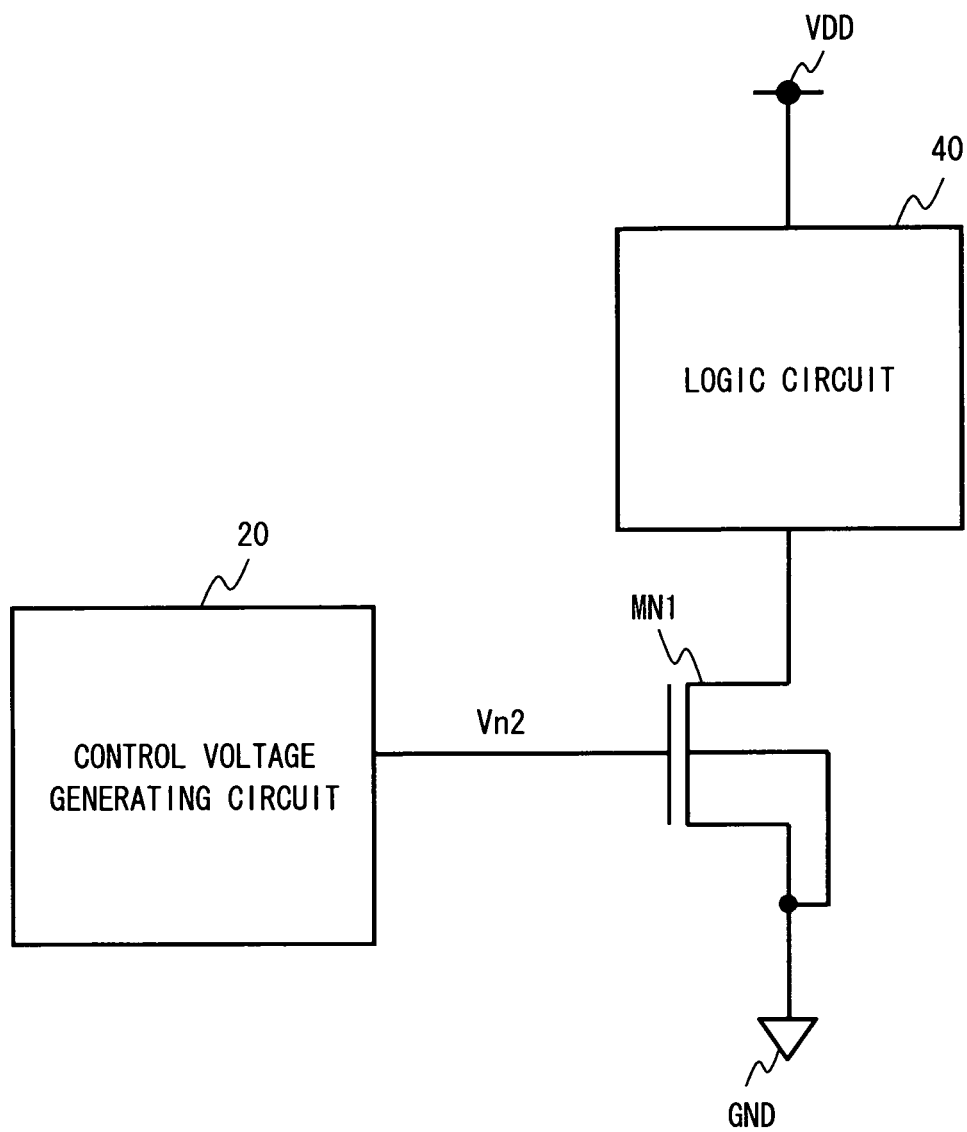
FIG. 15B is a block diagram of a typical logic circuit to which the constant current source circuit of the present invention is applied.

FIG. 15B is a block diagram showing a configuration in which a constant current source circuit including the control voltage generating circuit 20 and a transistor MN1 is applied to the typical logic circuit 40. As described above, the control voltage generating circuit 20 includes a plurality of N-channel MOS transistors, and generates the control voltage Vn2 having a forward characteristic with respect to the threshold voltage of the N-channel MOS transistor. The N-channel transistor MN1 is provided between the low potential side power supply terminal GND and the low-potential side terminal of the logic circuit 40, and allows a stable constant current to flow from the logic circuit 40 to the low potential side power supply terminal GND based on the control voltage Vn2. This allows the logic circuit 40 to make a transition of a fall of the internal signal constant, for example, even when the threshold voltage of the transistor fluctuates due to process variations. As a result, the logic circuit 40 can achieve a desired operation even when the threshold voltage of the transistor fluctuates due to process variations.

Figure 16A:
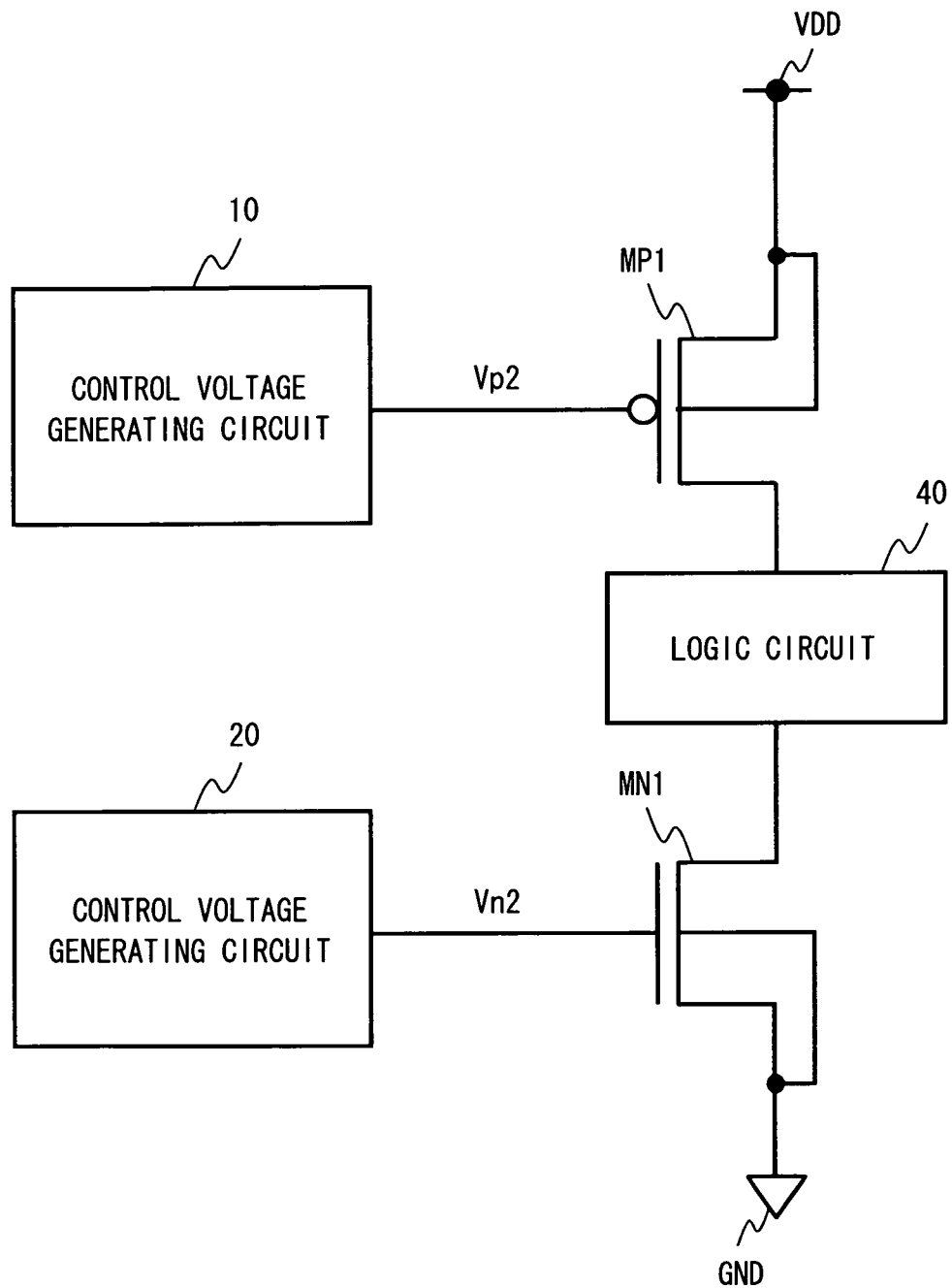
FIG. 16A is a block diagram of a typical logic circuit to which the constant current source circuit of the present invention is applied.

FIG. 16A is a block diagram showing a configuration in which a constant current source circuit including the control voltage generating circuit 10 and the transistor MP1 and a current source circuit including the control voltage generating circuit 20 and the transistor MN1 are applied to the typical logic circuit 40. The details of the circuit configuration are similar to those shown in FIGS. 15A and 15B, so the description thereof is omitted. Even when the threshold voltage of each transistor fluctuates due to process variations, the logic circuit 40 can make a transition of a rise and a fall of the internal signal constant, for example. As a result, even when the threshold voltage of each transistor fluctuates due to process variations, the logic circuit 40 can achieve a desired operation.

Figure 16B:
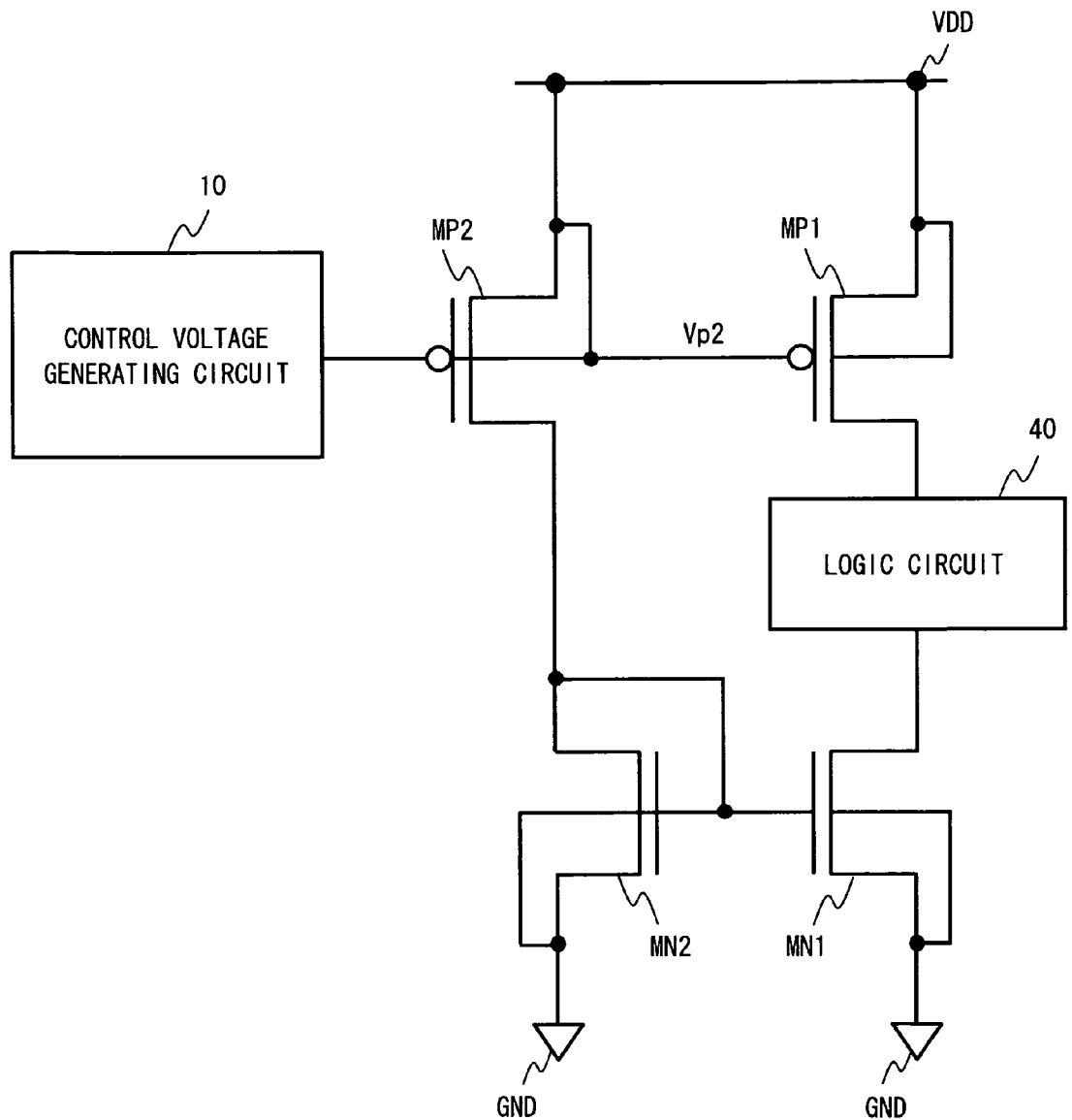
FIG. 16B is a block diagram of a typical logic circuit to which the constant current source circuit of the present invention is applied.

FIG. 16B is a block diagram showing a configuration in which a combination of the control voltage generating circuit 10 and a current mirror circuit is applied to the typical logic circuit 40. As shown in FIG. 16B, a P-channel transistor MP2 and an N-channel transistor MN2 are connected in series between the high potential side power supply terminal VDD and the low potential side power supply terminal GND. The transistor MP2 causes a stable constant current to flow between the source and the drain based on the control voltage Vp2, in the same manner as the transistor MP1. As a result, a stable constant current also flows between the source and the drain of the transistor MN2. The gates of the transistors MN1 and MN2 are each connected to the drain of the transistor MP2. Thus, a stable constant current flows between the source and the drain of the transistor MN1 according to the current flowing between the source and the drain of the transistor MN2.

This allows the logic circuit 40 to make a transition of a rise and a fall of the internal signal constant, for example, even when the threshold voltage of each transistor fluctuates due to process variations. As a result, the logic circuit 40 can achieve a desired operation even when the threshold voltage of each transistor fluctuates due to process variations.

The fourth embodiment has exemplified the case where the constant current source circuit including the control voltage generating circuit and transistors is applied to a typical logic circuit, but the present invention is not limited thereto.

Figure 17:
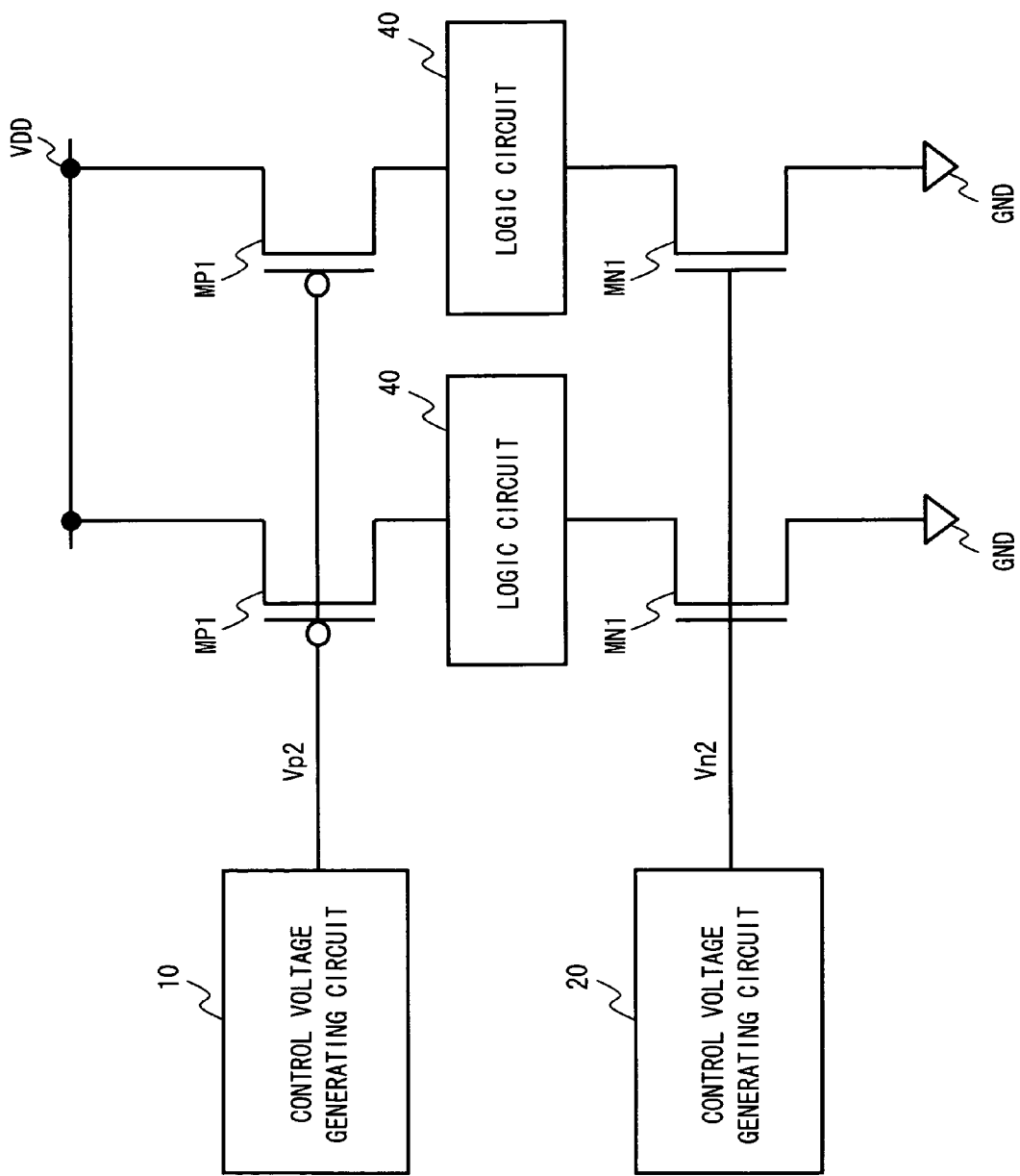
FIG. 17 is block diagram of a typical logic circuit to which the constant current source circuit of the present invention is applied.

As shown in FIG. 17, the control voltage generated by the control voltage generating circuit may be shared by the plurality of logic circuits 40.

Fifth Embodiment

A fifth embodiment exemplifies a configuration in which a control voltage generating circuit according to the present invention and a plurality of logic circuits including the circuit configuration are each designed as a functional block, and layout wiring information on each functional block is preliminarily registered in a library so as to facilitate the design. Each of these functional blocks is generally referred to as a standard cell (basic cell). These standard cells of the functional blocks have the same cell height. In the standard cells of the functional blocks, boundaries between each N-well and each P-well are positioned at regular intervals in a height direction. In the standard cells aligned in a width direction during the layout process, common power supply lines (power supply lines for the high-potential side power supply VDD and the low-potential side power supply GND) are used.

Figure 18:
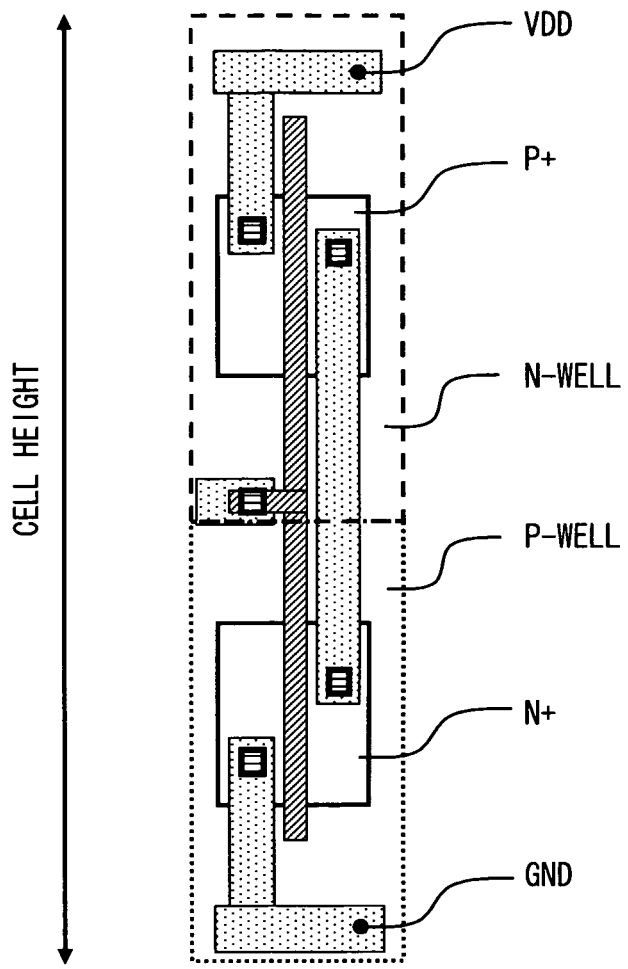
FIG. 18 shows a layout pattern of a typical standard cell.
Figure 19:
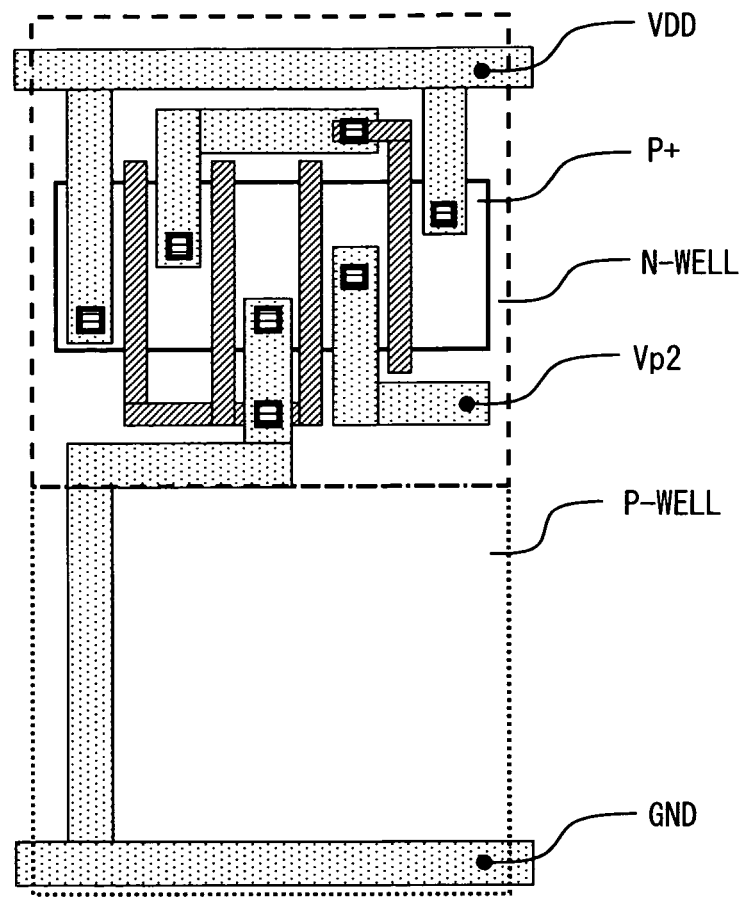
FIG. 19 shows a layout pattern of a standard cell according to the present invention.
Figure 20:
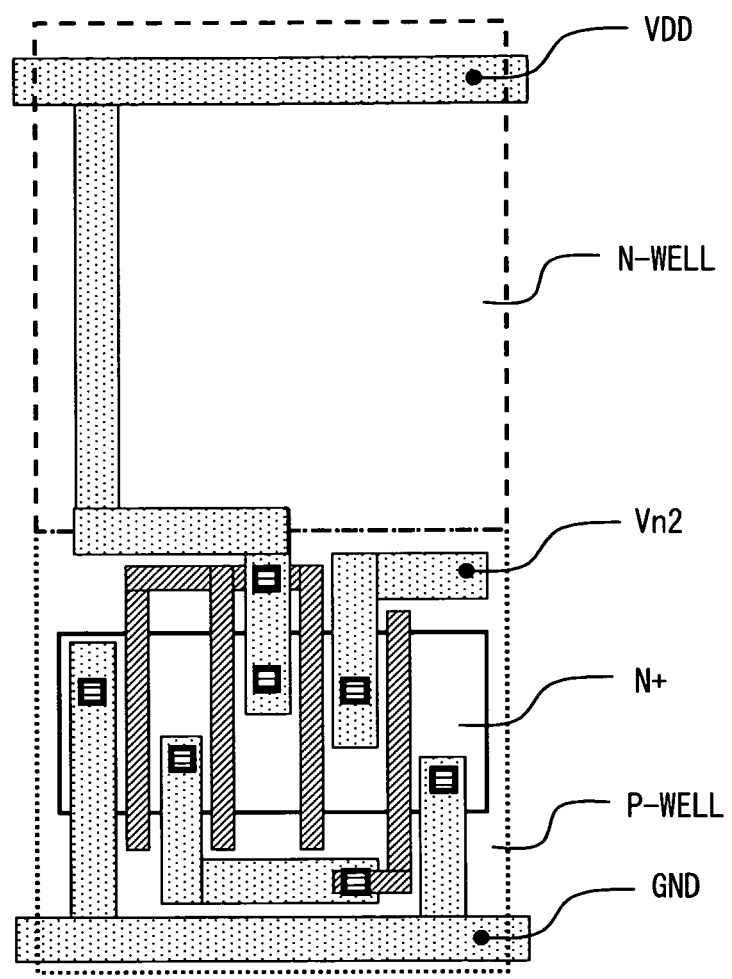
FIG. 20 shows a layout pattern of a standard cell according to the present invention.
Figure 21:
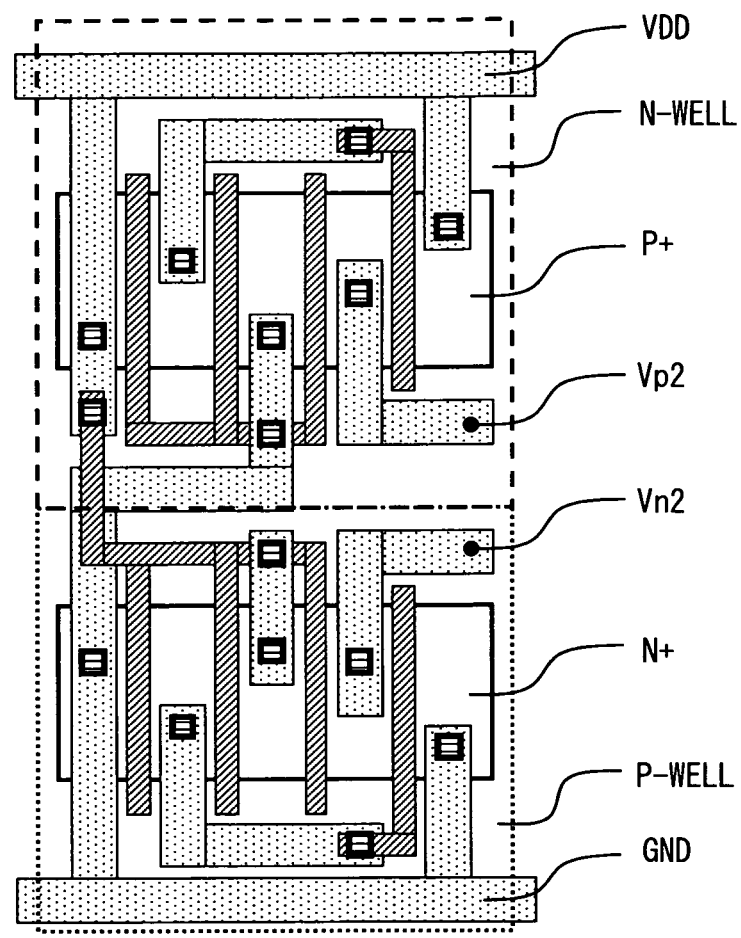
FIG. 21 shows a layout pattern of a standard cell according to the present invention.
Figure 22:
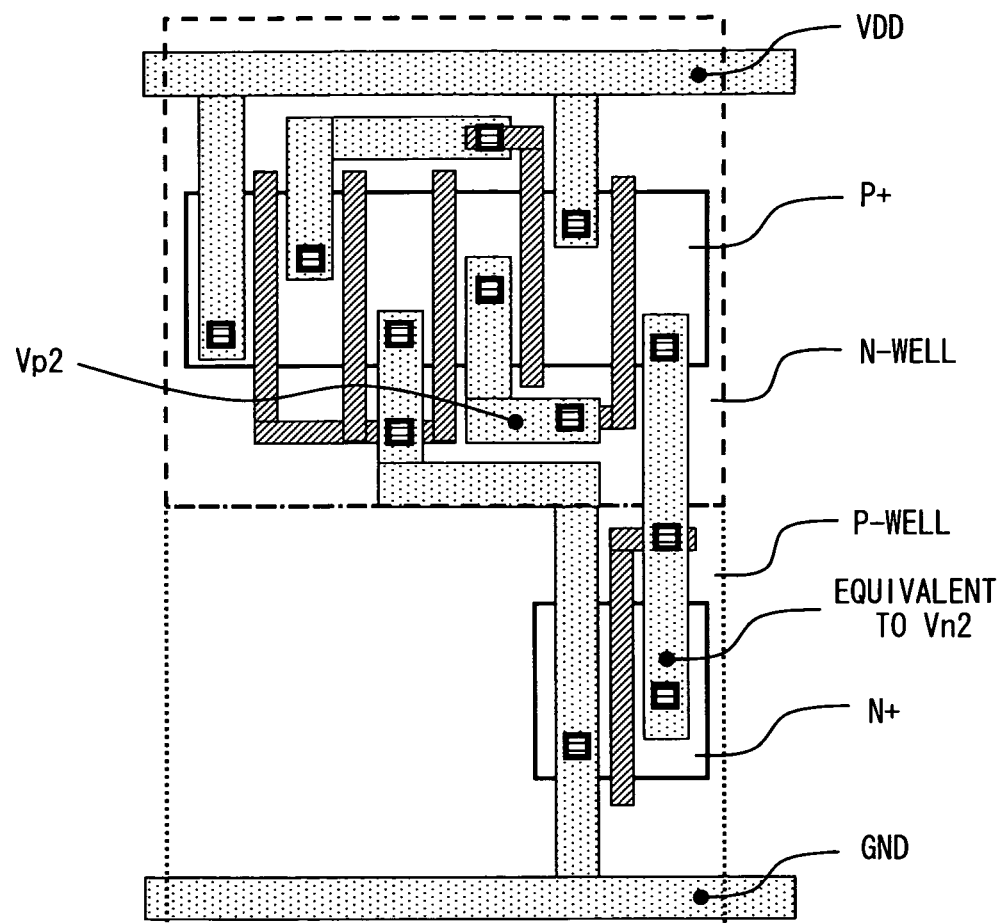
FIG. 22 shows a layout pattern of a standard cell according to the present invention.

FIG. 18 shows a layout pattern of a standard cell of a typical inverter for comparison with the present invention. FIG. 19 shows a layout pattern of the standard cell of the control voltage generating circuit 10. FIG. 20 shows a layout pattern of the standard cell of the control voltage generating circuit 20. FIG. 21 shows a layout pattern of the standard cell including a combination of the control voltage generating circuits 10 and 20. FIG. 22 shows a layout pattern of the standard cell including a combination of the control voltage generating circuit 10 and a current mirror circuit (see FIG. 16B). The standard cells shown in FIGS. 19 to 22 have the same cell height as that of the inverter shown in FIG. 18. As in the standard cell shown in FIG. 18, the power supply lines of the standard cells shown in FIGS. 19 to 22 are formed to be connected to the power supply lines of the standard cells arranged to be adjacent to each other in the width direction during the layout process.

Figure 23A:
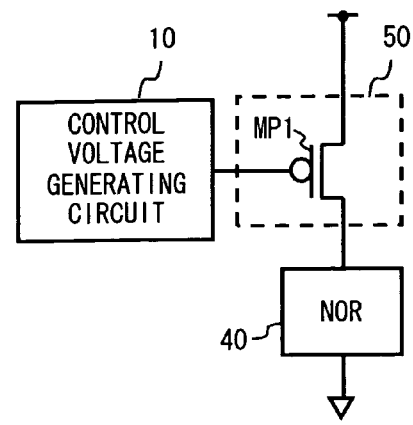
FIG. 23A is a block diagram of a typical logic circuit to which the constant current source circuit of the present invention is applied.
Figure 23B:
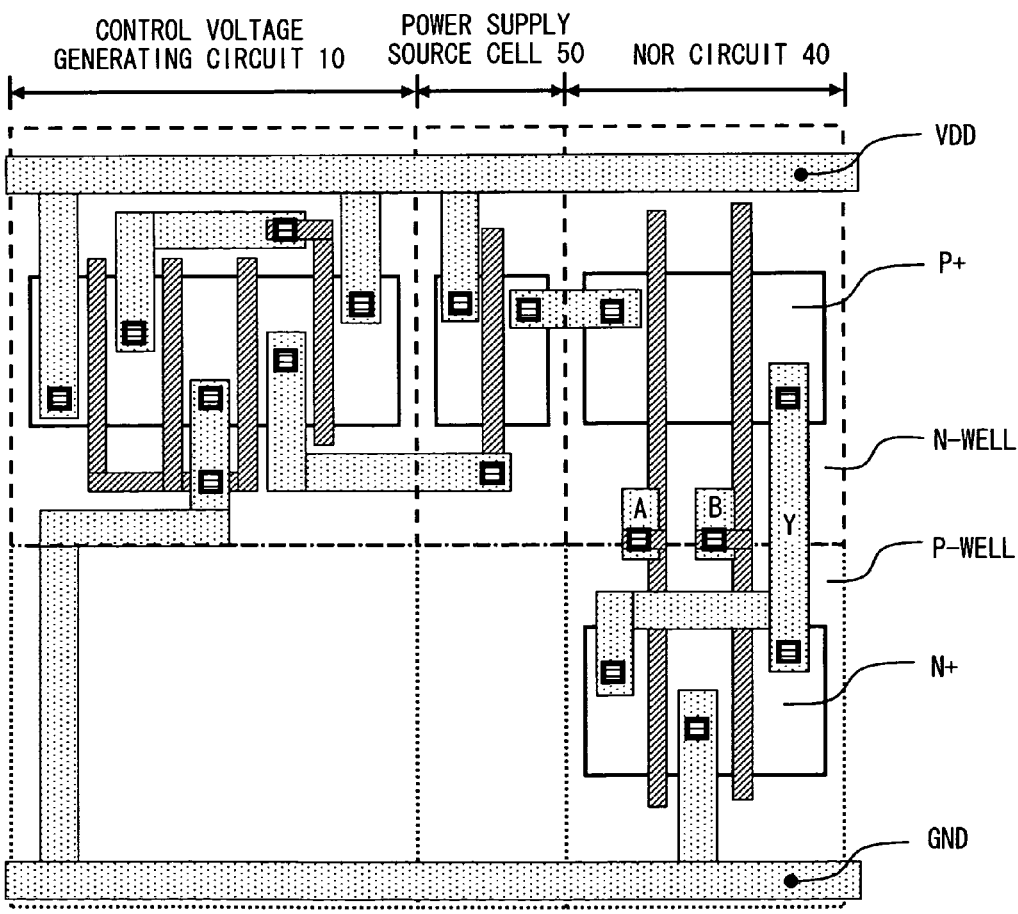
FIG. 23B shows a layout pattern of a standard cell according to the present invention.

FIG. 23A is a block diagram showing a configuration in which a constant current source circuit including the control voltage generating circuit 10 and the transistor MP1 is applied to a NOR circuit 40 which is a typical logic circuit (see FIG. 15A). FIG. 23B shows a layout pattern of the circuit shown in FIG. 23A. A current source cell 50 is a standard cell including the transistor MP1. As shown in FIG. 23B, the standard cells of the control voltage generating circuit 10, the current source cell 50, and the NOR circuit 40 are arranged in this order from left to right of FIG. 23A.

Figure 24A:
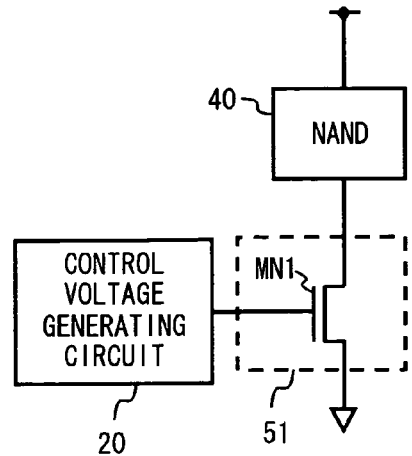
FIG. 24A is a block diagram of a typical logic circuit to which the constant current source circuit of the present invention is applied.
Figure 24B:
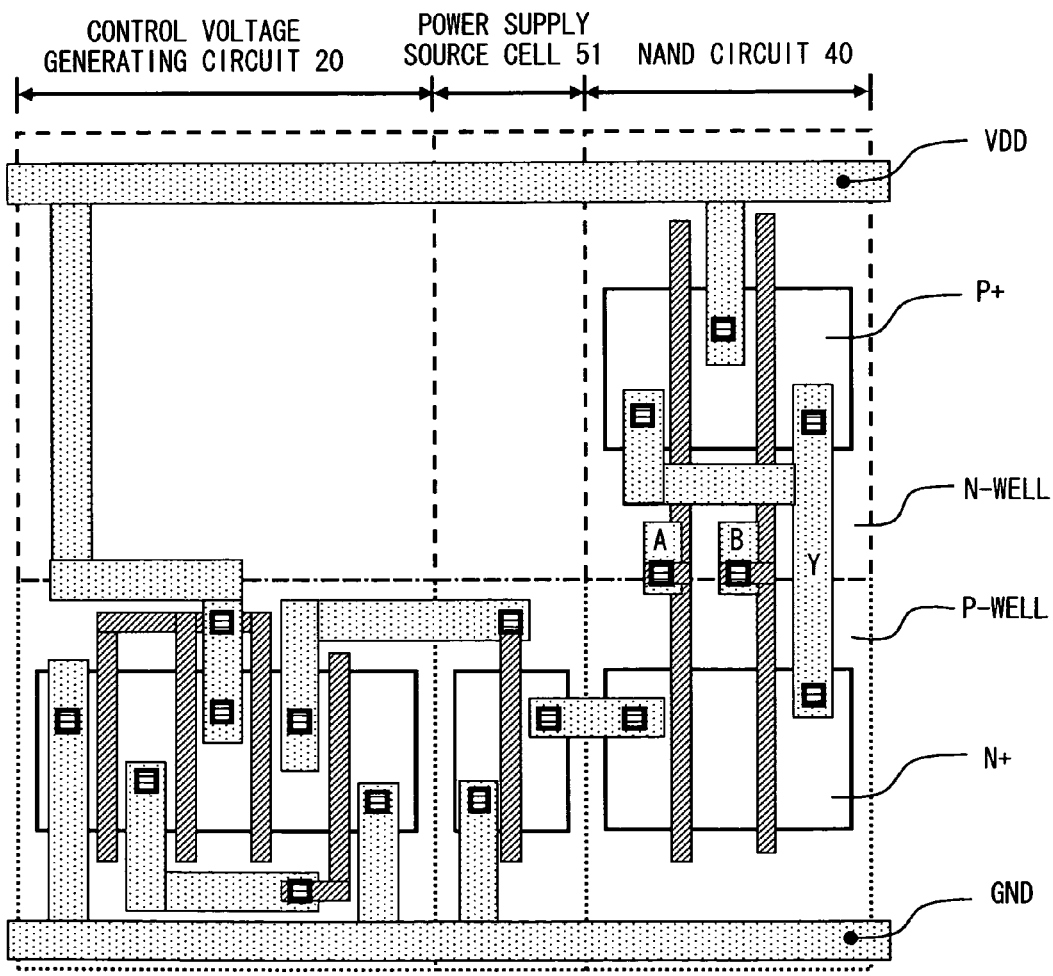
FIG. 24B shows a layout pattern of a standard cell according to the present invention.

FIG. 24A is a block diagram showing a configuration in which a constant current source circuit including the control voltage generating circuit 20 and the transistor MN1 is applied to a NAND circuit 40 which is a typical logic circuit (see FIG. 15B). FIG. 24B shows a layout pattern of the circuit shown in FIG. 24A. A current source cell 51 is a standard cell including the transistor MN1. As shown in FIG. 24B, the standard cell including the control voltage generating circuit 20, the current source cell 51, and the NAND circuit 40 are arranged in this order from left to right of FIG. 24B.

As shown in FIGS. 23B and 24B, each standard cell including the control voltage generating circuit and the current source cell of the present invention may be arranged in the width direction together with a standard cell of a typical logic circuit. That is, each standard cell including the control voltage generating circuit and the current source cell of the present invention may be formed together with standard cells of the related art. Therefore, as described with reference to FIG. 13, the present invention can be applied without greatly changing the chip production process of the related art.

Figure 25A:
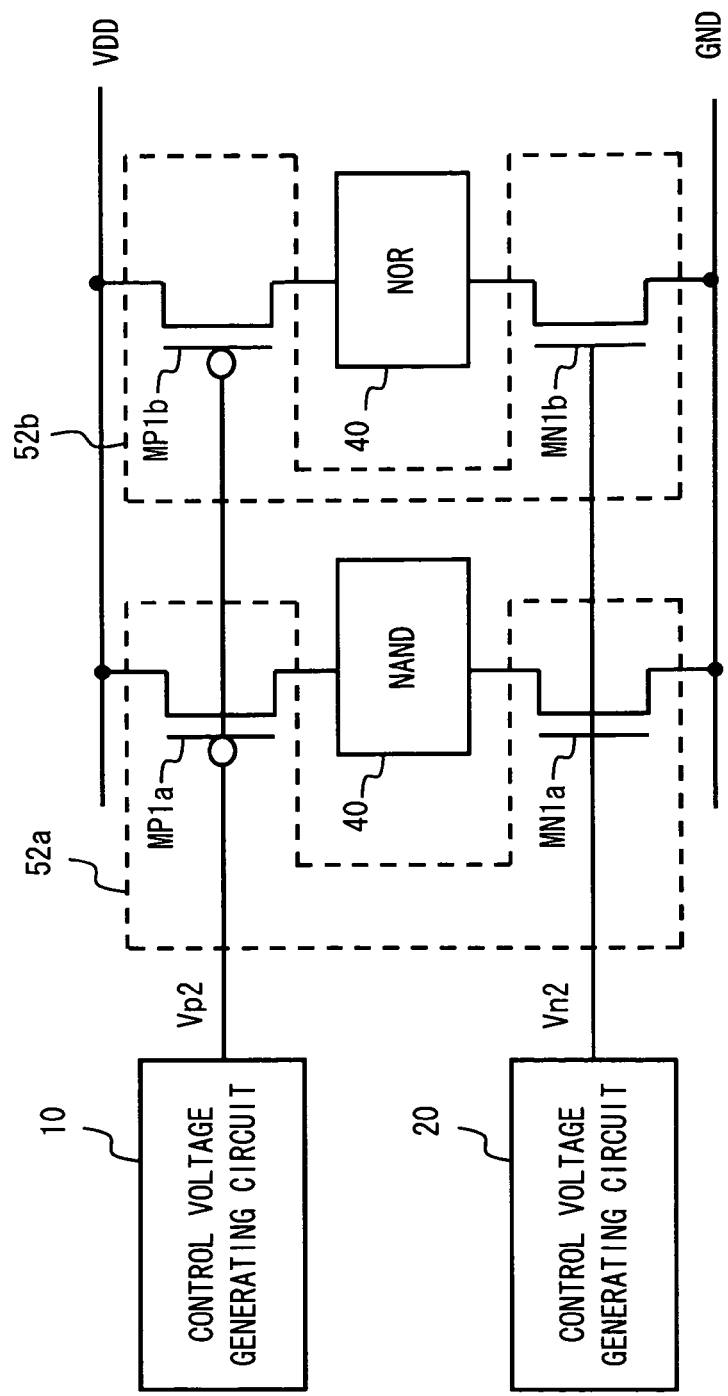
FIG. 25A is a block diagram of a typical logic circuit to which a constant current source circuit of the present invention which is applied.

FIG. 25A is a block diagram showing a circuit configuration in which the control voltage generated by the control voltage generating circuit is shared by the plurality of logic circuits 40 (a specific example of FIG. 17). More specifically, a current source circuit including the control voltage generating circuit 10 and a transistor MP1*a* and a constant current source circuit including the control voltage generating circuit 20 and a transistor MN1*a* are applied to the NAND circuit 40 which is a typical logic circuit. Further, a constant current source circuit including the control voltage generating circuit 10 and a transistor MP1*b* and a constant current source circuit including the control voltage generating circuit 20 and a transistor MN are applied to the NOR circuit 40 which is a typical logic circuit.

Figure 25B:
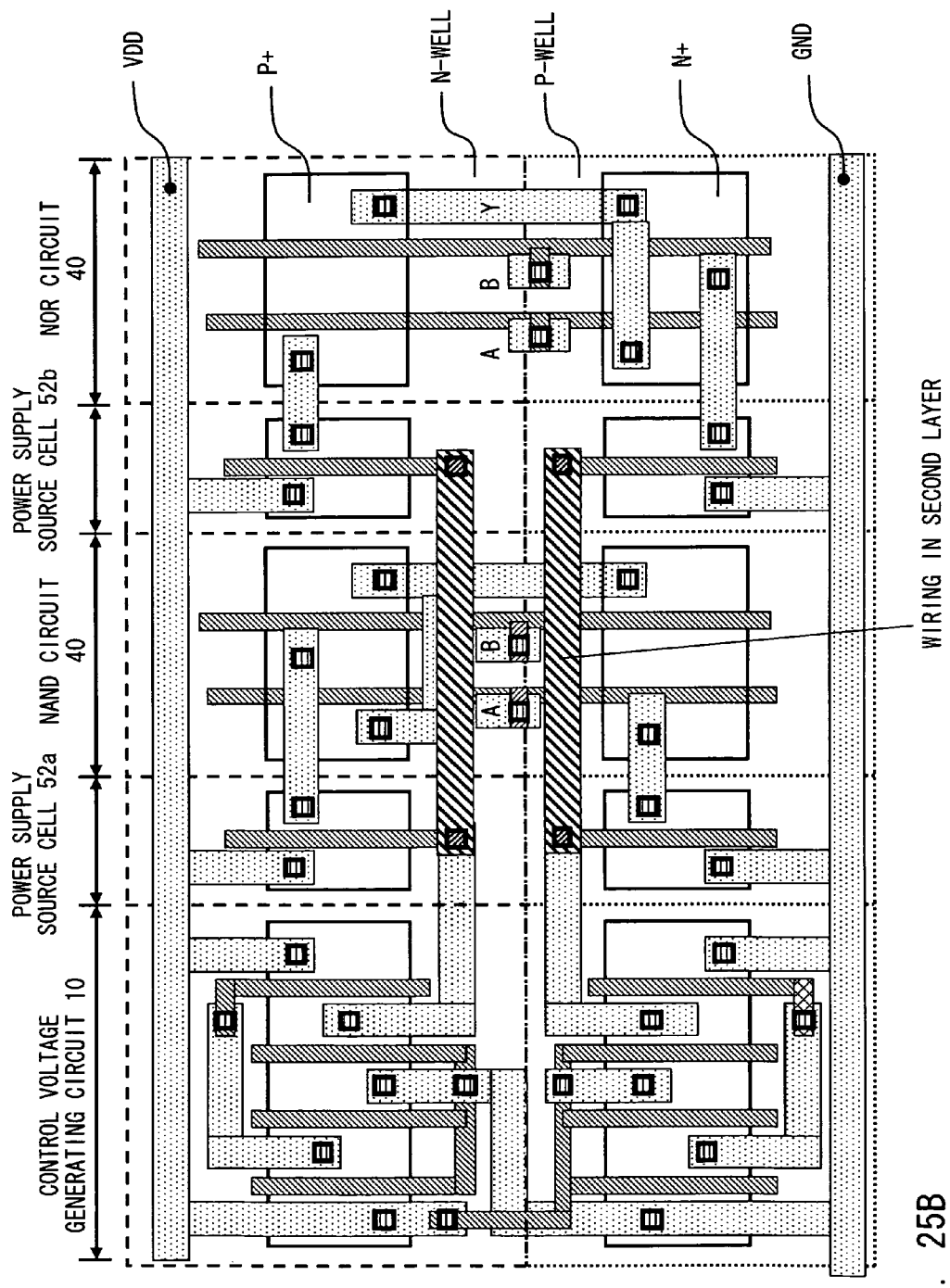
FIG. 25B shows a layout pattern of a standard cell according to the present invention.

FIG. 25B shows a layout pattern of the circuit shown in FIG. 25A. A current source cell 52*a* is a standard cell including the transistors MP1*a* and MN1*a*, and a current source cell 52*b* is a standard cell including the transistors MP1*b* and MN1*b*. As shown in FIG. 25B, the standard cells of the control voltage generating circuit 10, the current source cell 52*a*, the NAND circuit 40, the current source cell 52*b*, and the NOR circuit 40 are arranged in this order from left to right of FIG. 25B. Thus, the control voltage generated by the control voltage generating circuit is shared by the plurality of logic circuits (the NAND circuit and the NOR circuit are used in this case) 40, thereby enabling a reduction in the circuit area.

Figure 26:
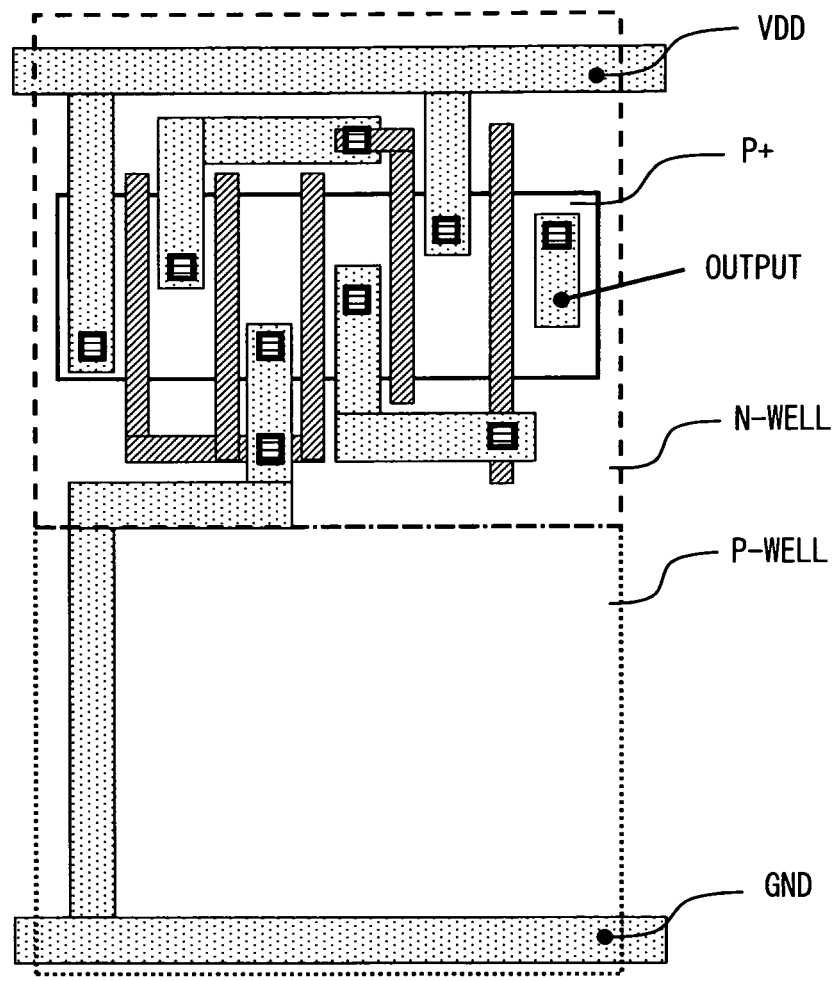
FIG. 26 shows a layout pattern of a standard cell according to the present invention.
Figure 27:
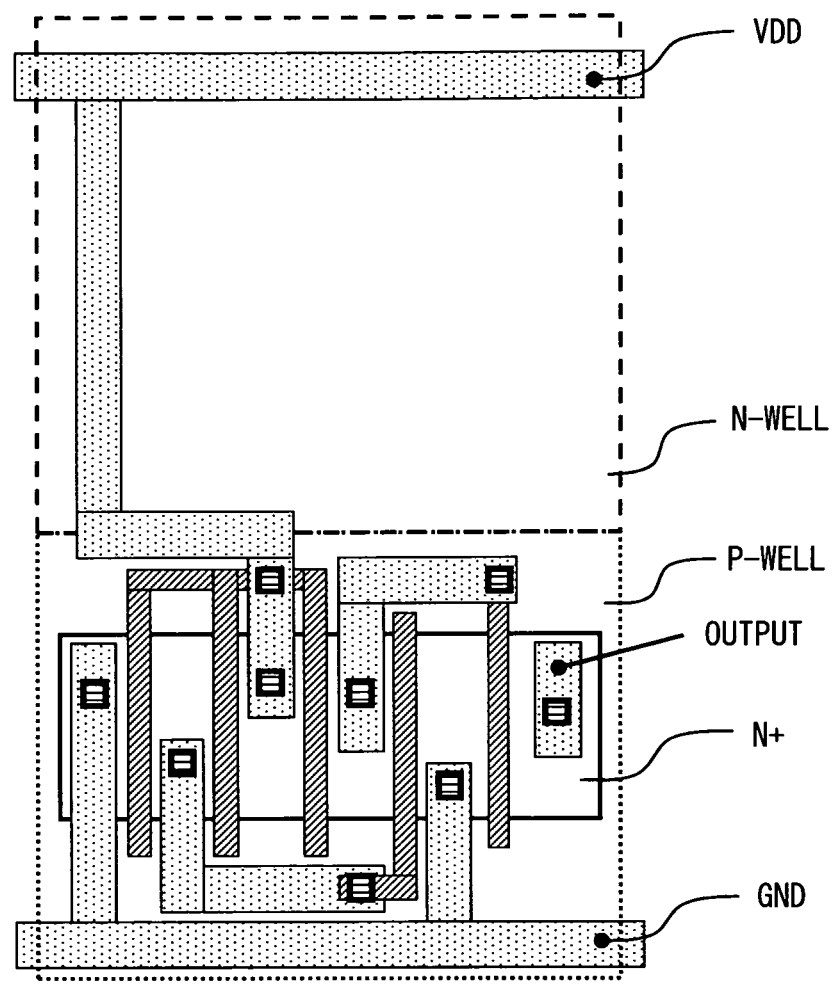
FIG. 27 shows a layout pattern of a standard cell according to the present invention.
Figure 28:
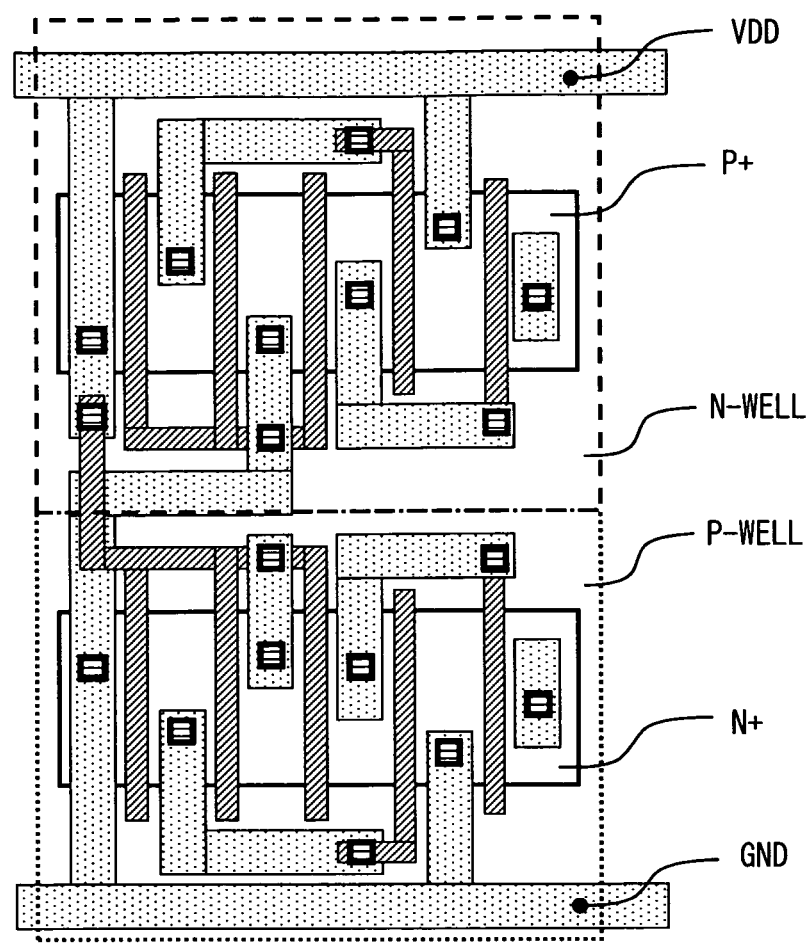
FIG. 28 shows a layout pattern of a standard cell according to the present invention.

FIG. 26 shows a layout pattern of a standard cell including a combination of the control voltage generating circuit 10 and the transistor MP1. FIG. 27 shows a layout pattern of a standard cell including a combination of the control voltage generating circuit 20 and the transistor MN1. FIG. 28 shows a layout pattern of a standard cell including a combination of the control voltage generating circuits 10 and 20 and the transistors MP1 and MN2. As shown in FIGS. 26 to 28, a single standard cell is formed by combining control voltage generating circuits and current converting transistors (the transistors MP1 and MN1 are used in this case), thereby enabling a reduction in the circuit area as compared with the case where standard cells are separately formed.

Figure 29:
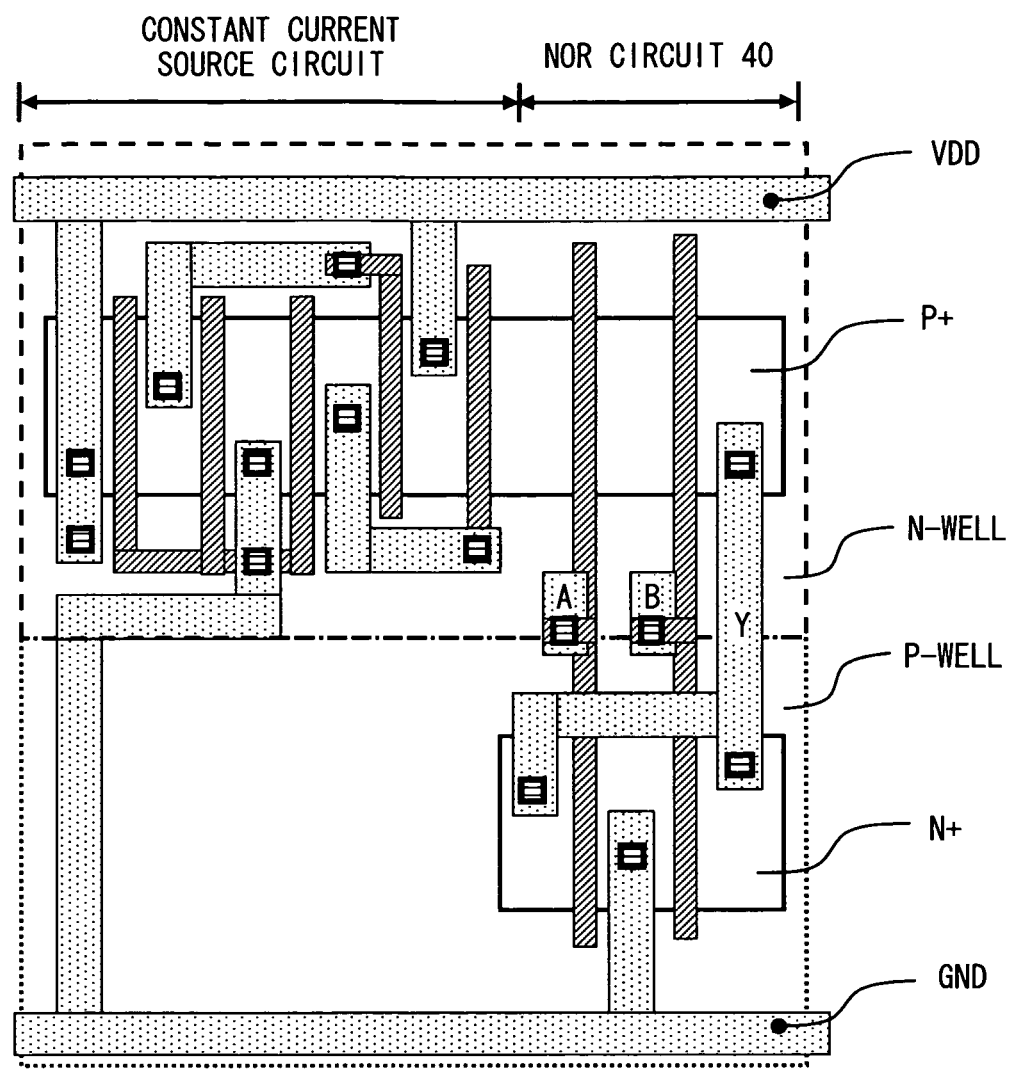
FIG. 29 shows a layout pattern of a standard cell according to the present invention.

FIG. 29 shows a layout pattern of a standard cell including a combination of the control voltage generating circuit 10, the transistor MP1, and the NOR circuit 40 (see FIG. 15A). As shown in FIG. 29, a single standard cell is formed by combining the control voltage generating circuit 10, the transistor MP1, and the NOR circuit 40, thereby enabling a reduction in the circuit area as compared with the case where standard cells are separately formed.

Figure 30:
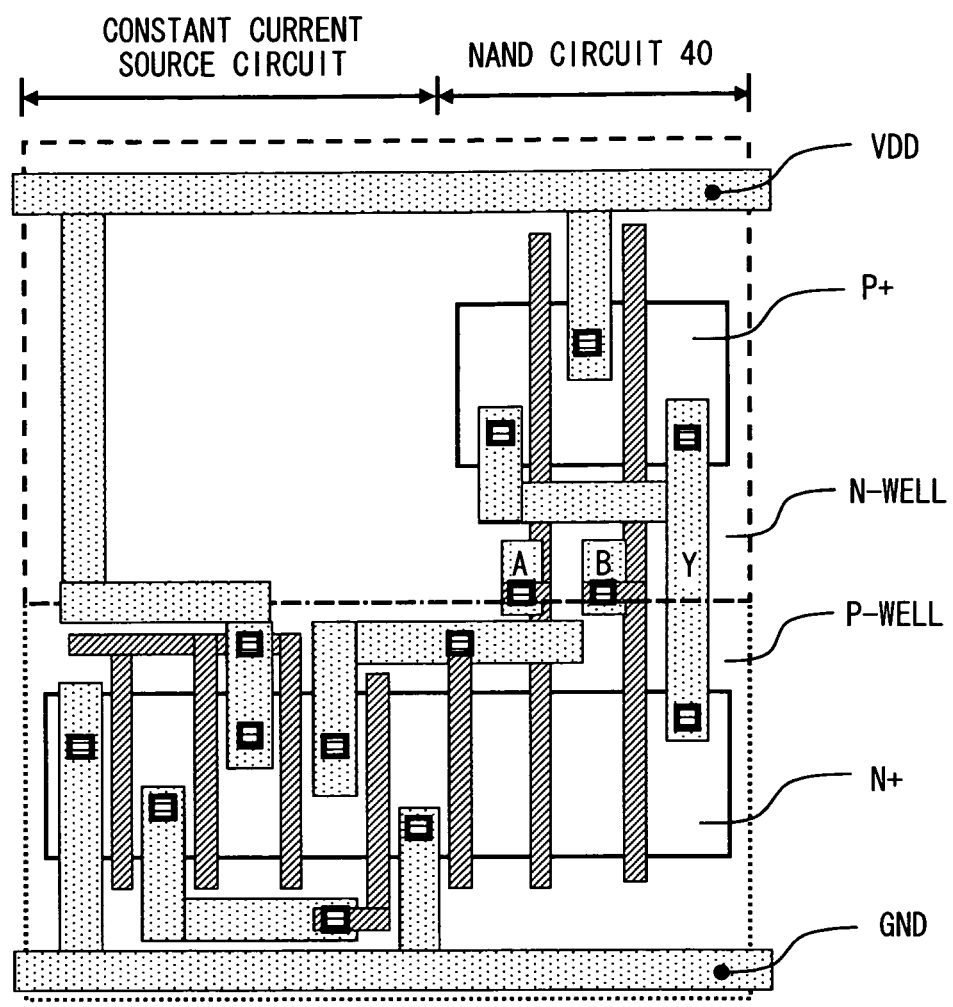
FIG. 30 shows a layout pattern of a standard cell according to the present invention.

FIG. 30 shows a layout pattern of a standard cell including a combination of the control voltage generating circuit 20, the transistor MN1, and the NAND circuit 40 (see FIG. 15B). As shown in FIG. 30, a single standard cell is formed by combining the control voltage generating circuit 20, the transistor MN1, and the NAND circuit 40, thereby enabling a reduction in the circuit area as compared with the case where standard cells are separately formed.

Figure 31:
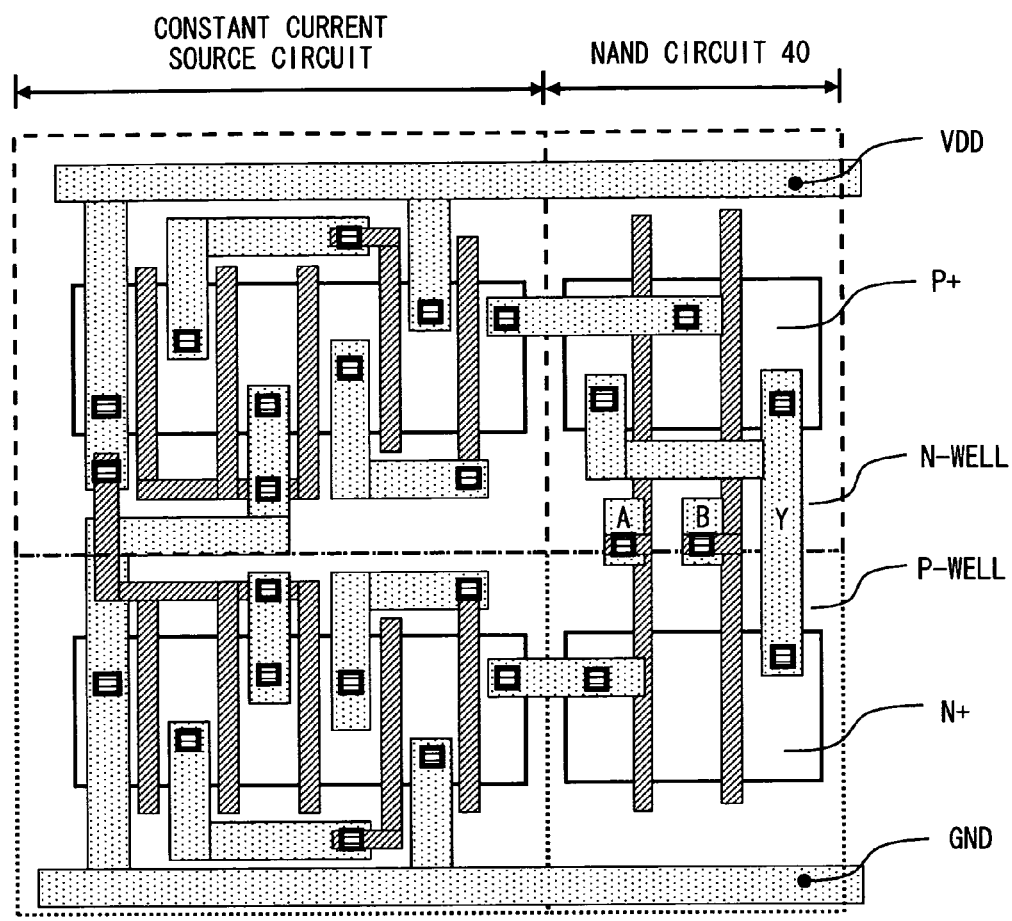
FIG. 31 shows a layout pattern of a standard cell according to the present invention.

FIG. 31 shows a layout pattern of a standard cell including a combination of the control voltage generating circuits 10 and 20, the transistors MP1 and MN1, and the NAND circuit 40 (see FIG. 16A). As shown in FIG. 31, a single standard cell is formed by combining the control voltage generating circuits 10 and 20, the transistors MP1 and MN1, and the NAND circuit 40, thereby enabling a reduction in the circuit area as compared with the case where standard cells are separately formed.

Figure 32:
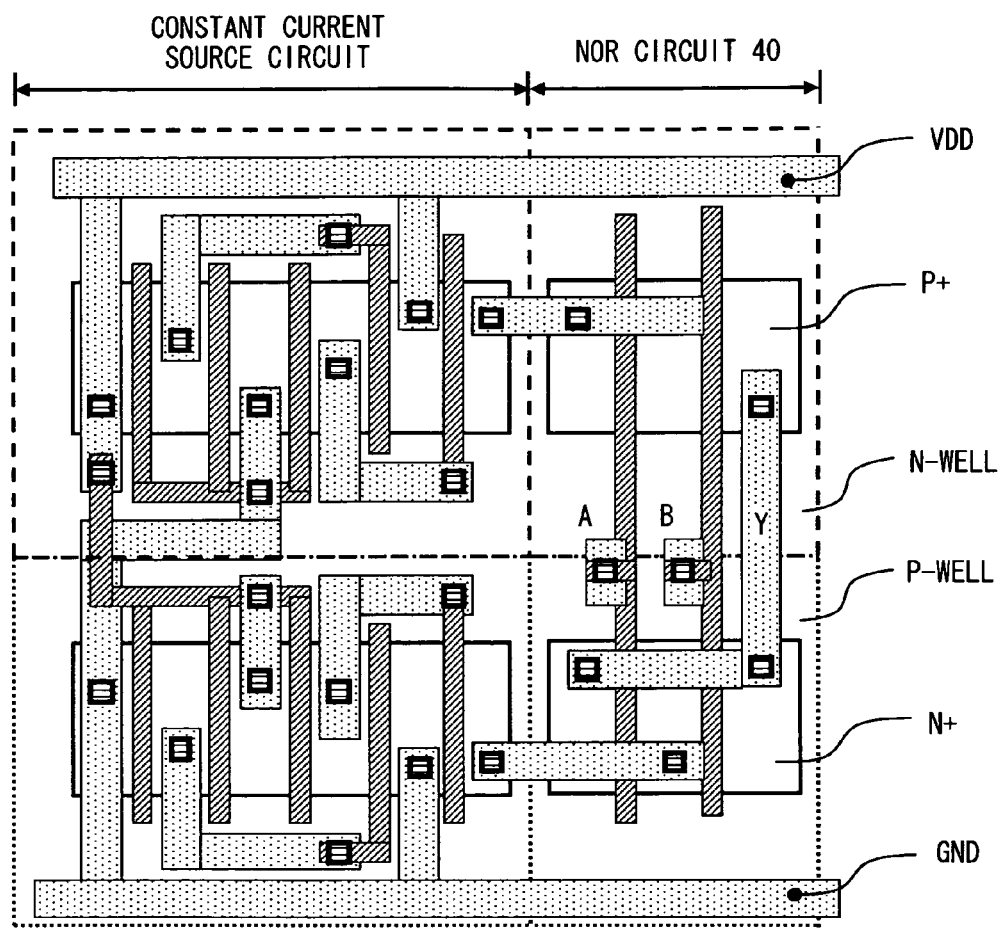
FIG. 32 shows a layout pattern of a standard cell according to the present invention.

FIG. 32 shows a layout pattern of a standard cell including a combination of the control voltage generating circuits 10 and 20, the transistors MP1 and MN1, and the NOR circuit 40 (see FIG. 16A). As shown in FIG. 31, a single standard cell is formed by combining the control voltage generating circuits 10 and 20, the transistors MP1 and MN1, and the NOR circuit 40, thereby enabling a reduction in the circuit area as compared with the case where standard cells are separately formed.

As described above, the control voltage generating circuits 10 and 20 and the transistors for constant current (for example, MP1, MN1) may be separately formed into individual cells. The control voltage generating circuit 10 and the control voltage generating circuit 20 may be formed into a cell. The control voltage generating circuits and the transistors for the constant current source circuit (for example, MP1, MN1) may be formed into a cell. Furthermore, the control voltage generating circuits and the transistors for the constant current source circuit may be combined with a logic circuit, such as a NAND or a NOR, to be formed into a cell. Thus, the control voltage generating circuits 10 and 20 and the transistors for the constant current source circuit of the present invention may be separately formed into individual cells, and may be combined with a logic circuit to be formed into a cell, thereby enabling circuit design using a typical standard cell method. This facilitates provision of a semiconductor device composed of individual cells of the control voltage generating circuits 10 and 20 and the transistors for the constant current source circuit, or of the cells of combinations of the control voltage generating circuits and the transistors for the constant current source circuit with a logic circuit.

Supplementary Note 1

A semiconductor integrated circuit comprising:

a first reference voltage unit which includes a plurality of first reference transistors connected in series between a first power supply terminal and a second power supply terminal and having the same conductivity type, and which generates a drain voltage of one of the first reference transistors as a first reference voltage;

a first voltage conversion unit which includes a plurality of first conversion transistors connected in series between the first power supply terminal and the second power supply terminal and having the same conductivity type as that of the reference voltage unit, and which generates a drain voltage of the first conversion transistor as a first control voltage, a drain current of one of the first conversion transistors being controlled based on the first reference voltage; and a delay generating unit which includes a first constant current transistor and adds a delay according to a drain current of the first constant transistor to an external input signal, the drain current of the first constant current transistor being controlled based on the first control voltage.

Supplementary Note 2

The semiconductor integrated circuit according to Supplementary note 1, wherein a gate of one transistor among the plurality of first reference transistors is supplied with the external input signal, and a gate of another transistor among the plurality of first reference transistors is supplied with an intermediate signal of the delay generating unit, a gate of one transistor among the plurality of first conversion transistors is supplied with the external input signal, and a gate of another transistor among the plurality of first conversion transistors is supplied with the intermediate signal of the delay generating unit, and the intermediate signal is an inverted signal of the external input signal, and changes after a predetermined delay time has passed since a change of the external input signal.

Supplementary Note 3

The semiconductor integrated circuit according to Supplementary note 1, wherein a gate of one transistor among the plurality of first reference transistors is supplied with the external input signal, and a gate of another transistor among the plurality of first reference transistors is supplied with an intermediate signal of the delay generating unit, a gate of a transistor among the plurality of first conversion transistors is supplied with the external input signal, and the intermediate signal is an inverted signal of the external input signal, and changes after a predetermined delay time has passed since a change of the external input signal.

Supplementary Note 4

The semiconductor integrated circuit according to any one of Supplementary notes 1 to 3, wherein a predetermined transistor among the plurality of first reference transistors operates in a linear region.

Supplementary Note 5

The semiconductor integrated circuit according to Supplementary note 1, further comprising:

a second reference voltage unit which includes a plurality of second reference transistors each having a conductivity type different from that of the first reference voltage unit, and which generates a drain voltage of one of the second reference transistors as a second reference voltage; and a second voltage conversion unit which includes a plurality of second conversion transistors each having a conductivity type different from that of the first voltage conversion unit, and which generates a drain voltage of one of the second conversion transistors as a second control voltage, wherein the delay generating unit further includes a second constant current transistor, and adds a delay according to a drain current of each of the first and second constant current transistors to the external input signal, the drain current of the second constant current transistor being controlled based on the second control voltage.

Supplementary Note 6

The semiconductor integrated circuit according to Supplementary note 5, wherein a gate of one transistor among the plurality of first reference transistors is supplied with the external input signal, and a gate of another transistor among the plurality of first reference transistors is supplied with an intermediate signal of the delay generating unit, a gate of one transistor among the plurality of first conversion transistors is supplied with the external input signal, and a gate of another transistor among the plurality of first conversion transistors is supplied with the intermediate signal of the delay generating unit, a gate of one transistor among the plurality of second reference transistors is supplied with the external input signal, and a gate of another transistor among the plurality of second reference transistors is supplied with the intermediate signal of the delay generating unit, a gate of one transistor among the plurality of second conversion transistors is supplied with the external input signal, and a gate of another transistor among the plurality of second conversion transistors is supplied with the intermediate signal of the delay generating unit, and the intermediate signal is an inverted signal of the external input signal, and changes after a predetermined delay time has passed since a change of the external input signal.

Supplementary Note 7

The semiconductor integrated circuit according to Supplementary note 5, wherein a gate of one transistor among the plurality of first reference transistors is supplied with the external input signal, and a gate of another transistor among the plurality of first reference transistors is supplied with an intermediate signal of the delay generating unit, a gate of a transistor among the plurality of first conversion transistors is supplied with the external input signal, a gate of one transistor among the plurality of second reference transistors is supplied with the external input signal, and a gate of another transistor among the plurality of second reference transistors is supplied with the intermediate signal of the delay generating unit, a gate of a transistor among the plurality of second conversion transistors is supplied with the external input signal, and the intermediate signal is an inverted signal of the external input signal, and changes after a predetermined delay time has passed since a change of the external input signal.

Supplementary Note 8

The semiconductor integrated circuit according to any one of Supplementary notes 5 to 7, wherein a predetermined transistor among the plurality of first reference transistors operates in a linear region, and a predetermined transistor among the plurality of second reference transistors operates in a linear region.

Supplementary Note 9

The semiconductor integrated circuit according to any one of Supplementary notes 1 to 8, wherein a back gate of a P-channel MOS transistor among the plurality of transistors is connected to the first power supply terminal, and a back gate of an N-channel MOS transistor among the plurality of transistors is connected to the second power supply terminal.

Supplementary Note 10

The semiconductor integrated circuit according to any one of Supplementary notes 1 to 8, wherein back gates of the plurality of transistors are connected to their own sources.

Supplementary Note 11

The semiconductor device according to any one of Supplementary notes 1 to 8, wherein back gates of the plurality of transistors are connected to a power supply terminal dedicated to back gates, the power supply terminal being different from the first and second power supply terminals.

The first to fifth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A delay circuit comprising:
a control voltage generating circuit; and
a delay generating unit,
wherein the delay generating unit comprises:
at least one third transistor controlled by the control voltage; and
an inverter circuit connected to at least one of the first power supply and the second power supply via the third transistor, and
wherein the control voltage generating circuit comprises:
a reference voltage generating unit that includes a plurality of first transistors of a same conductivity type connected in series between a first power supply and a second power supply, and generates a drain voltage of one of the plurality of first transistors as a reference voltage; and
a voltage conversion unit that includes a plurality of second transistors connected in series between the first power supply and the second power supply and having the same conductivity type as that of the reference voltage generating unit, supplies the reference voltage to a gate of one of the plurality of second transistors, and outputs a drain voltage of one of the plurality of second transistors as a control voltage.

2. The delay circuit according to claim 1, wherein
when the first transistors and the second transistors are P-channel MOS transistors, back gates of the first transistors and the second transistors are each connected to the first power supply, and
when the first transistors and the second transistors are N-channel MOS transistors, back gates of the first transistors and the second transistors are each connected to the second power supply.

3. The delay circuit according to claim 1, wherein back gates of the first transistors and the second transistors are connected to their own sources.

4. A control voltage generating circuit comprising:
a reference voltage generating unit that includes a plurality of first transistors of a same conductivity type connected in series between a first power supply and a second power supply, and generates a drain voltage of one of the plurality of first transistors as a reference voltage; and
a voltage conversion unit that includes a plurality of second transistors connected in series between the first power supply and the second power supply and having the same conductivity type as that of the reference voltage generating unit, supplies the reference voltage to a gate of one of the plurality of second transistors, and outputs a drain voltage of one of the plurality of second transistors as a control voltage,
wherein back gates of the first transistors and the second transistors are each connected to a third power supply, the third power supply being different from the first and second power supplies.

5. The delay circuit according to claim 1, wherein gates of at least two of the plurality of first transistors are connected to one of the first power supply and the second power supply.

6. The delay circuit according to claim 1, wherein a first gate of one of the plurality of first transistors is supplied with a first signal, and a second gate of another of the plurality of first transistors is supplied with a second signal.

7. A constant current source circuit comprising:
a delay circuit according to claim 1; and
at least one third transistor controlled by the control voltage.

8. The constant current source circuit according to claim 7, wherein the third transistor has the same conductivity type as that of the first transistors and the second transistors.

9. A logic circuit comprising a constant current source circuit according to claim 7, the logic circuit being driven by a constant current output from the third transistor.

10. A logic circuit comprising a constant current source circuit according to claim 7, the logic circuit being connected to at least one of the first power supply and the second power supply via the third transistor.

11. A semiconductor device comprising:
a control voltage generating circuit; and
at least one standard cell,
wherein the control voltage generating circuit comprises:

a reference voltage generating unit that includes a plurality of first transistors of a same conductivity type connected in series between a first power supply and a second power supply, and generates a drain voltage of one of the plurality of first transistors as a reference voltage; and a voltage conversion unit that includes a plurality of second transistors connected in series between the first power supply and the second power supply and having the same conductivity type as that of the reference voltage generating unit, supplies the reference voltage to a gate of one of the plurality of second transistors, and outputs a drain voltage of one of the plurality of second transistors as a control voltage, and wherein the control voltage generating circuit has a cell height substantially equal to a cell height of the standard cell.

12. The semiconductor device according to claim 11, wherein when the control voltage generating circuit is disposed to be adjacent to the standard cell in a width direction, a power supply line for the standard cell and a power supply line for the control voltage generating circuit are in contact with each other.

13. The semiconductor device according to claim 12, wherein a boundary between an N-well and a P-well of the control voltage generating circuit is located at substantially a same distance as a boundary between an N-well and a P-well of the standard cell in a height direction.

14. The semiconductor device according to claim 11, wherein the control voltage generating circuit supplies the control voltage to the standard cell.

15. A semiconductor device comprising:
the delay circuit according to claim 1; and
at least one standard cell,
wherein the delay circuit has a cell height substantially equal to a cell height of the standard cell.

16. A semiconductor device comprising:
the logic circuit according to claim 9; and
at least one standard cell,
wherein the logic circuit has a cell height substantially equal to a cell height of the standard cell.

17. The delay circuit according to claim 1, wherein
gates of two transistors among the plurality of first transistors are supplied with the external input signal and an intermediate signal of the delay generating unit, respectively,
gates of two transistors among the plurality of second transistors are supplied with the external input signal and the intermediate signal of the delay generating unit, respectively, and
the intermediate signal is an inverted signal of the external input signal, and changes after a predetermined delay time has passed since a change of the external input signal.

18. The delay circuit according to claim 1, wherein
gates of two transistors among the plurality of first transistors are supplied with the external input signal and an intermediate signal of the delay generating unit, respectively,
a gate of a transistor among the plurality of second transistors is supplied with the external input signal, and
the intermediate signal is an inverted signal of the external input signal, and changes after a predetermined delay time has passed since a change of the external input signal.

19. The delay circuit according to claim 1, wherein one of a back gate of a transistor of the plurality of first transistors and a back gate of a transistor of the plurality of second transistors is connected to a third power supply.

* * * * *